US012588474B2

(12) United States Patent
Niida et al.

(10) Patent No.: US 12,588,474 B2
(45) Date of Patent: Mar. 24, 2026

(54) COMPOSITION FOR FORMING PROTECTIVE FILM AGAINST ALKALINE AQUEOUS HYDROGEN PEROXIDE, SUBSTRATE FOR PRODUCING SEMICONDUCTOR APPARATUS, METHOD FOR FORMING PROTECTIVE FILM, AND METHOD FOR FORMING PATTERN

(71) Applicant: SHIN-ETSU CHEMICAL CO., LTD., Tokyo (JP)

(72) Inventors: Keisuke Niida, Joetsu (JP); Takashi Sawamura, Joetsu (JP); Daisuke Kori, Joetsu (JP); Seiichiro Tachibana, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 339 days.

(21) Appl. No.: 18/156,089

(22) Filed: Jan. 18, 2023

(65) Prior Publication Data

US 2023/0260787 A1 Aug. 17, 2023

(51) Int. Cl.
*C09D 7/20* (2018.01)
*C09D 201/04* (2006.01)
(Continued)

(52) U.S. Cl.
CPC ............ *H01L 21/0276* (2013.01); *C09D 7/20* (2018.01); *C09D 201/04* (2013.01); (Continued)

(58) Field of Classification Search
CPC ............. H01L 21/0276; H01L 21/0275; H01L 21/0332; H01L 21/0337; H01L 21/3081; H01L 21/3086; H01L 21/31122; H01L 21/31138; H01L 21/31144; H01L 21/02118; H01L 21/02205; (Continued)

(56) References Cited

U.S. PATENT DOCUMENTS

2002/0106909 A1 8/2002 Kato et al.
2005/0255712 A1 11/2005 Kato et al.
(Continued)

FOREIGN PATENT DOCUMENTS

CN 111830785 A 10/2020
CN 111995751 A 11/2020
(Continued)

OTHER PUBLICATIONS

Mar. 1, 2024 Office Action issued in Chinese Patent Application No. 202310058295.7.

Oct. 11, 2024 Office Action issued in Korean Patent Application No. 10-2023-0007224.

Jun. 16, 2023 extended Search Report issued in European Patent Application No. 23152242.6.

Sep. 11, 2024 Office Action issued in Chinese Patent Application No. 202310058295.7.

*Primary Examiner* — Kumar R Bhushan
(74) *Attorney, Agent, or Firm* — OLIFF PLC

(57) ABSTRACT

A composition for forming a protective film using a polymer having an imide group: cured under a film-forming condition in air and an inert gas; forming a protective film having excellent heat resistance, embedding and planarization ability for a pattern formed on a substrate, and good adhesiveness to the substrate; and forming a protective film having excellent resistance against an alkaline aqueous hydrogen peroxide. A composition for forming a protective film against alkaline aqueous hydrogen peroxide, including: (A) a polymer having a repeating unit represented by general formula (1A) having at least one or more fluorine atoms and at least one or more hydroxy groups, a terminal group is any one of the following general formulae (1B) and (1C); and organic solvent, wherein $R_1$ represents any one group represented by the following formula (1D), and two or more kinds of $R_1$ are optionally used in combination.

(1A)

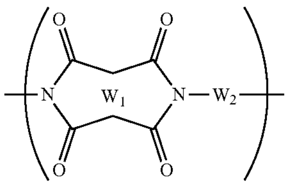

(1B)

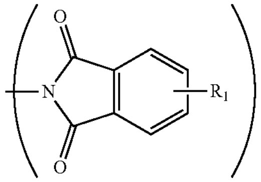

(1C)

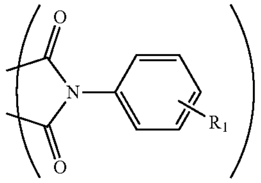

(1D)

$R_1$ =

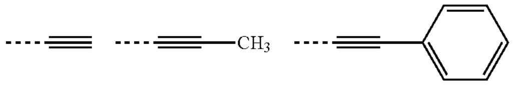

27 Claims, 2 Drawing Sheets

(51) Int. Cl.

| | |
|---|---|
| ***C09D 201/06*** | (2006.01) |
| ***H01L 21/027*** | (2006.01) |
| ***H01L 21/033*** | (2006.01) |
| ***H01L 21/308*** | (2006.01) |
| ***H01L 21/311*** | (2006.01) |

(52) U.S. Cl.
CPC ........ *C09D 201/06* (2013.01); *H01L 21/0275* (2013.01); *H01L 21/0332* (2013.01); *H01L 21/0337* (2013.01); *H01L 21/3081* (2013.01); *H01L 21/3086* (2013.01); *H01L 21/31122* (2013.01); *H01L 21/31138* (2013.01); *H01L 21/31144* (2013.01)

(58) Field of Classification Search
CPC ......... H01L 21/02282; H01L 21/30604; H01L 21/56; H01L 23/293; H01L 21/02337; C09D 7/20; C09D 201/04; C09D 201/06; C09D 179/08; G03F 7/11; G03F 7/094; G03F 7/004; G03F 7/038; G03F 7/039; C08G 73/1007; C08G 73/1039; C08G 73/1042; C08G 73/1046; C08G 73/105; C08G 73/1053; C08G 73/1067; C08G 73/1071; C08L 2201/08; C08L 2205/025; C08L 2205/03
See application file for complete search history.

(56) References Cited

U.S. PATENT DOCUMENTS

| | | | |
|---|---|---|---|
| 2009/0274978 | A1 | 11/2009 | Ohashi et al. |
| 2013/0302990 | A1 | 11/2013 | Watanabe et al. |
| 2018/0284614 | A1 | 10/2018 | Satoh et al. |
| 2019/0163064 | A1 | 5/2019 | Ohashi et al. |
| 2020/0041903 | A1 | 2/2020 | Takemura et al. |
| 2020/0326624 | A1 | 10/2020 | Urano et al. |
| 2020/0332062 | A1 | 10/2020 | Kori et al. |
| 2020/0348595 | A1 | 11/2020 | Nakafuji et al. |
| 2020/0381247 | A1* | 12/2020 | Kori .................... H01L 21/0271 |
| 2021/0181637 | A1 | 6/2021 | Kori et al. |
| 2021/0269597 | A1 | 9/2021 | Kori et al. |
| 2021/0311395 | A1 | 10/2021 | Kori et al. |

FOREIGN PATENT DOCUMENTS

| | | | |
|---|---|---|---|
| CN | 113281964 | A | 8/2021 |
| CN | 113433796 | A | 9/2021 |
| JP | 2002-334869 | A | 11/2002 |
| JP | 2007-199653 | A | 8/2007 |
| JP | 2009-269953 | A | 11/2009 |
| JP | 2010-122297 | A | 6/2010 |
| JP | 2013-137334 | A | 7/2013 |
| JP | 2013-253227 | A | 12/2013 |
| JP | 2020-177225 | A | 10/2020 |
| JP | 2020-193325 | A | 12/2020 |
| JP | 2021-091841 | A | 6/2021 |
| JP | 2021-130763 | A | 9/2021 |
| JP | 2021-152639 | A | 9/2021 |
| KR | 10-2018-0111587 | A | 10/2018 |
| KR | 10-2020-0136836 | A | 12/2020 |
| WO | 2004/066377 | A1 | 8/2004 |
| WO | 2017/191767 | A1 | 11/2017 |
| WO | 2018/212116 | A1 | 11/2018 |
| WO | 2019/146378 | A1 | 8/2019 |

* cited by examiner

[FIG. 1]
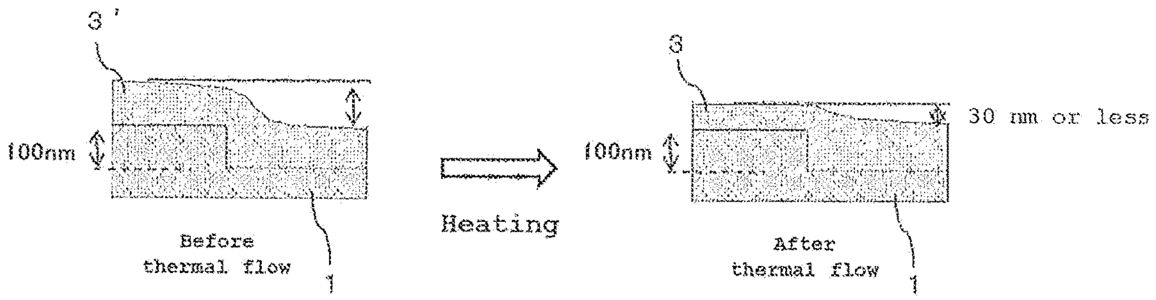
[FIG. 2]
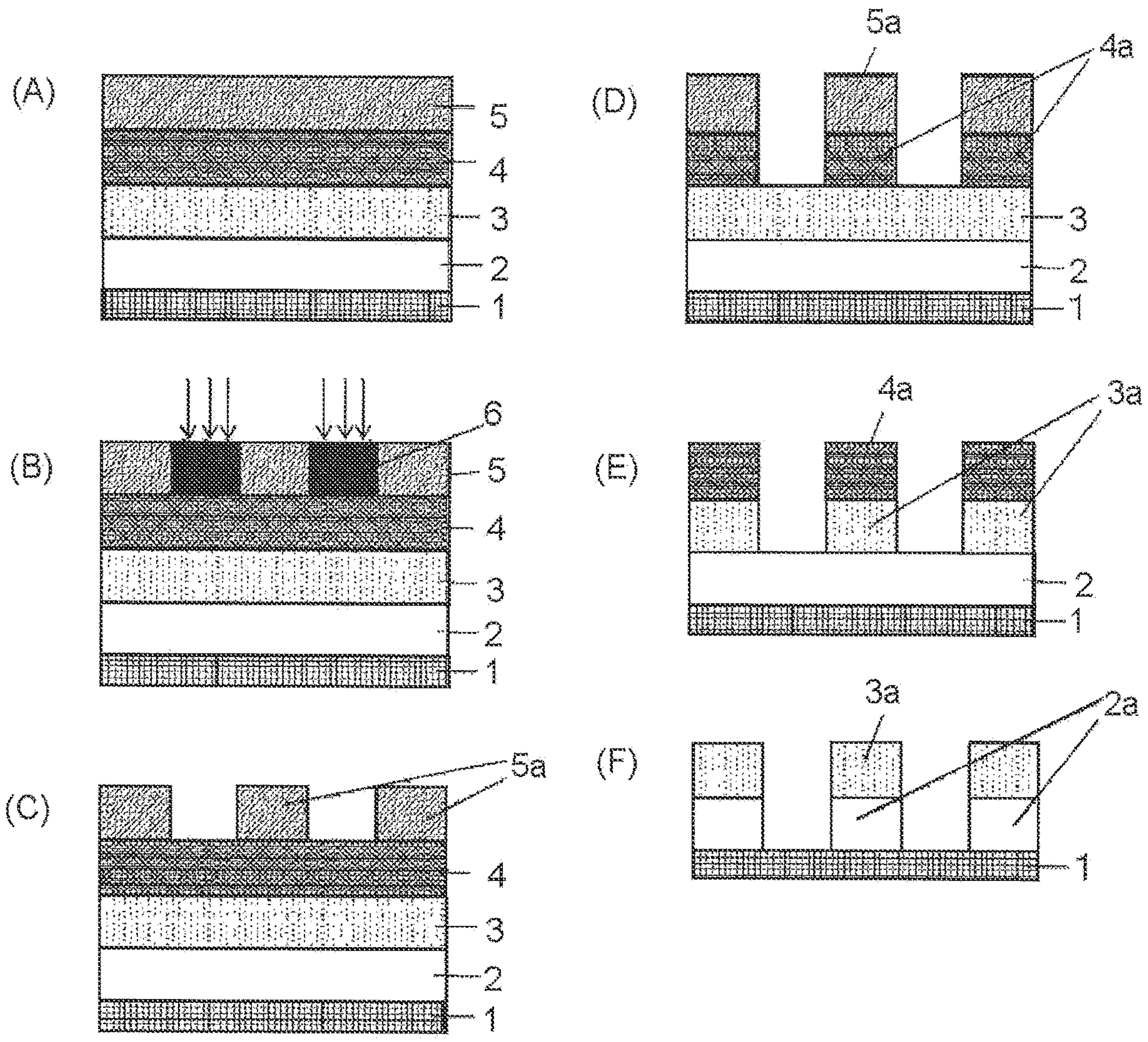

[FIG. 3]
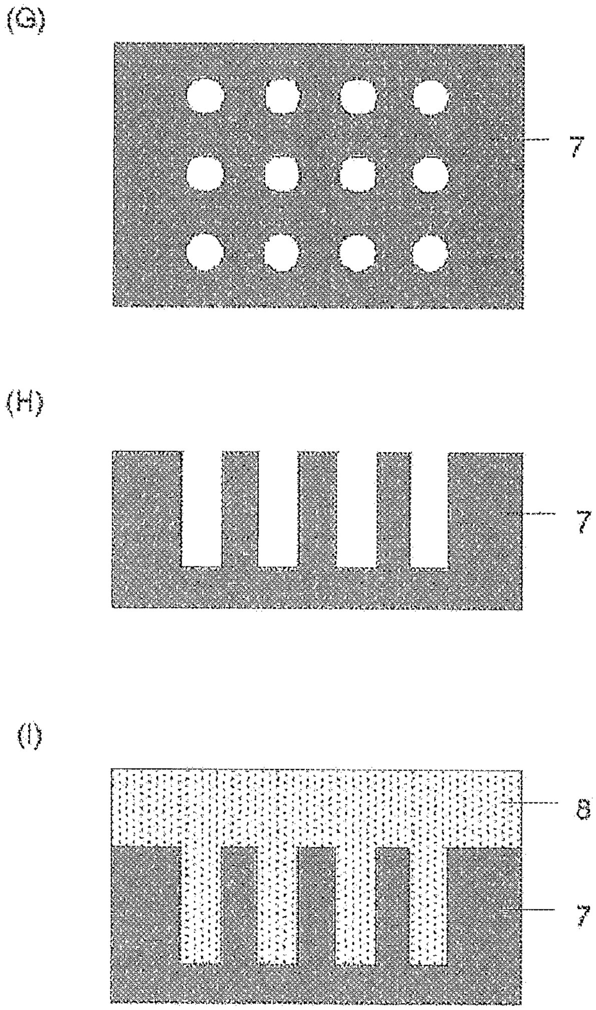
[FIG. 4]
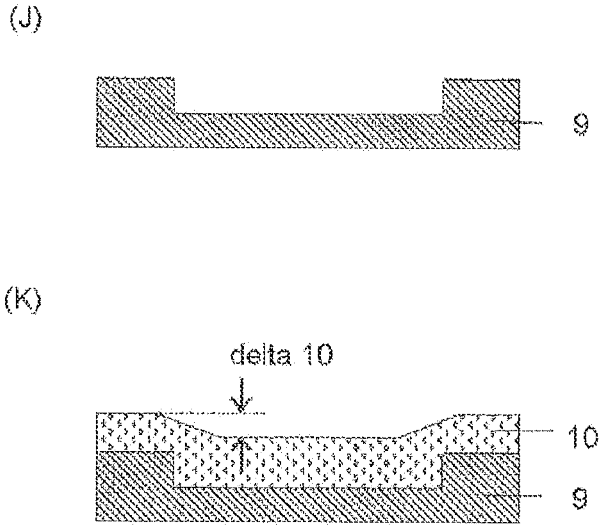

COMPOSITION FOR FORMING PROTECTIVE FILM AGAINST ALKALINE AQUEOUS HYDROGEN PEROXIDE, SUBSTRATE FOR PRODUCING SEMICONDUCTOR APPARATUS, METHOD FOR FORMING PROTECTIVE FILM, AND METHOD FOR FORMING PATTERN

TECHNICAL FIELD

The present invention relates to: a composition for forming a protective film providing a protective film exhibiting resistance against a wet-etching liquid used in a semiconductor apparatus manufacturing process; a substrate for producing a semiconductor apparatus using the composition; a method for forming a protective film; and a method for forming a pattern with a multilayer resist method.

BACKGROUND ART

Conventional increase in integration and increase in speed of semiconductor apparatuses have been achieved by shrinking a pattern size with shortened wavelength of a light source in lithographic technology using light exposure (photolithography) as a common technology. To form such a fine circuit pattern on a semiconductor apparatus substrate (substrate to be processed), commonly used is a method of processing the substrate to be processed with dry etching using a pattern-formed photoresist film as an etching mask. However, no dry etching method can have practically perfect etching selectivity between the photoresist film and the substrate to be processed. Thus, a substrate processing by a multilayer resist method have become common in recent years. This method includes: interposing an intermediate layer having etching selectivity different from the photoresist film (hereinafter, resist upper layer film) between the resist upper layer film and the substrate to be processed; obtaining a pattern in the resist upper layer film; then transferring the pattern to the intermediate layer by dry etching with the resist upper layer film pattern as a dry etching mask; and further transferring the pattern to the substrate to be processed by dry etching with the intermediate layer as a dry etching mask.

One of the multilayer resist methods is a three-layer resist method, which can use a resist composition commonly used in a single-layer resist method. This method includes: applying and calcining an organic underlayer film material composed of an organic resin-containing composition on a substrate to be processed to form an organic underlayer film (hereinafter, referred to as the organic film); applying and calcining a resist intermediate film material composed of a silicon-containing resin-containing composition thereon to form a silicon-containing film (hereinafter, referred to as the silicon intermediate layer); and forming a common organic photoresist film (hereinafter, referred to as the resist upper layer film) thereon. After a pattern is formed in this resist upper layer film, dry etching with a fluorine-based gas plasma can achieve a good etching selectivity rate of the organic resist upper layer film against the silicon intermediate film. Thus, the pattern in the resist upper layer film can be transferred to the silicon intermediate film. According to this method, the pattern can be easily transferred to the silicon intermediate film even by using a resist upper layer film having no sufficient thickness for directly processing the substrate to be processed or by using a resist upper layer film having no sufficient dry etching resistance for processing the substrate to be processed since the silicon intermediate film typically has a thickness equal to or less than that of the resist upper layer film. Subsequently, the pattern-transferred silicon intermediate film used as a dry etching mask to transfer the pattern to the organic underlayer film by dry etching with oxygen-based or hydrogen-based gas plasma can transfer the pattern to the organic underlayer film having sufficient dry etching resistance for processing the substrate. This transferred pattern in the organic underlayer film can be transferred to the substrate by dry etching using a fluorine-based gas or a chlorine-based gas.

Meanwhile, the shrinking in the semiconductor apparatus manufacturing process has been reaching a fundamental limit derived from a wavelength of a light source for the photolithography. Thus, investigated in recent years is high integration of the semiconductor apparatuses, which does not depend on the shrinking. As one of such methods, a semiconductor apparatus having a complex structure such as a multi gate structure is investigated, and a part thereof has already been practically used. When such a structure is formed by the multilayer resist method, an organic film material that can achieve planarization can be applied by: embedding fine patterns, such as holes, trenches, and fins, formed on the substrate to be processed with the film without gap; or embedding a step- or pattern-dense part and a region without patterns. Forming the planarized surface of the organic underlayer film on the stepped substrate by using such an organic film material can reduce change in thickness of the silicon intermediate film and the resist upper layer film, formed thereon, and can reduce decrease in focus latitude of the photolithography and decrease in margin in the step of processing the substrate to be processed thereafter. This enables to produce semiconductor apparatuses with a good yield. Meanwhile, in the single layer resist method, the upper layer resist film becomes thick in order to embed the substrate to be processed having steps and patterns. This thickness reduces pattern-forming latitude during the exposure, such as pattern collapse after exposure and development and deterioration of a pattern shape due to reflection from the substrate during the exposure. Thus, it is difficult to produce the semiconductor apparatus with a good yield.

The organic film requires not only the above-described embedding and planarizing abilities but also high dry etching resistance since a high aspect pattern is needed to be formed in the above-described organic film material by dry-etch processing. Furthermore, the silicon intermediate film on the organic film also requires high dry etching resistance. Thus, an inorganic hard mask formed by a CVD or ALD method, which has higher dry etching resistance than the silicon intermediate film formed by spin-coating, is often selected as the silicon intermediate film. Since this hard mask is formed at a temperature of typically 300° C. or higher, the organic film also requires highly heat resistance against such a high temperature. In addition, the organic film also requires adhesiveness to the substrate to be processed since the organic film is removed from the substrate during the inorganic hard mask formation by a CVD or ALD method in some cases. It is important that the organic film material has these performances for excellent process latitude.

As a method for increasing speed of next-generation semiconductor apparatuses, for example, application of a novel material using strained silicon or gallium-arsine and having high electron mobility, and a precision material such as ultrathin polysilicon regulated in angstrom scale are beginning to be investigated. However, in a substrate to be processed to which such a novel precision material is applied, under conditions of planarized film formation of the above organic underlayer material, for example a film-forming condition in the air at 300° C. or higher, the material may be corroded due to oxygen in the air to fail to exhibit a material-designed performance of increase in speed of the semiconductor apparatus, leading to failure to achieve a viable yield for industrial production. Hence, to prevent the decrease in the yield caused by the substrate corrosion due to the air under such a high temperature condition, an organic underlayer material that can be formed in an inert gas is promising. Furthermore, substrate processing by wet etching using a chemical reagent may be required. In this case, the organic underlayer film to be a processing mask requires resistance against the wet etching liquid.

Here, background of desire for a material usable in the wet etching process in the multilayer resist method will be described in detail. To improve performance of the semiconductor apparatus, the most advanced semiconductor apparatus uses technologies such as three-dimensional transistor and through wiring. In a patterning step used for forming structures in such a semiconductor apparatus, the patterning by the above multilayer resist method is performed. Such patterning may require, after the pattern formation, a step of removing the silicon intermediate film without damaging the pattern. If this removal is insufficient, that is, if the wafer is subjected to the next production process with remained washing target, the yield of the device production is certainly decreased. As described above, cleanness degree required in the washing step have been high as the devices have been shrunken. However, both a major constituting element in the conventional silicon intermediate film and a major constituting element in the conventional semiconductor apparatus substrate are often silicon. These constituent components are similar, and dry etching to selectively remove the silicon intermediate film is difficult to reduce damage to the semiconductor apparatus substrate. This problem cannot be solved by wet etching using a common hydrofluoric acid-based removing liquid. Hence, as a removing liquid that does not damage the semiconductor apparatus substrate, an alkaline aqueous hydrogen peroxide called as SC1 (Standard Clean-1), which is commonly used in the semiconductor manufacturing process, is considered to be applied as the wet etching liquid. In this case, the organic underlayer film conversely requires resistance against the alkaline aqueous hydrogen peroxide.

In addition, an investigated process is wet-etching a substrate to be processed such as titanium nitride with the organic underlayer film as an etching mask and using the alkaline aqueous hydrogen peroxide. Also, in this case, the organic underlayer film requires resistance against the alkaline aqueous hydrogen peroxide.

As described above, required is an organic underlayer film material for manufacturing a semiconductor apparatus and a method for forming a pattern using this material, the material having: heat resistance against 300° C. or higher even in an inert gas containing no oxygen; high embedding and planarization ability; adhesiveness to a substrate; and high compatibility with the wet etching process (that is, the resistance against the alkaline aqueous hydrogen peroxide).

Patent Document 1, etc. propose a protective film having good resistance against the alkaline aqueous hydrogen peroxide. Although having the resistance against the alkaline aqueous hydrogen peroxide, such materials have a problem of insufficient planarization ability on a stepped substrate and insufficient heat resistance during hard mask formation on the protective film by a CVD or ALD method.

Known examples having an imide structure, described in the present invention, are compounds having an imide structure described in Patent Documents 2 to 6, resins having a polyimide structure described in Patent Documents 7 to 9, and use of a compound having a bismaleimide structure described in Patent Document 10. Resistance of these material against the alkaline aqueous hydrogen peroxide is not described, and the resistance of a resin having a polyimide structure against the alkaline aqueous hydrogen peroxide is unknown.

CITATION LIST

Patent Literature

Patent Document 1: WO 2017-191767
Patent Document 2: WO 2019-146378
Patent Document 3: JP 2020-177225 A
Patent Document 4: JP 2021-091841 A
Patent Document 5: JP 2021-130763 A
Patent Document 6: JP 2021-152639 A
Patent Document 7: JP 2013-137334 A
Patent Document 8: JP 2010-122297 A
Patent Document 9: JP 2020-193325 A
Patent Document 10: WO 2018-212116

SUMMARY OF INVENTION

Technical Problem

The present invention has been made in view of the above-described circumstances. An object of the present invention is to provide a composition for forming a protective film: that is cured under a film-forming condition not only in the air but also in an inert gas; that has excellent heat resistance, embedding and planarization ability of a pattern formed on a substrate; that can form a protective film having good adhesiveness to the substrate; and that uses an imide group-containing polymer that can form a protective film having excellent resistance against the alkaline aqueous hydrogen peroxide. In addition, an object of the present invention is to provide a substrate for producing a semiconductor apparatus, a method for forming a protective film, and a method for forming a pattern using the above material.

Solution to Problem

To solve the above problem, the present invention provides a composition for forming a protective film against an alkaline aqueous hydrogen peroxide, the composition comprising:

(A) a polymer represented by the following any one of (I) and (II) and having a fluorine atom and a hydroxy group, or a mixture of a polymer having a fluorine atom and a polymer having a hydroxy group represented by the following (III);

(I) a polymer having a repeating unit represented by the following general formula (1A) and having at least one or more fluorine atoms and at least one or more hydroxy groups, a terminal group thereof being a group represented by any one of the following general formulae (1B) and (1C), (II) a polymer having a repeating unit represented by the following general formula (2A) and having at least one or more fluorine atoms and a repeating unit represented by the following general formula (3A) and having at least one or more hydroxy groups, a terminal group thereof being a group represented by any one of the following general formulae (1B) and (1C), and (III) a mixture of: a polymer having a repeating unit represented by the following general formula (2A) and having at least one or more fluorine atoms, a terminal group thereof being a group represented by any one of the following general formulae (1B) and (1C); and a polymer having a repeating unit represented by the following general formula (3A) and having at least one or more hydroxy groups, a terminal group thereof being a group represented by any one of the following general formulae (1B) and (1C); and (B) an organic solvent, (1A)

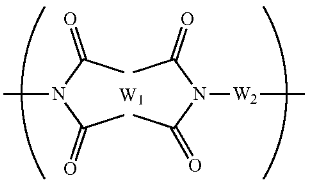

wherein $W_1$ represents one or more kinds of tetravalent organic groups optionally having a fluorine atom or a hydroxy group, $W_2$ represents one or more kinds of divalent organic groups optionally having a fluorine atom or a hydroxy group, at least one of $W_1$ and $W_2$ has one or more fluorine atoms, and at least one of $W_1$ and $W_2$ has one or more hydroxy groups, (2A)

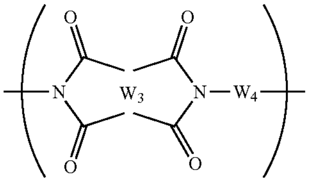

wherein $W_3$ represents one or more kinds of tetravalent organic groups optionally having a fluorine atom, $W_4$ represents one or more kinds of divalent organic groups optionally having a fluorine atom, and at least one of $W_3$ and $W_4$ has one or more fluorine atoms, (3A)

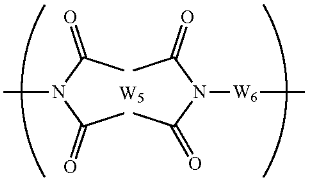

wherein $W_5$ represents one or more kinds of tetravalent organic groups optionally having a hydroxy group, $W_6$ represents one or more kinds of divalent organic groups optionally having a hydroxy group, and at least one of $W_5$ and $W_6$ has one or more hydroxy groups, and (1B)

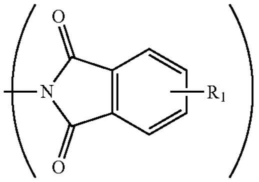

(1C)

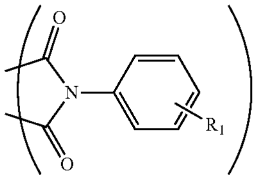

wherein $R_1$ represents any one group represented by the following formula (1D), and two or more kinds of $R_1$ are optionally used in combination.

(1D)

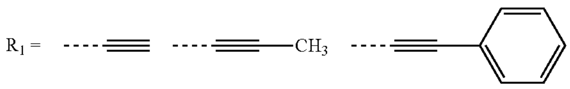

Such a composition for forming a protective film is cured with an action of the terminal crosslinkable group under a film-forming condition not only in the air but also in an inert gas. Such a composition is a composition for forming a protective film that can form a protective film having all of high heat resistance, good adhesiveness to a substrate, and high embedding/planarization ability since the main chain is constituted with a polyimide skeleton. In addition, such a composition is a composition for forming a protective film that can form a protective film having excellent resistance against an alkaline aqueous hydrogen peroxide since a fluorine atom and a hydroxy group are present in the polymer having the imide group. Setting one or more kinds of $W_1$ and $W_2$, $W_3$ and $W_4$, or $W_5$ and $W_6$ to the above combination of the organic groups can further improve the thermal flowability, the heat resistance, and the adhesiveness.

$W_2$ in the general formula (1A) preferably has at least one or more fluorine atoms and at least one or more hydroxy groups.

The main chain having such a partial structure is preferable from the viewpoint of achievement of both the adhesiveness and the excellent resistance against an alkaline aqueous hydrogen peroxide.

$W_2$ in the general formula (1A) is preferably a group represented by the following general formula (1E).

(1E)

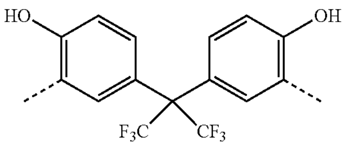

The main chain having such a partial structure is preferable from the viewpoints of the heat resistance, the planarization ability, the adhesiveness, and the resistance against an alkaline aqueous hydrogen peroxide.

$W_1$ in the general formula (1A) is preferably any group represented by the following general formula (1F).

(1F)

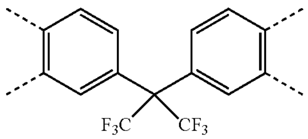

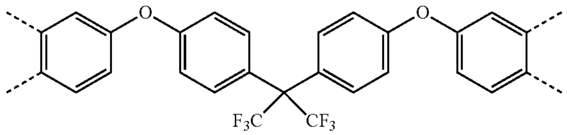

The main chain having such a partial structure is preferable from the viewpoints of the heat resistance, the planarization ability, and the resistance against an alkaline aqueous hydrogen peroxide.

The inventive composition preferably further comprises a polymer (IV), as a component (A'), having a repeating unit represented by the following general formula (4A), and a terminal group thereof being a group represented by the following general formula (2C), (4A)

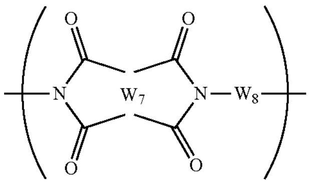

wherein $W_7$ represents a tetravalent organic group, and $W_8$ represents a divalent organic group, and (2C)

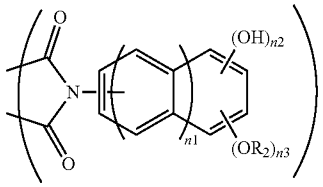

wherein $R_2$ represents a monovalent organic group having 1 to 10 carbon atoms, n1 represents an integer of 0 or 1, and n2 and n3 represent $1 \leq n2 \leq 6$ and $0 \leq n3 \leq 6$ and satisfy a relationship of $1 \leq n2+n3 \leq 6$.

The polymer (IV) having a hydroxy group at the terminal group is preferable from the viewpoint of the resistance against an alkaline aqueous hydrogen peroxide.

The component (A) preferably has a weight-average molecular weight of 1000 to 10000.

The composition for forming a protective film containing (A) the polymer having such an Mw range does not impair the solubility in the organic solvent, and can inhibit outgas during the baking.

The component (B) is preferably a mixture of one or more kinds of organic solvents having a boiling point of lower than 180° C. and one or more kinds of organic solvents having a boiling point of 180° C. or higher.

With such a composition for forming a protective film, the addition of the high boiling-point solvent into (A) the polymer imparts thermal flowability of the film, and thereby the composition for forming a protective film also has high embedding/planarization ability.

The composition for forming a protective film preferably further comprises one or more of (C) an acid generator, (D) a surfactant, (E) a crosslinker, and (F) a plasticizer.

The composition for forming a protective film comprising such a component can be a composition for forming a protective film having further excellent applicability or embedding/planarization ability.

The composition for forming a protective film preferably provides a protective film exhibiting a resistance against an ammonia-containing aqueous hydrogen peroxide.

Preferably, with the composition for forming a protective film, when a silicon substrate on which the protective film is formed is immersed in a 1.0 mass % aqueous hydrogen peroxide containing 0.5 mass % of ammonia at 70° C. for 5 minutes, no removal of the protective film is observed.

Such a composition for forming a protective film has sufficient resistance against an alkaline aqueous hydrogen peroxide, and thereby the composition can expand selections of processible substrates to be processed, a silicon intermediate film removable by wet etching, etc.

The present invention also provides a substrate for producing a semiconductor apparatus, comprising: a substrate; and a protective film formed on the substrate, the protective film being a cured material of the above composition for forming a protective film.

The protective film being a cured material of the inventive composition for forming a protective film also has high embedding/planarization ability, and thereby the protective film has no micropore due to embedding failure nor roughness on the protective film surface due to insufficient planarization. The substrate for producing a semiconductor apparatus planarized with such a protective film widens the process latitude during the patterning, and enables to produce semiconductor apparatuses with a good yield.

The present invention provides a method for forming a protective film applied in a semiconductor apparatus manufacturing process, the method comprising: spin-applying the above composition for forming a protective film on a substrate to be processed; and obtaining a cured film by heat-treating the substrate to be processed on which the composition for forming a protective film is applied under an inert gas atmosphere at a temperature of 50° C. or higher and 600° C. or lower within a range of 10 seconds to 7200 seconds.

The present invention provides a method for forming a protective film applied in a semiconductor apparatus manufacturing process, the method comprising: spin-applying the above composition for forming a protective film on a substrate to be processed; forming an applied film by heat-treating the substrate to be processed on which the composition for forming a protective film is applied in air at a temperature of 50° C. or higher and 250° C. or lower within a range of 5 seconds to 600 seconds; and subsequently obtaining a cured film by heat-treating the applied film under an inert gas atmosphere at a temperature of 200° C. or higher and 600° C. or lower within a range of 10 seconds to 7200 seconds.

The protective film formed by the inventive method and applied in the semiconductor apparatus manufacturing process has high heat resistance and high embedding/planarization ability. Thus, using the protective film in the production process of semiconductor apparatuses improves an yield of the semiconductor apparatuses.

In this time, an oxygen concentration in the inert gas is preferably 1% or less.

The inventive composition for forming a protective film is sufficiently cured without sublimate generation even heated in such an inert gas atmosphere, and can form the protective film having excellent adhesiveness to a substrate.

As the substrate to be processed, a substrate to be processed having a structure or step with 30 nm or more in height is preferably used.

The inventive method for forming a protective film is particularly useful for forming a plane protective film on such a substrate to be processed.

The present invention provides a method for forming a pattern on a substrate to be processed, the method comprising:

(I-1) a step of forming a protective film on the substrate to be processed using the above composition for forming a protective film;

(I-2) a step of forming a silicon-containing resist intermediate film on the protective film using a silicon-containing resist intermediate film material;

(I-3) a step of forming a resist upper layer film on the silicon-containing resist intermediate film using a photoresist composition;

(I-4) a step of forming a circuit pattern in the resist upper layer film;

(I-5) a step of transferring the pattern to the silicon-containing resist intermediate film by etching with the resist upper layer film in which the pattern is formed as a mask;

(I-6) a step of transferring the pattern to the protective film by etching with the silicon-containing resist intermediate film in which the pattern is transferred as a mask; and (I-7) a step of forming a pattern on the substrate to be processed with the protective film in which the pattern is transferred as a mask.

The present invention provides a method for forming a pattern on a substrate to be processed, the method comprising:

(II-1) a step of forming a protective film on the substrate to be processed using the above composition for forming a protective film;

(II-2) a step of forming a silicon-containing resist intermediate film on the protective film using a silicon-containing resist intermediate film material;

(II-3) a step of forming an organic anti-reflection film on the silicon-containing resist intermediate film;

(II-4) a step of forming a resist upper layer film on the organic anti-reflection film using a photoresist composition to form a four-layer film structure and forming a circuit pattern in the resist upper layer film;

(II-5) a step of transferring the pattern to the organic anti-reflection film and the silicon-containing resist intermediate film by etching with the resist upper layer film in which the pattern is formed as a mask;

(II-6) a step of transferring the pattern to the protective film by etching with the silicon-containing resist intermediate film in which the pattern is transferred as a mask; and (II-7) a step of forming a pattern on the substrate to be processed with the protective film in which the pattern is transferred as a mask.

The present invention provides a method for forming a pattern on a substrate to be processed, the method comprising:

(III-1) a step of forming a protective film on the substrate to be processed using the above composition for forming a protective film;

(III-2) a step of forming an inorganic hard mask selected from a silicon oxide film, a silicon nitride film, a silicon oxynitride film, a titanium oxide film, and a titanium nitride film on the protective film;

(III-3) a step of forming a resist upper layer film on the inorganic hard mask using a photoresist composition;

(III-4) a step of forming a circuit pattern in the resist upper layer film;

(III-5) a step of transferring the pattern to the inorganic hard mask by etching with the resist upper layer film in which the pattern is formed as a mask;

(III-6) a step of transferring the pattern to the protective film by etching with the inorganic hard mask in which the pattern is transferred as a mask; and (III-7) a step of forming a pattern on the substrate to be processed with the protective film in which the pattern is transferred as a mask.

The present invention provides a method for forming a pattern on a substrate to be processed, the method comprising:

(IV-1) a step of forming a protective film on the substrate to be processed using the above composition for forming a protective film;

(IV-2) a step of forming an inorganic hard mask selected from a silicon oxide film, a silicon nitride film, a silicon oxynitride film, a titanium oxide film, and a titanium nitride film on the protective film;

(IV-3) a step of forming an organic anti-reflection film on the inorganic hard mask;

(IV-4) a step of forming a resist upper layer film on the organic anti-reflection film using a photoresist composition to form a four-layer film structure and forming a circuit pattern in the resist upper layer film;

(IV-5) a step of transferring the pattern to the organic anti-reflection film and the inorganic hard mask by etching with the resist upper layer film in which the pattern is formed as a mask;

(IV-6) a step of transferring the pattern to the protective film by etching with the inorganic hard mask in which the pattern is transferred as a mask; and (IV-7) a step of forming a pattern on the substrate to be processed with the protective film in which the pattern is transferred as a mask.

The inventive composition for forming a protective film can be suitably used for various methods for forming a pattern including: a three-layer resist process using a silicon-containing resist intermediate film or an inorganic hard mask; and a four-layer resist process using an organic anti-reflection film in addition thereto. In the semiconductor apparatus manufacturing process, forming a circuit pattern by the above inventive method for forming a pattern can produce the semiconductor apparatuses with a good yield. Furthermore, as described above, the protective film formed by using the inventive composition for forming a protective film has good resistance against an alkaline aqueous hydrogen peroxide. Thus, the inventive method is also usable for a wet etching process using an alkaline aqueous hydrogen peroxide.

The inorganic hard mask is preferably formed by a CVD method or an ALD method.

In the inventive method for forming a pattern, the inorganic hard mask can be formed by such a method.

The method for forming a pattern of the present invention may further comprise, after the (I-6) step or the (II-6) step, a step of removing the silicon-containing resist intermediate film in which the pattern is transferred by wet etching using an alkaline aqueous hydrogen peroxide.

The protective film formed by using the inventive composition for forming a protective film has good resistance against an alkaline aqueous hydrogen peroxide. Thus, as described above, the silicon-containing resist intermediate film can be removed by wet etching using the alkaline aqueous hydrogen peroxide.

In the method for forming a pattern of the present invention, the (I-7) step, the (II-7) step, the (III-7) step, or the (IV-7) step may comprise a step of transferring the pattern to the substrate to be processed by wet etching using an alkaline aqueous hydrogen peroxide and with the protective film in which the pattern is transferred as a mask.

The protective film formed by using the inventive composition for forming a protective film has good resistance against an alkaline aqueous hydrogen peroxide. Thus, as described above, the pattern can be transferred to the substrate to be processed by wet etching using the alkaline aqueous hydrogen peroxide.

In the method for forming a pattern of the present invention, the (I-7) step, the (II-7) step, the (III-7) step, or the (IV-7) step may comprise a step of pattern-processing the substrate to be processed by implanting ions with the protective film in which the pattern is transferred as a mask.

Such a method for forming a pattern is particularly suitable for an ion-implanting process of a substrate having roughness on the surface.

In this time, the inventive method for forming a pattern may further comprise, after the step of pattern-processing the substrate to be processed by implanting ions, a step of removing the silicon-containing resist intermediate film in which the pattern is transferred by wet etching using an alkaline aqueous hydrogen peroxide.

The protective film formed by using the inventive composition for forming a protective film has good resistance against an alkaline aqueous hydrogen peroxide. Thus, as described above, the silicon-containing resist intermediate film after the pattern processing by ion-implanting can be removed by wet etching using the alkaline aqueous hydrogen peroxide.

In forming the circuit pattern, the circuit pattern is preferably formed by lithography using light having a wavelength of 10 nm or more and 300 nm or less, direct drawing with electron beam, nanoimprinting, or a combination thereof.

In forming the circuit pattern, the circuit pattern is preferably developed with an alkaline development or an organic solvent.

In the inventive method for forming a pattern, such a means for forming a circuit pattern and development means can be suitably used.

As the substrate to be processed, a semiconductor apparatus substrate or a substrate in which any of a metal film, a metal carbide film, a metal oxide film, a metal nitride film, a metal oxycarbide film, and a metal oxynitride film is formed on the semiconductor apparatus substrate is preferably used.

As the substrate to be processed, a substrate containing silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is preferably used.

The inventive method for forming a pattern can process such a substrate to be processed to form a pattern.

Advantageous Effects of Invention

As described above, the inventive composition for forming a protective film is useful since the inventive composition can form a cured film without byproduct generation in film forming even in an inert gas, which prevents substrate corrosion, and can form the protective film also having high embedding and planarization ability. The inventive composition for forming a protective film is a material that forms the protective film having embedding/planarization ability and characteristics such as heat resistance, etching resistance, adhesiveness, and resistance against an alkaline aqueous hydrogen peroxide. Thus, the inventive composition is extremely useful for, for example: a protective film material in multilayer resist methods, such as a two-layer resist method, a three-layer resist method using a silicon-containing intermediate film, and a four-layer resist method using a silicon-containing intermediate film and an organic anti-reflection film; or a planarization material for producing a semiconductor apparatus. Since the protective film formed with the inventive composition for forming a protective film has excellent heat resistance, the inventive composition for forming a protective film has no change in thickness due to pyrolysis even when a CVD hard mask is formed on the protective film, and thereby useful for forming a pattern. Furthermore, the inventive composition is also extremely useful for a method for forming a pattern using a wet-etching processing.

BRIEF DESCRIPTION OF DRAWINGS

FIG. 1 is an explanatory view of planarization characteristics in the present invention.

FIG. 2 is an explanatory view of an example of a method for forming a pattern of the inventive three-layer resist method.

FIG. 3 is an explanatory view of a method for evaluating embedding characteristics in Examples.

FIG. 4 is an explanatory view of a method for evaluating planarization characteristics in Examples.

DESCRIPTION OF EMBODIMENTS

There have been demands for the developments of a composition for forming a protective film that: generates no byproduct even under a film-forming condition in an inert gas to prevent substrate corrosion at, for example, 300° C. or higher; has excellent embedding and planarization ability for a pattern formed on the substrate; can form a protective film having good dry-etching resistance during the substrate processing; has no change in thickness of the protective film due to pyrolysis even when a CVD hard mask is formed on the protective film; and has high compatibility with a wet etching process (that is, resistance against an alkaline aqueous hydrogen peroxide).

The present inventors further have made earnest study, and found that using a specific polymer for a composition for forming a protective film exhibits thermal curability equivalent to conventional underlayer materials in not only the air but also in an inert gas, and exhibits excellent thermal flowability, thereby high embedding/planarization ability.

The specific polymer is: a polymer having a polyimide structure represented by the general formula (1A) and having at least one or more fluorine atoms and one or more hydroxy groups in a main skeleton, and a group having a triple bond represented by $R_1$ in the general formula (1B) or (1C) as a thermally curable group being introduced as a terminal group; a polymer having a polyimide structure represented by the general formula (2A) and having at least one or more fluorine atoms and a polyimide structure represented by the general formula (3A) and having at least one or more hydroxy groups in main skeletons, and the terminal group represented by the general formula (1B) or (1C) being introduced; or a mixture of: a polymer having a polyimide structure represented by the general formula (2A) in a main skeleton, and the terminal group represented by the general formula (1B) or (1C) being introduced; and a polymer having a polyimide structure represented by the general formula (3A) in a main skeleton, and the terminal group represented by the general formula (1B) or (1C) being introduced.

The present inventors have also found that the composition for forming a protective film has: high heat resistance with no change in application thickness due to pyrolysis even when the CVD hard mask is formed; and good adhesiveness to the substrate. Furthermore, the present inventors have studied the polymers represented by (I) and (II) and the polymer mixture represented by (III) to find that such polymers provide a composition for forming a protective film having excellent resistance against an alkaline aqueous hydrogen peroxide. This finding has led to the completion of the present invention.

Specifically, the present invention is a composition for forming a protective film against an alkaline aqueous hydrogen peroxide, the composition comprising: (A) a polymer represented by the following any one of (I) and (II) and having a fluorine atom and a hydroxy group, or a mixture of a polymer having a fluorine atom and a polymer having a hydroxy group represented by the following (III); (I) a polymer having a repeating unit represented by the following general formula (1A) and having at least one or more fluorine atoms and at least one or more hydroxy groups, a terminal group thereof being a group represented by any one of the following general formulae (1B) and (1C), (II) a polymer having a repeating unit represented by the following general formula (2A) and having at least one or more fluorine atoms and a repeating unit represented by the following general formula (3A) and having at least one or more hydroxy groups, a terminal group thereof being a group represented by any one of the following general formulae (1B) and (1C), and (III) a mixture of: a polymer having a repeating unit represented by the following general formula (2A) and having at least one or more fluorine atoms, a terminal group thereof being a group represented by any one of the following general formulae (1B) and (1C); and a polymer having a repeating unit represented by the following general formula (3A) and having at least one or more hydroxy groups, a terminal group thereof being a group represented by any one of the following general formulae (1B) and (1C); and (B) an organic solvent,

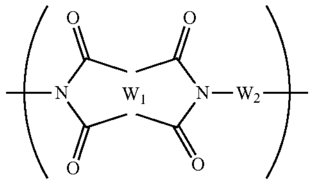

(1A)

wherein $W_1$ represents one or more kinds of tetravalent organic groups optionally having a fluorine atom or a hydroxy group, $W_2$ represents one or more kinds of divalent organic groups optionally having a fluorine atom or a hydroxy group, at least one of $W_1$ and $W_2$ has one or more fluorine atoms, and at least one of $W_1$ and $W_2$ has one or more hydroxy groups,

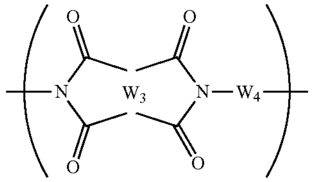

(2A)

wherein $W_3$ represents one or more kinds of tetravalent organic groups optionally having a fluorine atom, $W_4$ represents one or more kinds of divalent organic groups optionally having a fluorine atom, and at least one of $W_3$ and $W_4$ has one or more fluorine atoms,

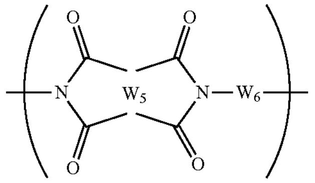

(3A)

wherein $W_5$ represents one or more kinds of tetravalent organic groups optionally having a hydroxy group, $W_6$ represents one or more kinds of divalent organic groups optionally having a hydroxy group, and at least one of $W_5$ and $W_6$ has one or more hydroxy groups, and

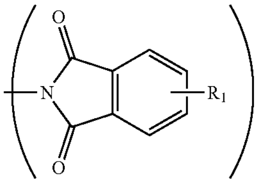

(1B)

-continued (1C)

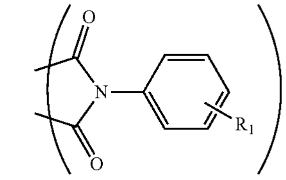

wherein $R_1$ represents any one group represented by the following formula (1D), and two or more kinds of $R_1$ are optionally used in combination.

(1 D)

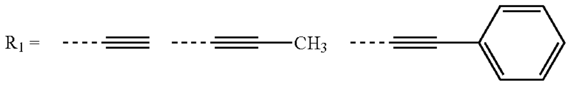

Hereinafter, the present invention will be described in detail, but the present invention is not limited thereto.

<Component (A)>

A component (A) in the present invention is any one of the following polymer (I) and polymer (II), or a polymer mixture (III).

Polymer (I)

A polymer for forming a protective film used for the inventive composition for forming a protective film is a polymer having a repeating unit represented by the following general formula (1A) and having at least one or more fluorine atoms and one or more hydroxy groups, and a terminal group thereof is a group represented by any one of the following general formulae (1B) and (1C) (polymer (I)), (1A)

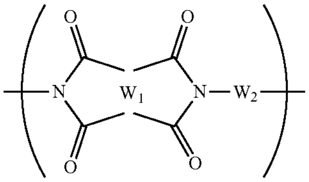

wherein $W_1$ represents one or more kinds of tetravalent organic groups optionally having a fluorine atom or a hydroxy group, $W_2$ represents one or more kinds of divalent organic groups optionally having a fluorine atom or a hydroxy group, at least one of $W_1$ and $W_2$ has one or more fluorine atoms, and at least one of $W_1$ and $W_2$ has one or more hydroxy groups, (1B)

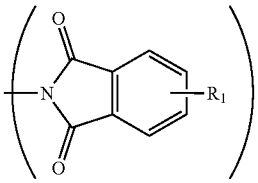

-continued (1C)

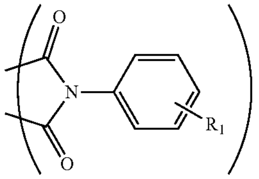

wherein $R_1$ represents any one group represented by the following formula (1D), and two or more kinds of $R_1$ are optionally used in combination.

(1 D)

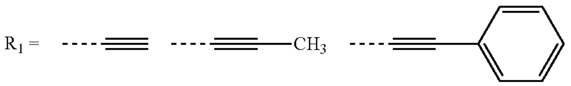

Setting a previously ring-closed polyimide structure such as the above (1A), (1B), and (1C) eliminates an elimination reaction, such as dehydration, of a side reaction with thermally ring-closing a polyimide compound precursor, such as a polyamic acid. Thus, film shrinkage is inhibited and the flatness of the protective film is not impaired. In addition, previously setting the stable imide stricture can inhibit decomposition, etc. of the polyimide compound precursor, such as a polyamic acid, due to the equilibrium reaction, and takes an advantage in terms of storage stability. The polyimide structure also contributes to both of imparting the heat resistance and improving the adhesiveness to the substrate. Such improvement of the adhesiveness prevents film removal during formation of an inorganic hard mask using a CVD method or an ALD method just on the protective film, which can form a protective film having excellent process latitude. Furthermore, the presence of the fluorine atom and the hydroxy group in the main skeleton of the polyimide structure represented by the above (1A) also contributes to improvement of resistance against an alkaline aqueous hydrogen peroxide. It is presumed that the fluorine atom provides water-repellent effect of the protective film to the alkaline aqueous hydrogen peroxide and the hydroxy group provides improving effect of the adhesiveness between the protective film and the substrate to be processed, and the obtained both the effects inhibit the removal during wet etching using the alkaline aqueous hydrogen peroxide, resulting in the good resistance against the alkaline aqueous hydrogen peroxide.

$R_1$ represented by the formula (1D) functions as a thermally crosslinkable group. $R_1$ is preferably an ethynyl group and a ethynylphenyl group in terms of curability, heat resistance, and easiness of raw material availability.

Examples of $W_1$ in the general formula include the following structural formulae optionally having a substituent on their aromatic rings. Examples of the substituent include a hydroxy group, a trifluoromethyl group, an alkyl group having 1 to 10 carbon atoms, an alkynyl group and an alkenyl group having 3 to 10 carbon atoms, an alkyloxy group having 1 to 10 carbon atoms, an alkynyloxy group and an alkenyloxy group having 3 to 10 carbon atoms, an aryl group having 6 to 10 carbon atoms, a nitro group, a halogen group, a nitrile group, an alkoxycarbonyl group having 1 to 10 carbon atoms, and an alkanoyloxy group having 1 to 10 carbon atoms.

 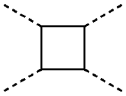 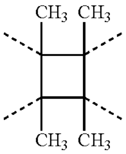 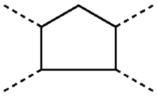 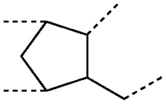 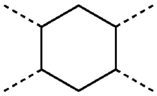
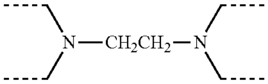 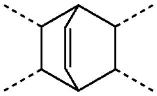 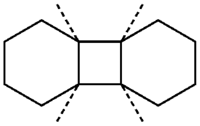 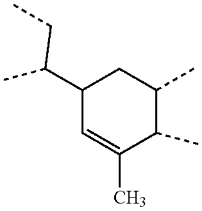 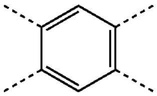
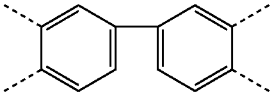 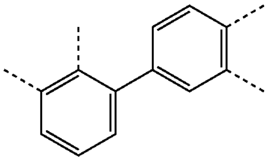 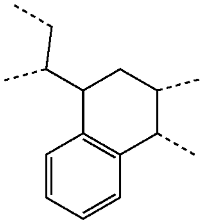 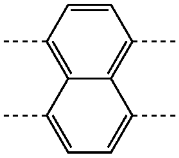
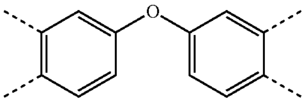 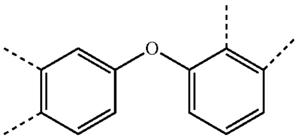 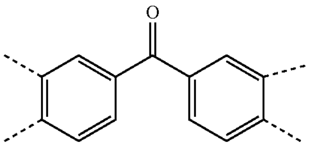
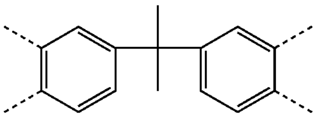 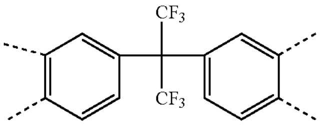 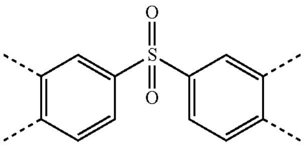
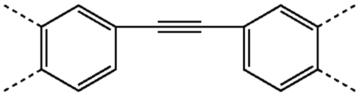 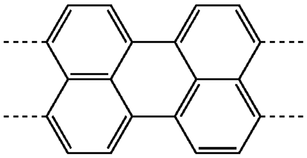 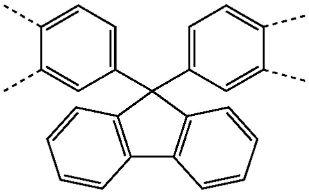
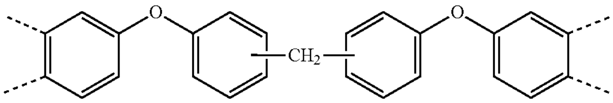
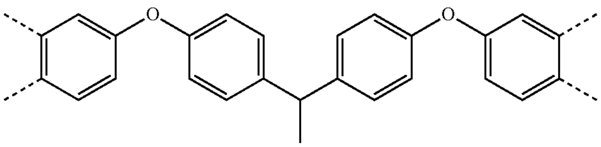
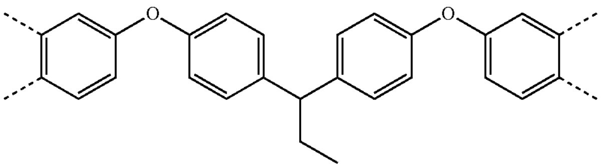
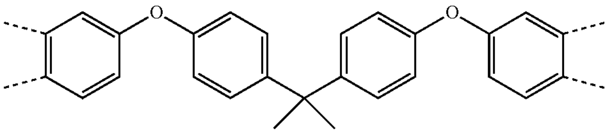

-continued
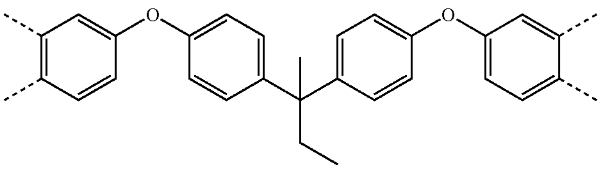
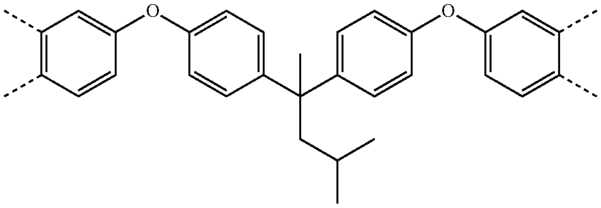
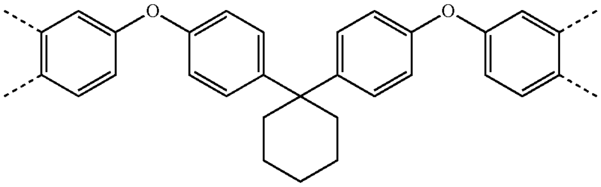
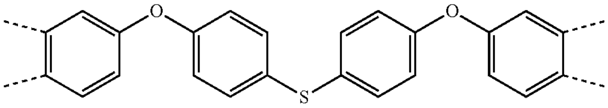
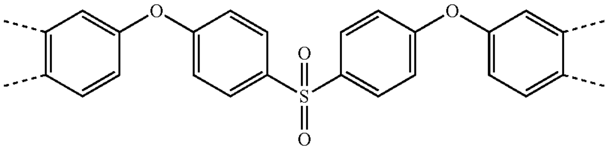
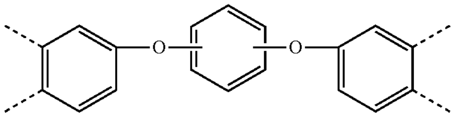
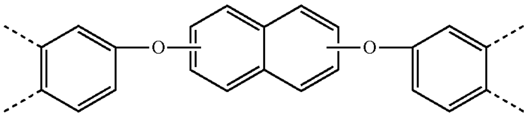
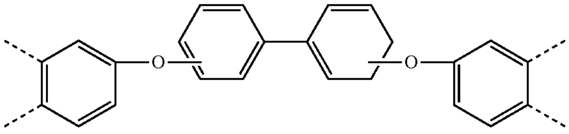
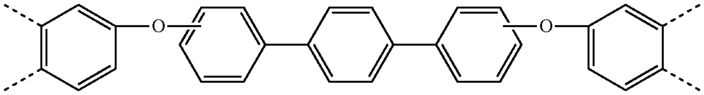
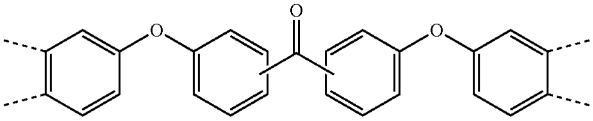
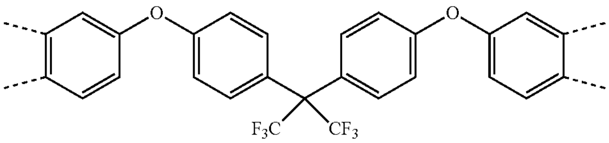
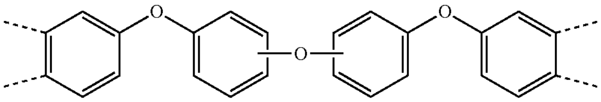
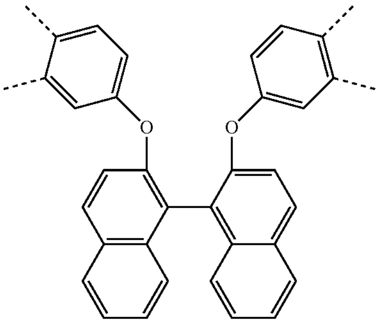

-continued
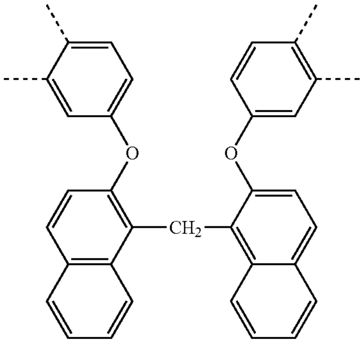
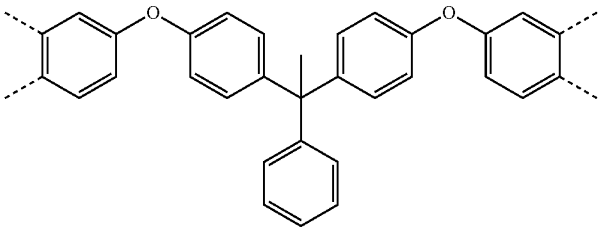
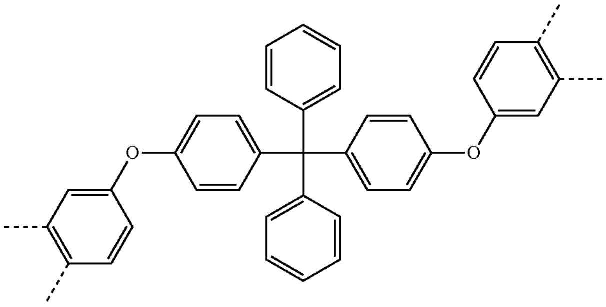
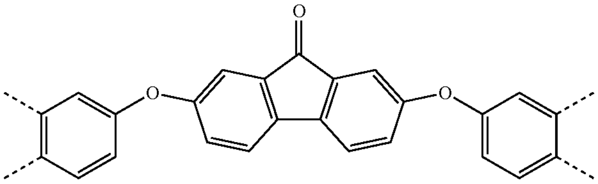
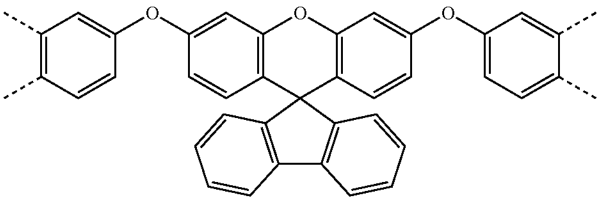
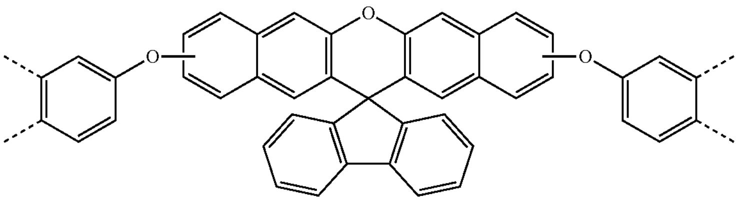
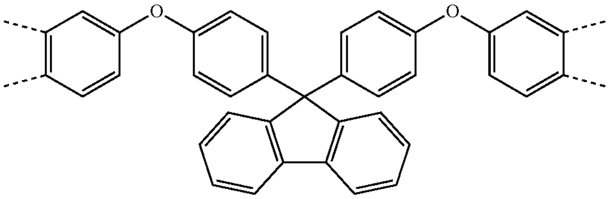
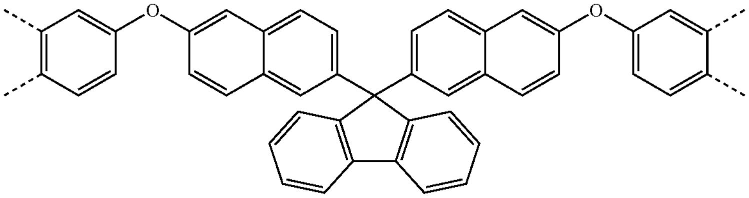
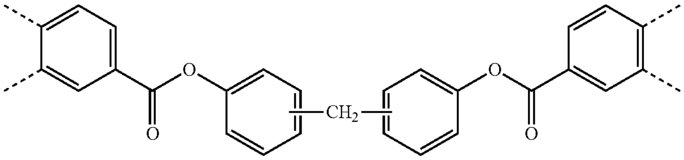

-continued
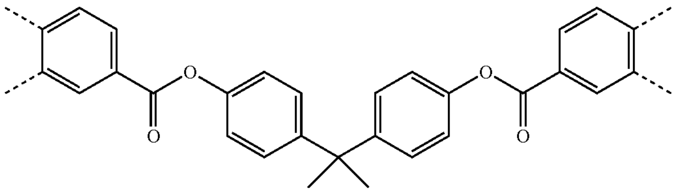
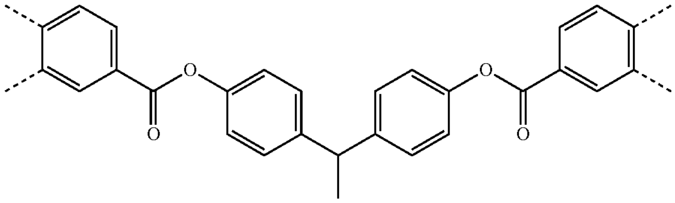
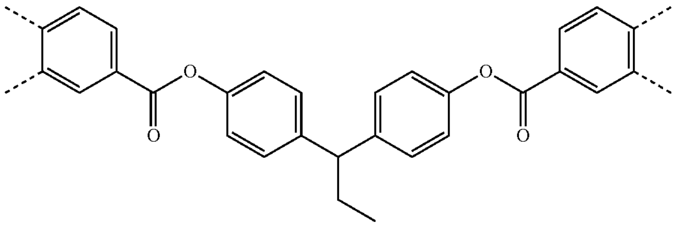
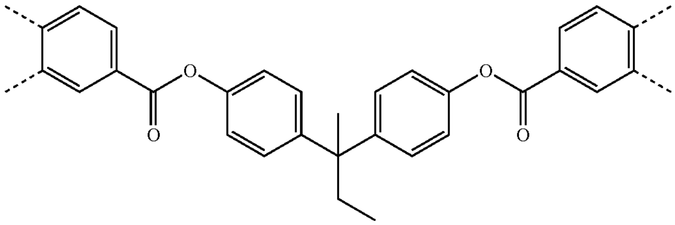
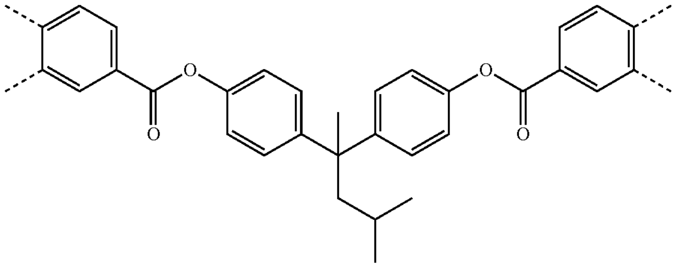
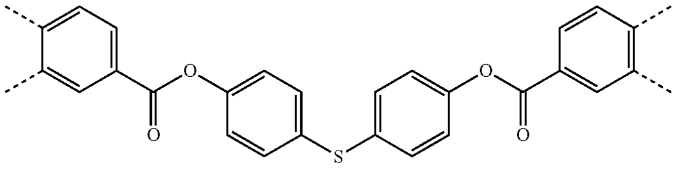
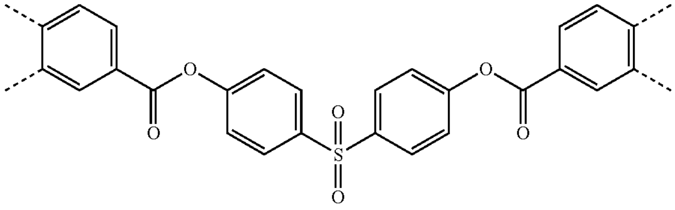
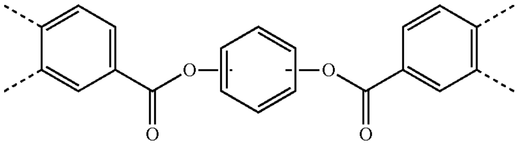
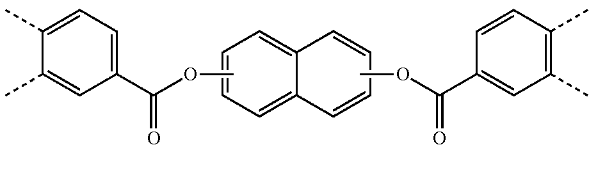

-continued
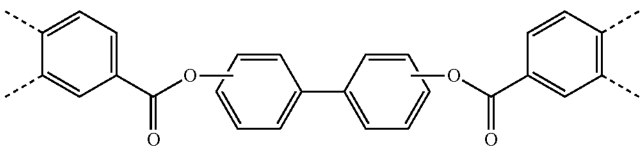
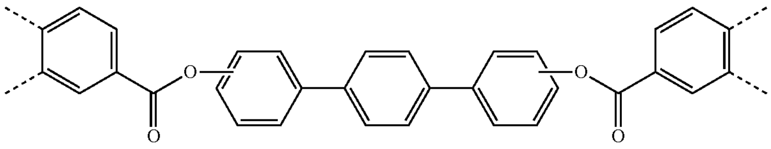
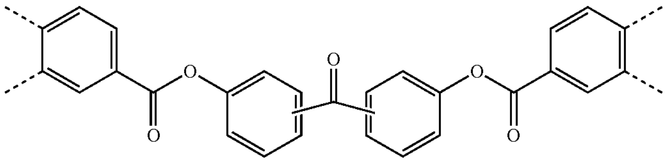
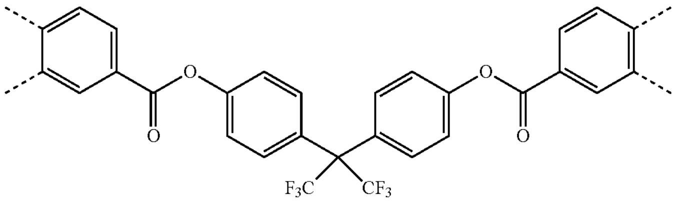
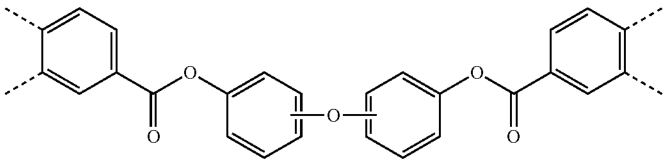
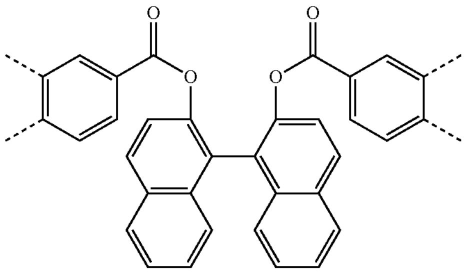
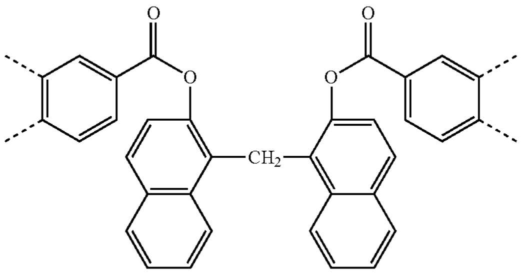
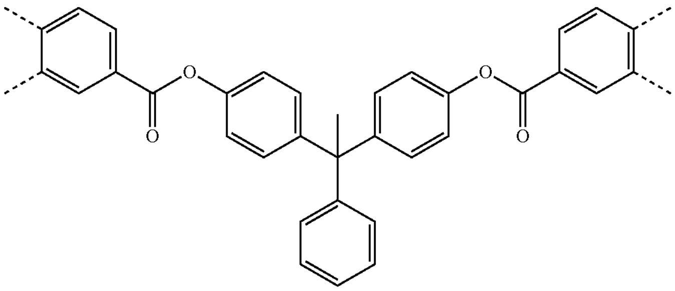
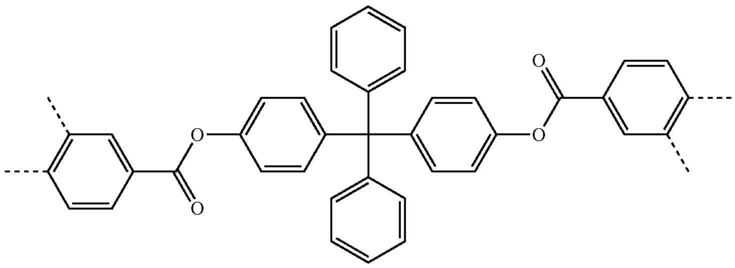
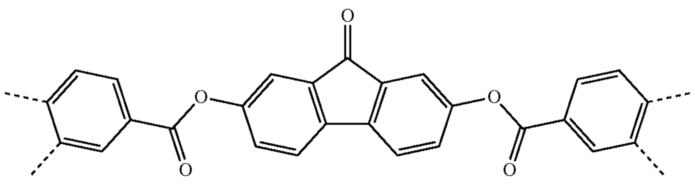

-continued
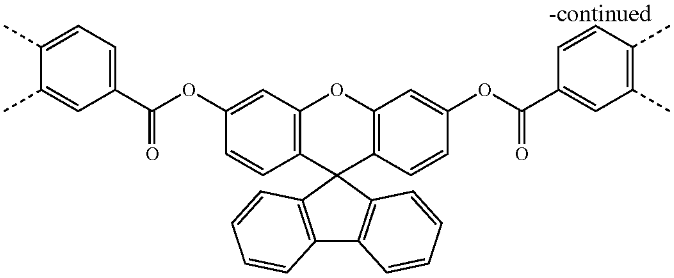
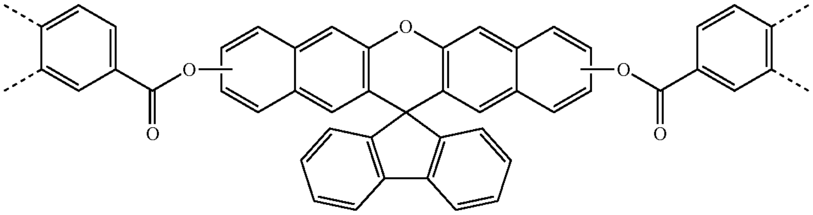
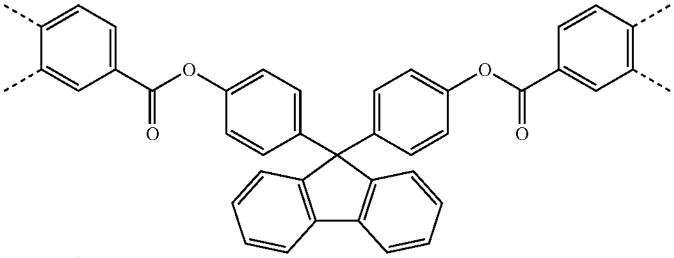
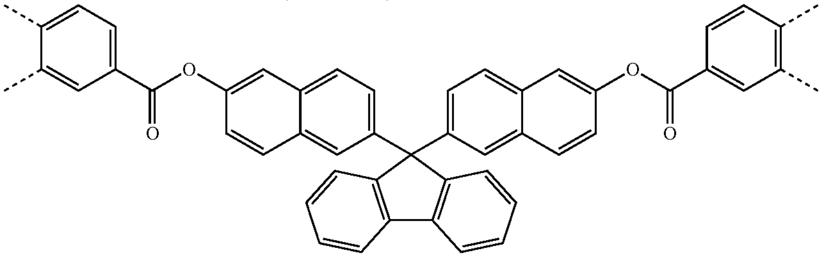
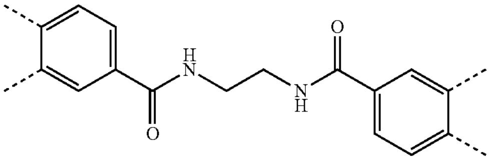
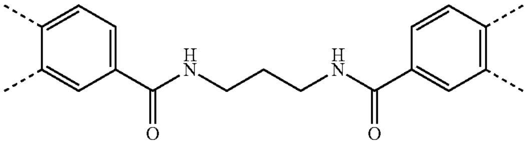
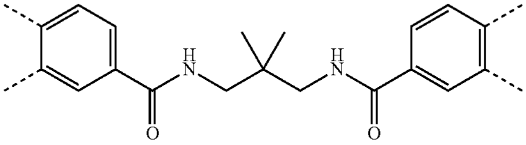
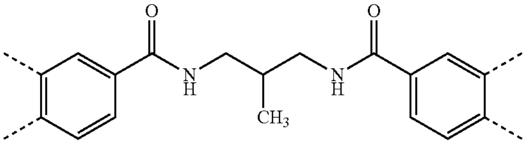
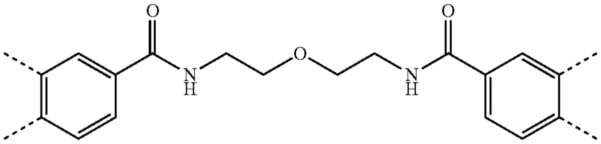
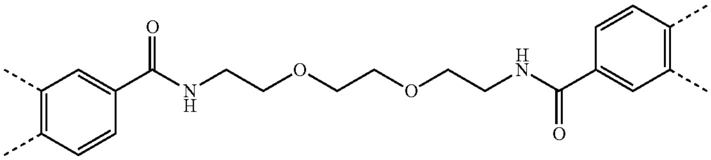
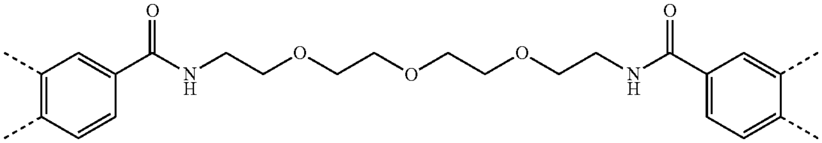

-continued
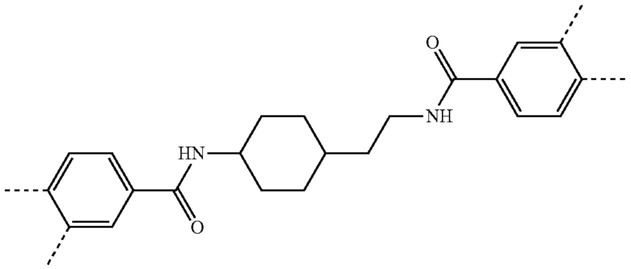
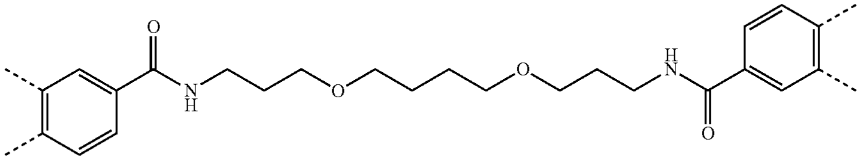
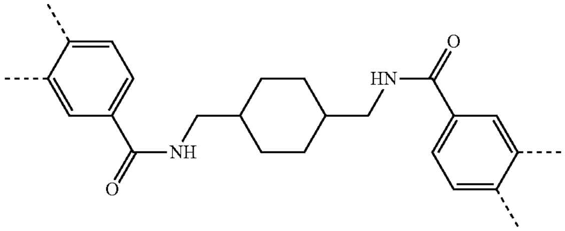
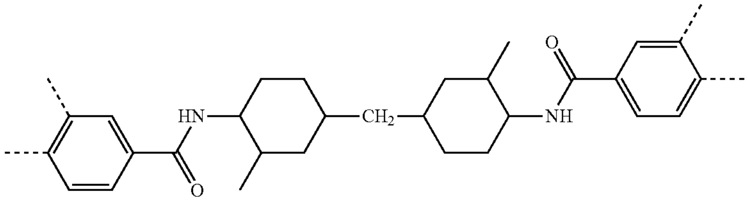
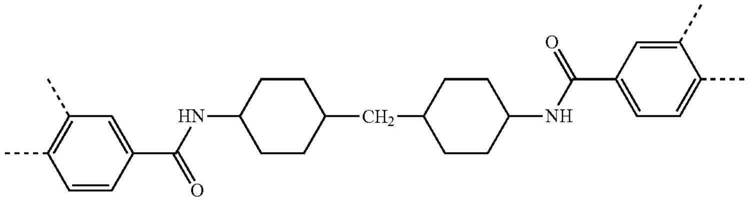
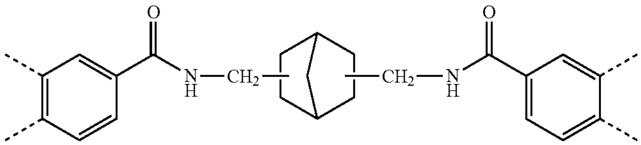
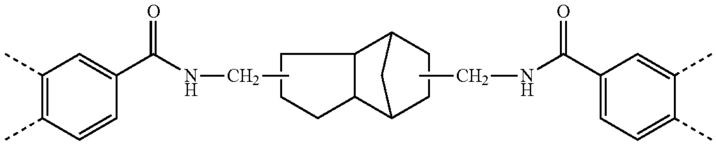
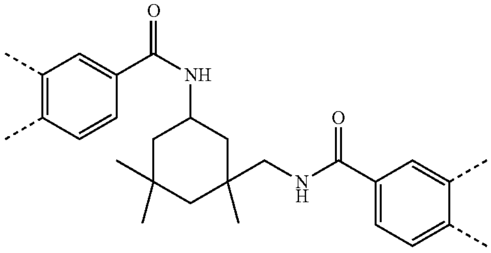
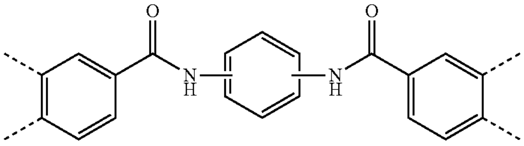

-continued
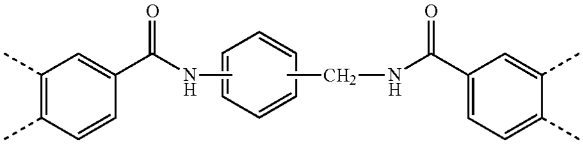
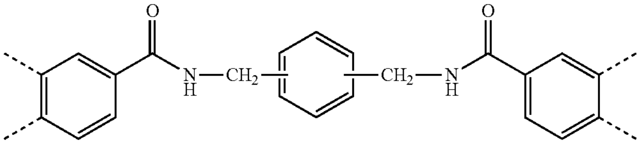
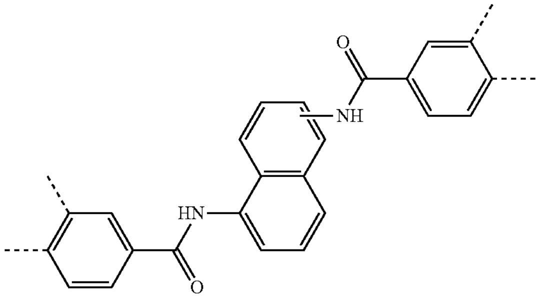
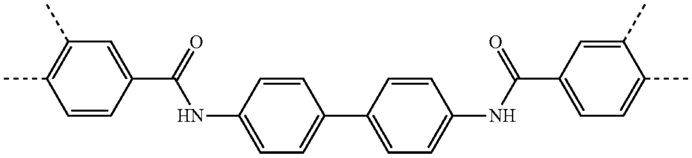
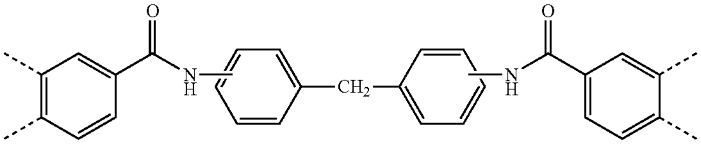
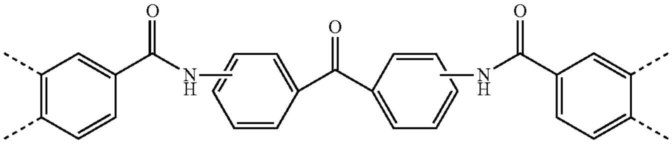
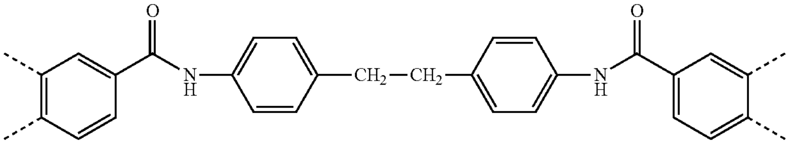
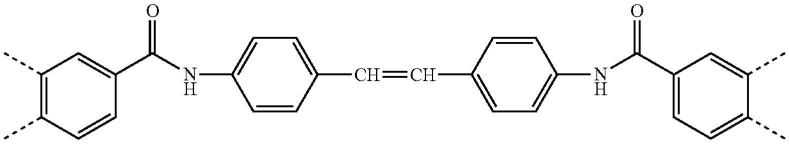
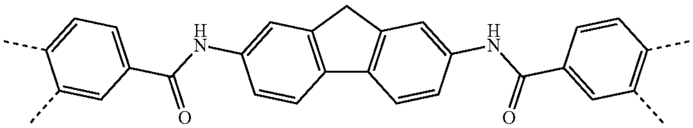
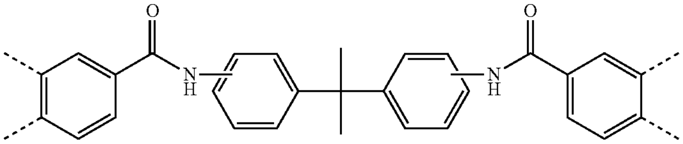
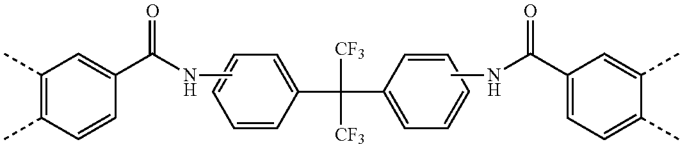

-continued
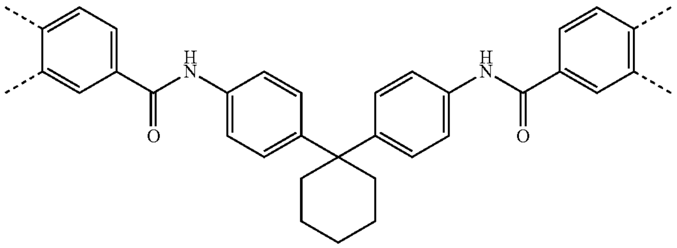
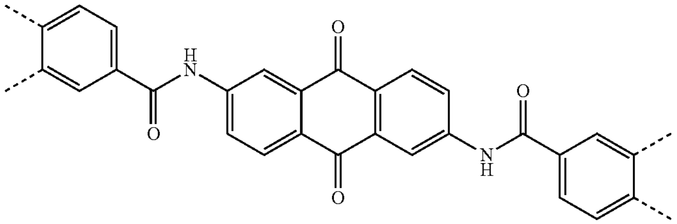
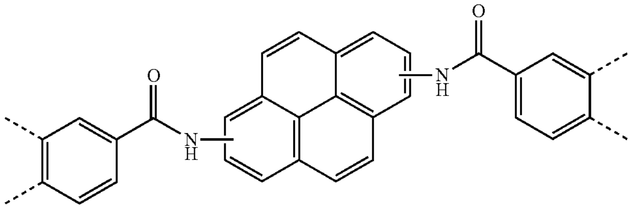
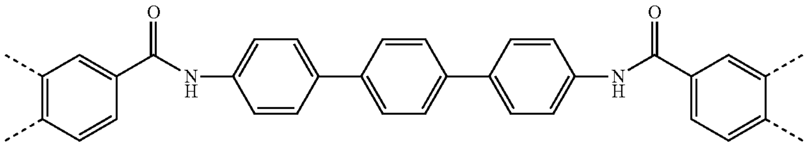
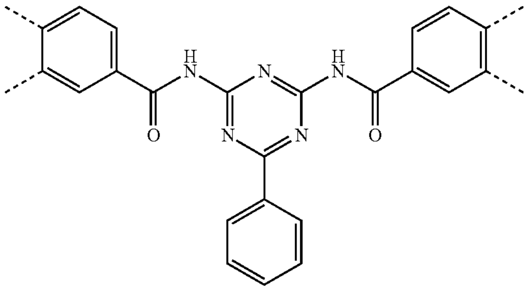
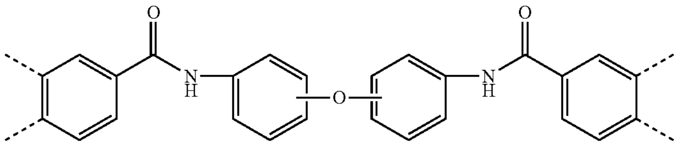
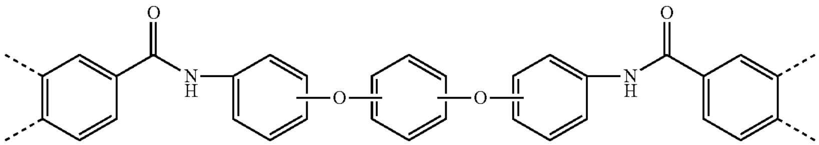
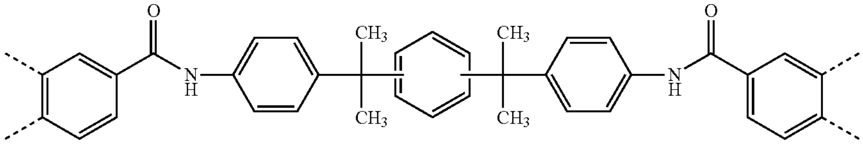
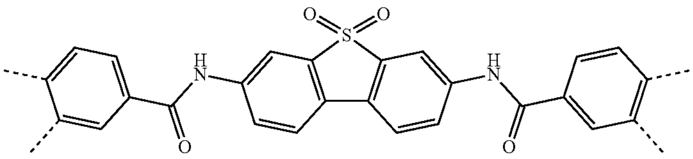

-continued

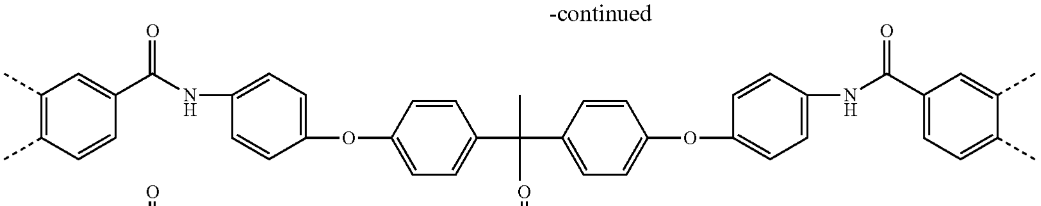

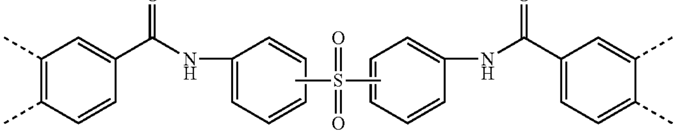

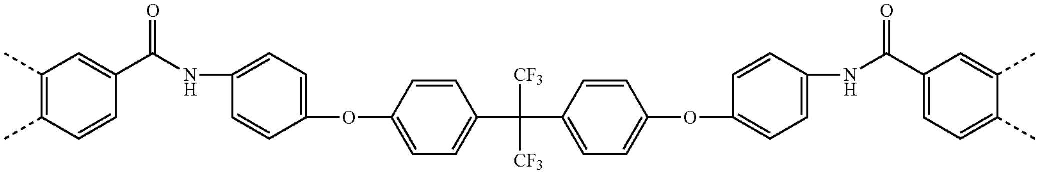

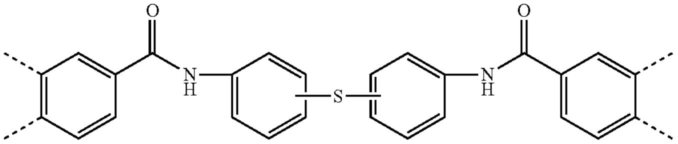

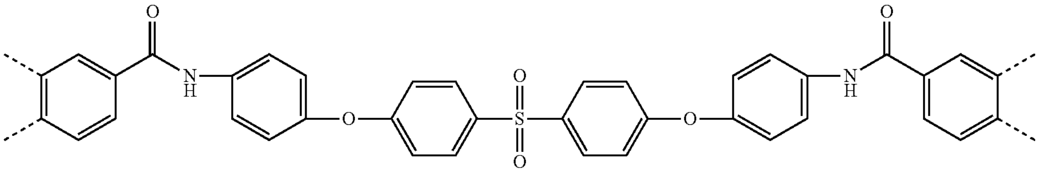

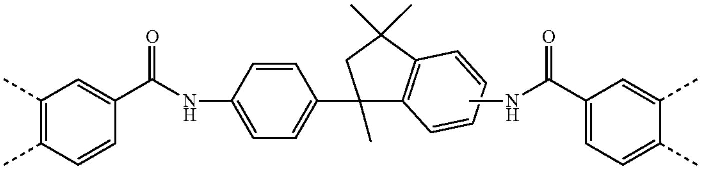

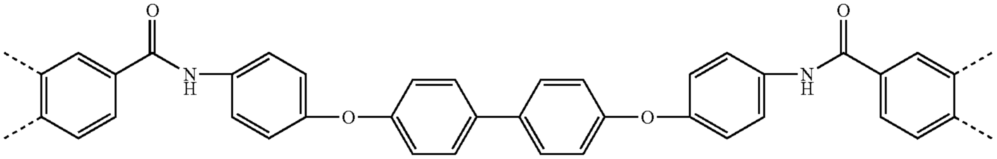

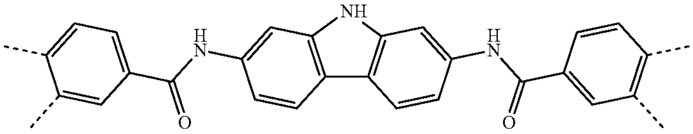

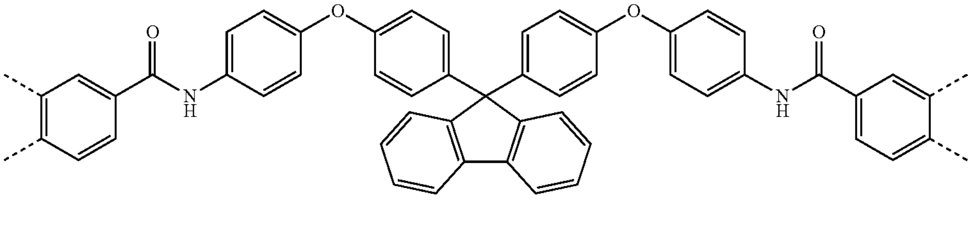

Examples of $W_2$ in the general formula include the following structural formulae optionally having a substituent on their aromatic rings. Examples of the substituent include a hydroxy group, a trifluoromethyl group, an alkyl group having 1 to 10 carbon atoms, an alkynyl group and an alkenyl group having 3 to 10 carbon atoms, an alkyloxy group having 1 to 10 carbon atoms, an alkynyloxy group and an alkenyloxy group having 3 to 10 carbon atoms, an aryl group having 6 to 10 carbon atoms, a thiol group, a nitro group, a halogen group, a nitrile group, a sulfonic acid group, an alkoxycarbonyl group having 1 to 10 carbon atoms, and an alkanoyloxy group having 1 to 10 carbon atoms.

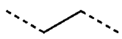
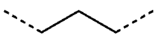
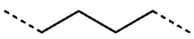

-continued
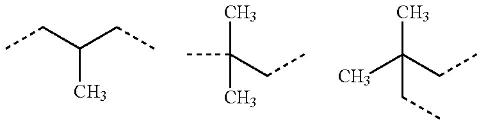
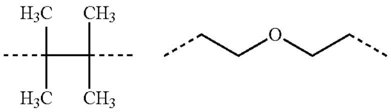
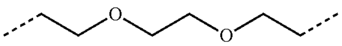
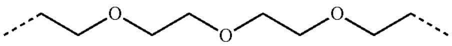
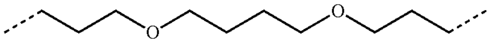
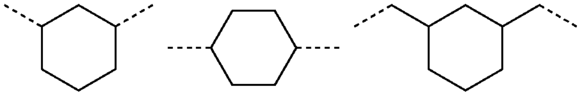
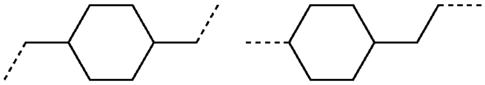
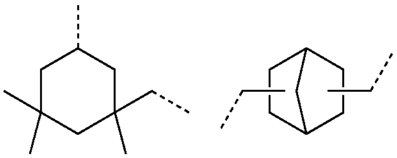
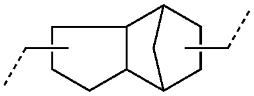
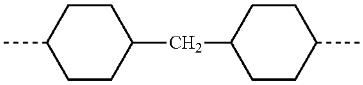
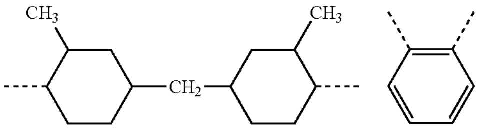
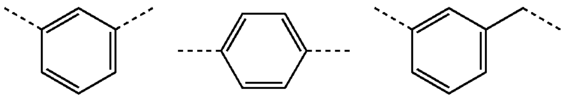
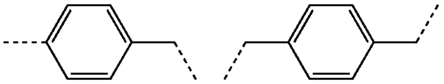
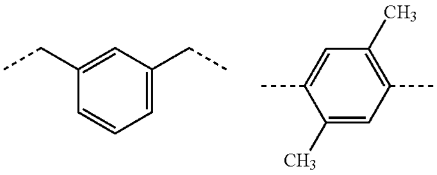
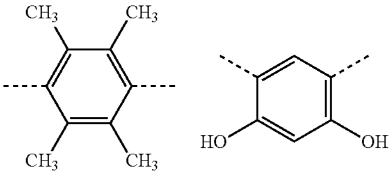
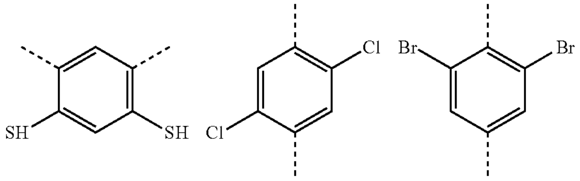
-continued
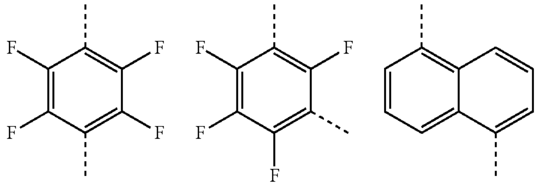
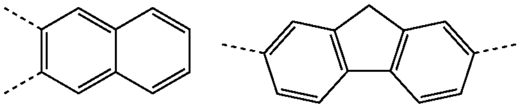
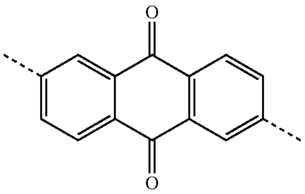
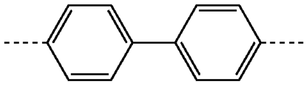
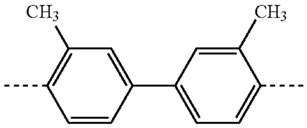
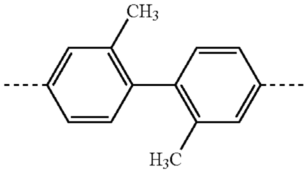
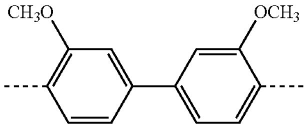
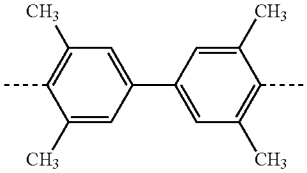
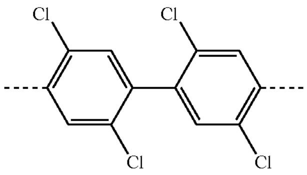
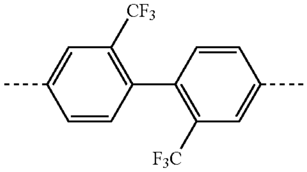
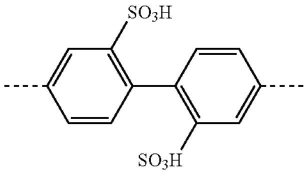

-continued
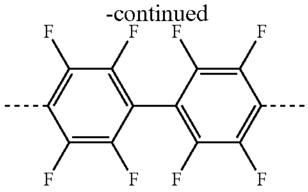
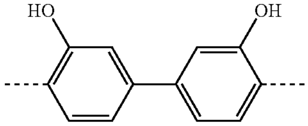
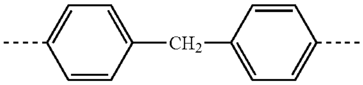
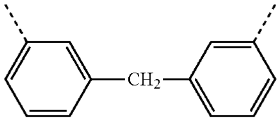
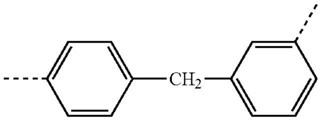
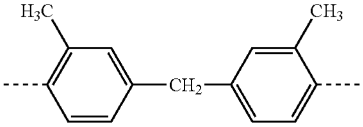
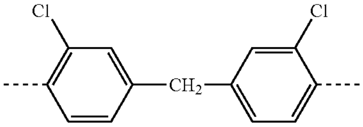
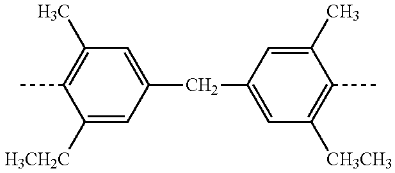
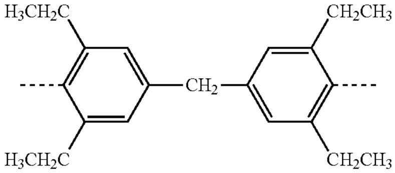
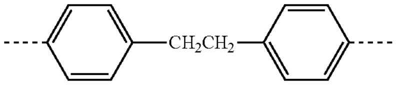
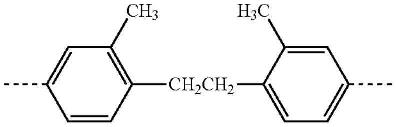
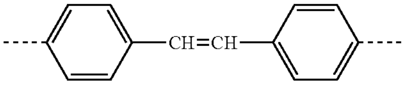
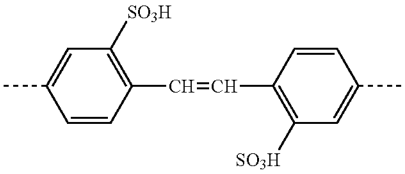
-continued
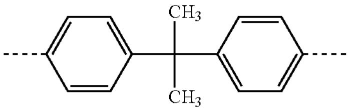
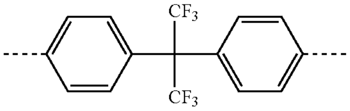
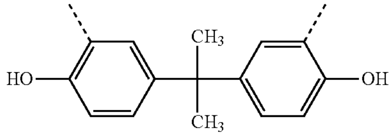
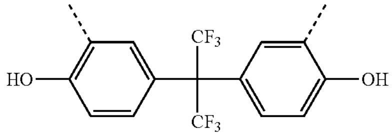
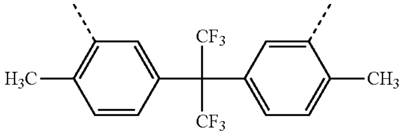
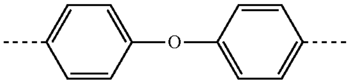
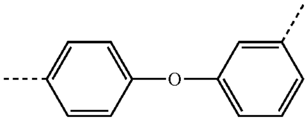
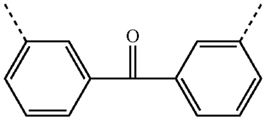
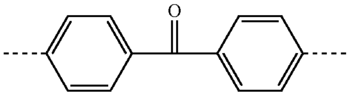
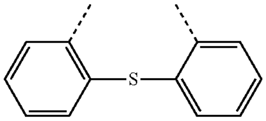
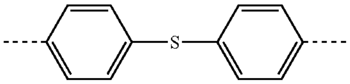
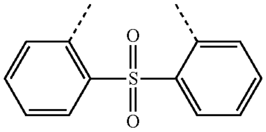
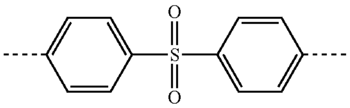
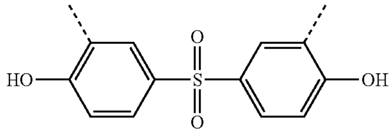
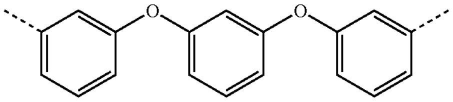
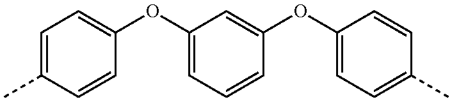

-continued
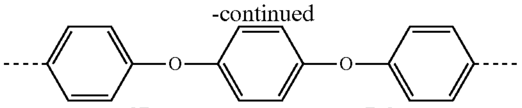
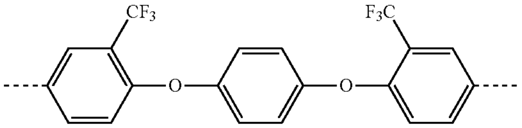
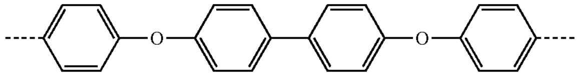
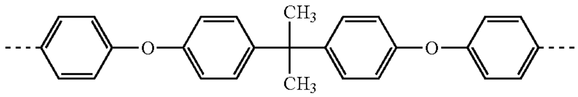
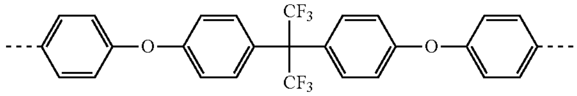
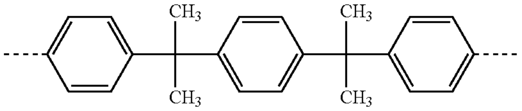
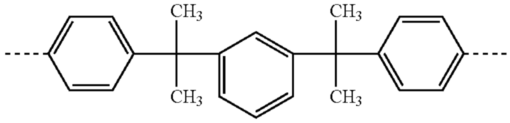
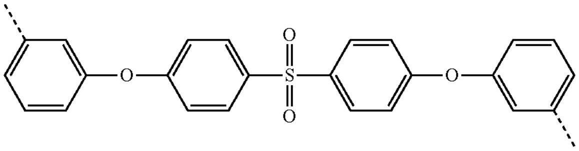
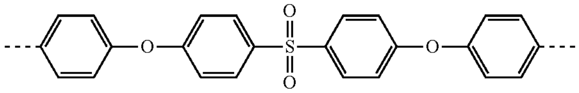
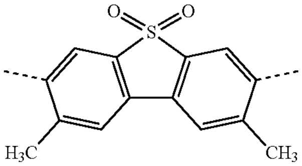
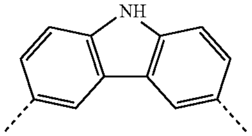
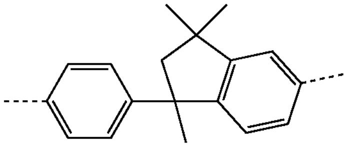
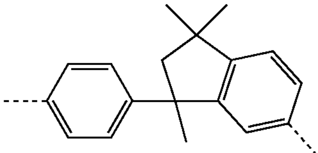
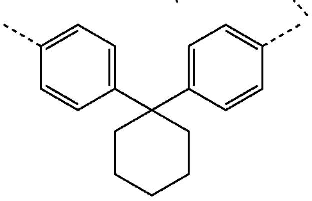
-continued
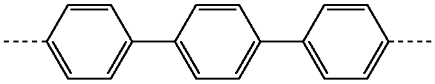
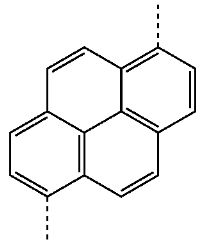
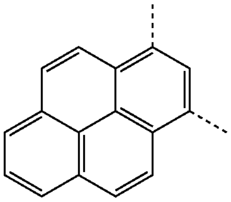
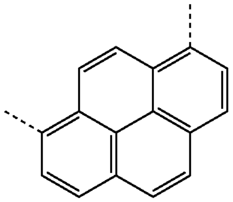
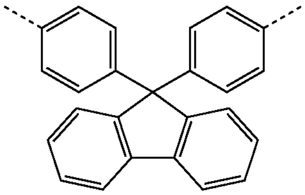
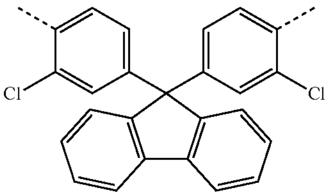
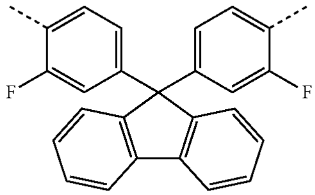
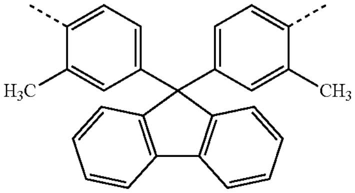
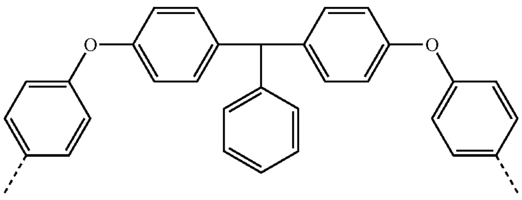
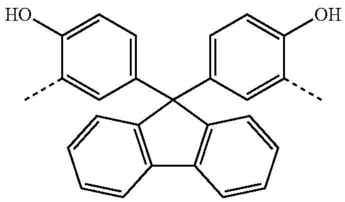
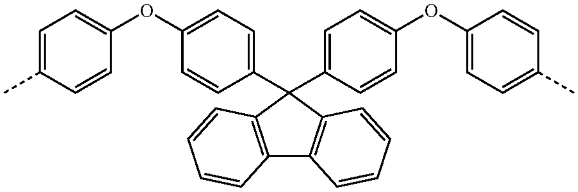

-continued

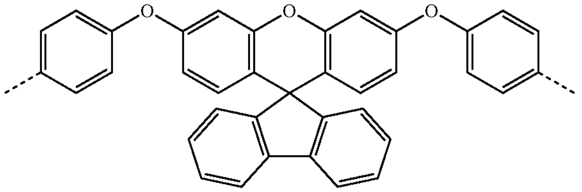

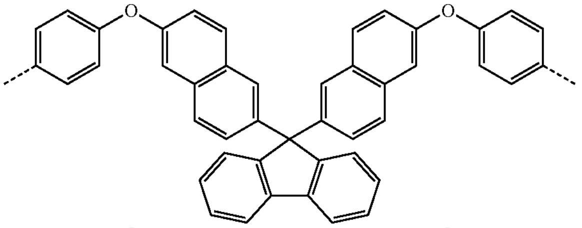

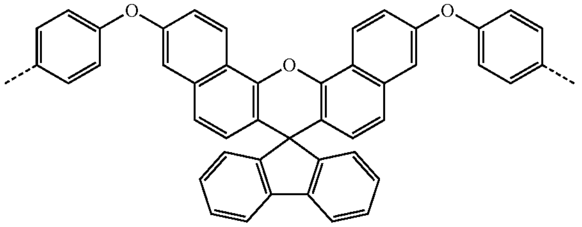

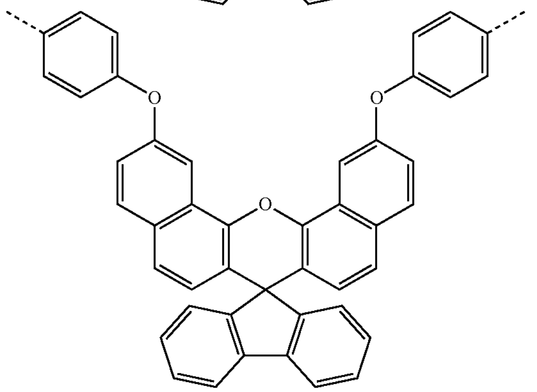

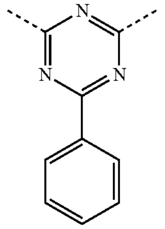

Setting one or more kinds of $W_1$ and $W_2$ to a combination of the above organic groups can improve the thermal flowability, the heat resistance, and the adhesiveness. $W_1$ and $W_2$ may be each one kind, or may be a combination of two or more kinds. Note that the selected $W_1$ and $W_2$ have to have at least one or more fluorine atoms and at least one or more hydroxy groups from the viewpoint of the resistance against an alkaline aqueous hydrogen peroxide. That is, at least one of $W_1$ and $W_2$ has at least one or more fluorine atoms, and at least one of $W_1$ and $W_2$ has at least one or more hydroxy groups.

The polymer (I) used for the inventive composition for forming a protective film preferably has at least one or more fluorine atoms and at least one or more hydroxy groups in $W_2$ in the general formula (1A).

The polymer (I) having such a partial structure in the main chain is preferable from the viewpoint of achievement of both the adhesiveness and the excellent resistance against an alkaline aqueous hydrogen peroxide.

In the polymer (I) used for the inventive composition for forming a protective film, $W_2$ in the general formula (1A) is preferably a group represented by the following general formula (1E).

(1E)

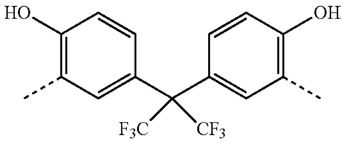

The hexafluoroisopropylidene group introduces flexibility in the main chain to inhibit aggregation of the imide groups, and thereby both of the high embedding/planarization ability and the heat resistance can be achieved. Furthermore, since the general formula (1E) has both the hexafluoroisopropylidene group and hydroxy groups, effectively exhibited are: the water-repellent effect of the protective film to an alkaline aqueous hydrogen peroxide by the hexafluoroisopropylidene group; and the improving effect of the adhesiveness between the protective film and the substrate to be processed by the hydroxy groups. Thus, the general formula (1E) is particularly preferable from the viewpoint of the resistance against the alkaline aqueous hydrogen peroxide.

In the polymer used for the inventive composition for forming a protective film, $W_1$ in the general formula (1A) is preferably a group represented by the following general formula (1F).

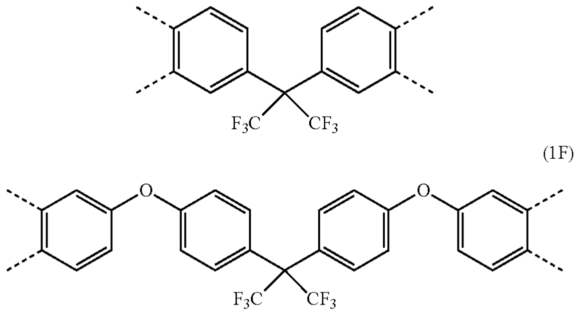

(1F)

The hexafluoroisopropylidene group introduces flexibility in the main chain to inhibit aggregation of the imide groups, and thereby both of the high embedding/planarization ability and the heat resistance can be achieved. In addition, the hexafluoroisopropylidene group can improve the water repellency to an alkaline aqueous hydrogen peroxide, and thereby the hexafluoroisopropylidene group is preferable from the viewpoint of the resistance against the alkaline aqueous hydrogen peroxide. Among the above, a structure having the hexafluoroisopropylidene group and the ether bond as linking groups of the main chain is particularly preferable. The ether bond functions as a flexible linking group, and can impart the thermal flowability and solvent solubility. Thus, both of the higher embedding/planarization ability and heat resistance can be achieved.

Mw (weight-average molecular weight) of the polymer (I) is preferably 1000 to 10000, more preferably 1000 to 8000, and further preferably 1500 to 5000. In the present invention, the weight-average molecular weight can be a polystyrene-converted weight-average molecular weight (Mw) with gel permeation chromatography (GPC) using tetrahydrofuran as an eluent.

Such a molecular weight can achieve solubility in the organic solvent, and can inhibit sublimate generation during the baking. In addition, the thermal flowability of the polymer of the component (A) (polymer for forming the protective film) becomes good, and thereby, when the polymer is blended with the composition for forming a protective film, a fine structure formed on the substrate can be smoothly embedded and in addition a protective film planarizing the entire substrate can be formed.

Polymer (II)

As the polymer (A) having a fluorine atom and a hydroxy group can be a polymer having: a repeating unit represented by the following general formula (2A) and having at least one or more fluorine atoms; and a repeating unit represented by the following general formula (3A) and having at least one or more hydroxy groups, and a terminal group thereof being a group represented by any of the following general formulae (1B) and (1C) (Polymer (II)), (2A)

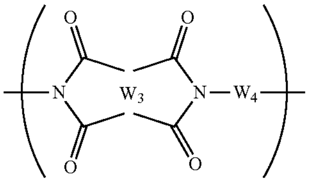

wherein $W_3$ represents one or more kinds of tetravalent organic groups optionally having a fluorine atom, $W_4$ represents one or more kinds of divalent organic groups optionally having a fluorine atom, and at least one of $W_3$ and $W_4$ has one or more fluorine atoms, (3A)

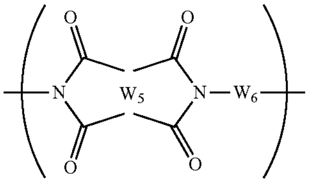

wherein $W_5$ represents one or more kinds of tetravalent organic groups optionally having a hydroxy group, $W_6$ represents one or more kinds of divalent organic groups optionally having a hydroxy group, and at least one of $W_5$ and $W_6$ has one or more hydroxy groups, (1B)

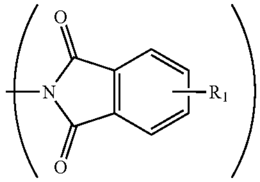

-continued (1C)

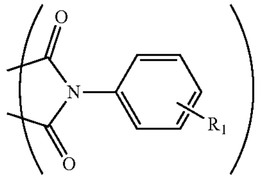

wherein $R_1$ represents any one group represented by the following formula (1D), and two or more kinds of $R_1$ are optionally used in combination.

(1 D)

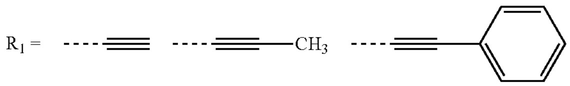

The polymer (A) used in the present invention contributes to the improvement of the resistance against an alkaline aqueous hydrogen peroxide with the presence of a fluorine atom and a hydroxy group in the main skeleton of the polyimide structure. Thus, the polymer (A) is not limited to the polymer (I), which has both the fluorine atom and the hydroxy atom in one repeating unit, but may be a copolymer of a repeating unit having only a fluorine atom and a repeating unit having only a hydroxy group (polymer (II)). Similar to the polymer (I), the polymer (II) also imparts the good embedding/planarization ability, the heat resistance, the adhesiveness, and the resistance against the alkaline aqueous hydrogen peroxide.

In the repeating unit represented by the general formula (2A) and having at least one or more fluorine atoms, $W_3$ is not particularly limited as long as it is one or more kinds of tetravalent organic groups optionally having a fluorine atom, and examples thereof include the groups having no hydroxy group among above-described groups as the specific example of $W_1$. $W_4$ is not particularly limited as long as it is one or more kinds of divalent organic groups optionally having a fluorine atom, and examples thereof include the groups having no hydroxy group among above-described groups as the specific example of $W_2$. Note that at least one of $W_3$ and $W_4$ has one or more fluorine atoms.

In the repeating unit represented by the general formula (3A) and having at least one or more hydroxy groups, $W_5$ is not particularly limited as long as it is one or more kinds of tetravalent organic groups optionally having a hydroxy group, and examples thereof include the groups having no fluorine atom among above-described groups as the specific example of $W_1$. $W_6$ is not particularly limited as long as it is one or more kinds of divalent organic groups optionally having a hydroxy group, and examples thereof include the groups having no fluorine atom among above-described groups as the specific example of $W_2$. Note that at least one of $W_5$ and $W_6$ has one or more hydroxy groups.

In the polymer (II), a structure of a terminal group and a weight-average molecular weight are as described in the polymer (I).

Polymer Mixture (III)

The inventive component (A) may be, other than the copolymer of the repeating unit represented by the general formula (2A) and the repeating unit represented by the general formula (3A) (polymer (II)), a mixture of a polymer having the repeating unit represented by the general formula (2A) (polymer (III-1)) and a polymer having the repeating unit represented by the general formula (3A) (polymer (III-2)) (polymer mixture (III)).

The polymer (III-1) is a polymer having the repeating unit represented by the general formula (2A) and having at least one or more fluorine atoms, and a terminal group thereof being the group represented by any of the general formulae (1B) and (1C). In the polymer (III-1), the repeating unit represented by the general formula (2A), the structure of the terminal group represented by any of the general formulae (1B) and (1C), and a weight-average molecular weight are as described in the polymer (II).

The polymer (III-2) is a polymer having the repeating unit represented by the general formula (3A) and having at least one or more hydroxy groups, and a terminal group thereof being the group represented by any of the general formulae (1B) and (1C). In the polymer (III-2), the repeating unit represented by the general formula (3A), the structure of the terminal group represented by any of the general formulae (1B) and (1C), and a weight-average molecular weight are as described in the polymer (II).

In the inventive component (A), both the fluorine atom and the hydroxy group in the main skeleton of the polyimide structure are not necessarily contained in one polymer. Even when the fluorine atom in the main skeleton of the polyimide structure and the hydroxy group in the main skeleton of the polyimide structure are contained in different polymers, the resistance against an alkaline aqueous hydrogen peroxide can be similarly improved. Thus, similar to the polymers (I) and (II), the polymer mixture (III) imparts the good embedding/planarization ability, the heat resistance, the adhesiveness, and the resistance against an alkaline aqueous hydrogen peroxide.

[Method for Producing Polymer (A)]

A method for producing the polymer of the component (A) will be described with the polymer (I) as an example, but the polymer (II), the polymer (III-1), and the polymer (III-2) can be produced by the same method.

As a means for obtaining the polymer used for the inventive composition for forming a protective film, a diamine and a tetracarboxylic anhydride described below are added so that either of them is charged in excess to obtain a polyamic acid intermediate having an amino group or a carboxylic anhydride active terminal on the terminal (STEP 1). Then, a phthalic anhydride derivative or an aniline derivative that have $R_1$ as a substituent is used as a terminal blocking agent to synthesize a polyimide precursor (STEP 2). Thereafter, thermal or chemical imidation can be performed (STEP 3) to synthesize the polymer of the component (A). The diamine compound or the tetracarboxylic anhydride used in the synthesis of the polyamic acid compound in STEP 1 and the phthalic anhydride derivative or the aniline derivative used in the terminal blocking in STEP 2 can be used alone, or can be used with two or more kinds thereof. These materials can be appropriately selected and combined depending on required characteristics. $W_1$, $W_2$, and $R_1$ in the following formulae are same as above.

(Diamine-Excess Condition)

STEP 1

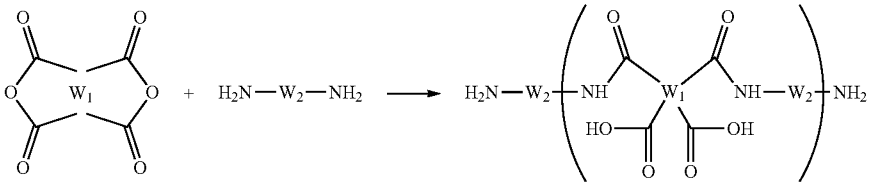

STEP 2

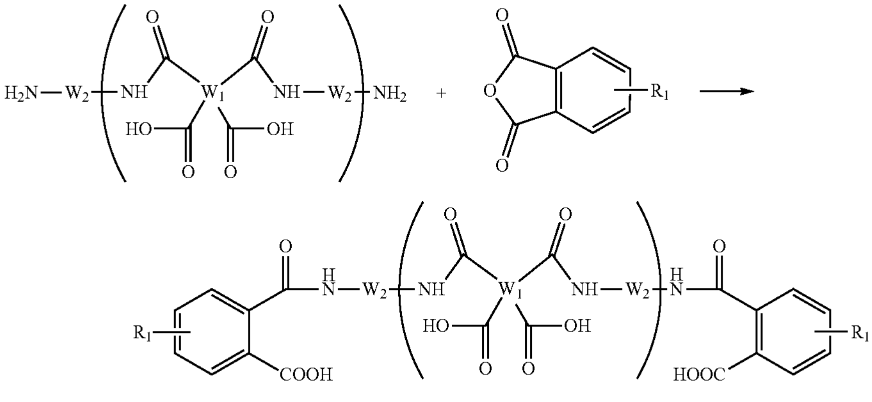

STEP 3

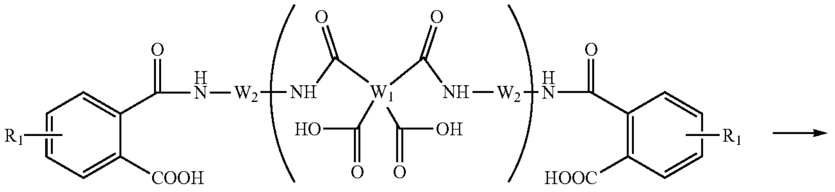

-continued

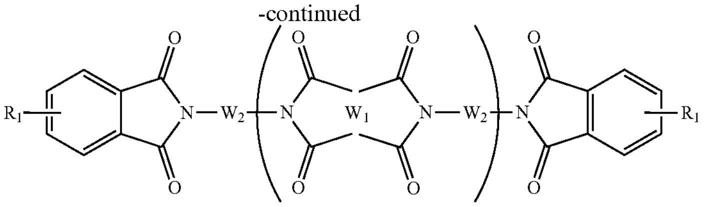

10

(Tetracarboxylic Acid-Excess Condition)

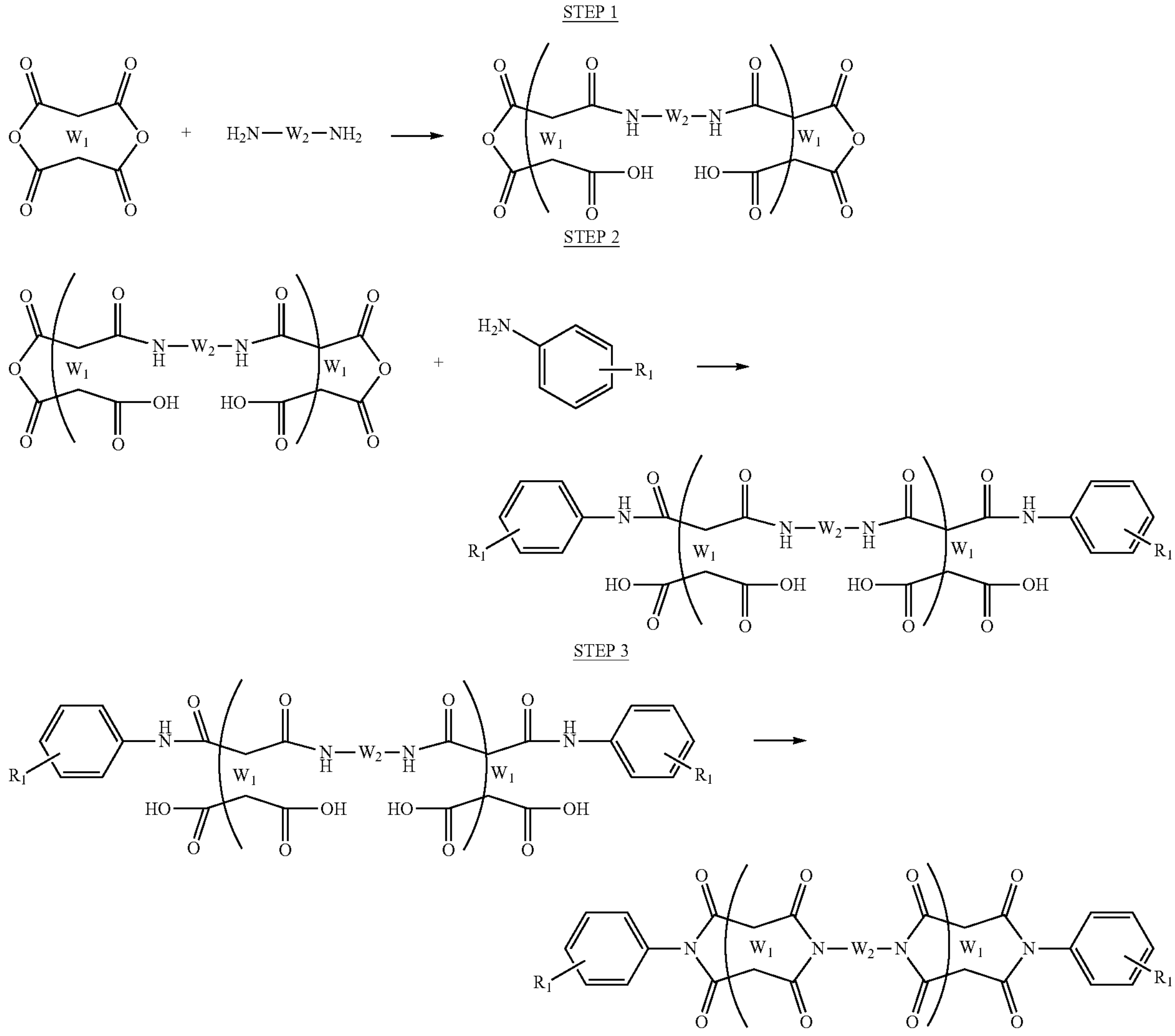

The synthesis of the polyamic acid intermediate represented in STEP 1 can be typically performed in an organic solvent at a room temperature or, as necessary, under cooling or heating. Examples of the used solvent include: alcohols, such as methanol, ethanol, isopropyl alcohol, butanol, ethylene glycol, propylene glycol, diethylene glycol, glycerol, ethylene glycol monomethyl ether, propylene glycol monomethyl ether, and propylene glycol monoethyl ether; ethers, such as diethyl ether, dibutyl ether, diethylene glycol diethyl ether, diethylene glycol dimethyl ether, tetrahydrofuran, and 1,4-dioxane; chlorine-based solvents, such as methylene chloride, chloroform, dichloroethane, and trichloroethylene; hydrocarbons, such as hexane, heptane, benzene, toluene, xylene, and cumene; nitriles, such as acetonitrile; ketones, such as acetone, ethyl methyl ketone, isobutyl methyl ketone, and cyclohexanone; esters, such as methyl acetate, ethyl acetate, n-butyl acetate, propylene glycol methyl ether acetate, and γ-butyrolactone; and aprotic polar solvents, such as N-methyl-2-pyrrolidone, N,N-dimethylacetamide, dimethyl sulfoxide, N,N-dimethylformamide, and hexamethylphosphoric triamide. These solvents can be used alone, or two or more kinds thereof can be mixed to use.

For these syntheses, a base catalyst can be used as necessary. Examples of the base catalyst include: inorganic base compounds, such as sodium hydrogen carbonate, sodium carbonate, potassium carbonate, calcium carbonate, cesium carbonate, sodium hydroxide, potassium hydroxide, sodium hydride, and potassium phosphate; and organic bases, such as triethylamine, diisopropylethylamine, N,N-dimethylaniline, pyridine, and 4-dimethylaminopyridine. These base catalysts may be used alone or in combination of two or more kinds thereof.

Examples of the synthetic method include: a method in which the diamine compound and the tetracarboxylic anhydride are collectively added into the solvent; a method in which each of or a mixture of the diamine compound and the tetracarboxylic anhydride is dispersed or dissolved to be added dropwise; and a method in which any one of the diamine compound and the tetracarboxylic anhydride is dispersed or dissolved in a solvent, and then the other one dispersed or dissolved in a solvent is added dropwise thereinto. When a plurality of kinds of each of the diamine compound and the tetracarboxylic anhydride is added, these materials may be previously mixed to be reacted, or may be separately and stepwise reacted. When the catalyst is used, examples of the method include: a method in which the catalyst is collectively added together with the diamine compound or the tetracarboxylic anhydride; and a method in which the catalyst is previously dispersed or dissolved, and then added dropwise. An addition ratio of the diamine compound and the tetracarboxylic anhydride can be regulated at any ratio so as to obtain a desired Mw range. For example, when the aniline derivative is used as the terminal blocking agent in the next step, the tetracarboxylic anhydride is used at an excess amount relative to the diamine compound. When the phthalic anhydride is used as the terminal blocking agent, the diamine compound is used at an excess amount relative to the tetracarboxylic anhydride to enable to synthesize the polyamide intermediate. The obtained reaction solution of the polyamic acid intermediate can be continuously subjected to the terminal blocking reaction of STEP 2, or can be diluted with an organic solvent and recovered as a powder with phase-separation washing or crystallization with a poor solvent in order to remove an unreacted raw material, catalyst, etc. present in the system as reaction intermediate.

In the terminal blocking step of STEP 2, the reaction liquid of the polyamic acid intermediate (when the intermediate is recovered as a powder, after previously dissolved) is reacted with the terminal blocking agent. The same reaction solvent and reaction catalyst as in the polyamic acid intermediate in STEP 1 can be used. The same reaction method as in STEP 1 can be used except that the polyamic acid intermediate and the aniline derivative or the phthalic anhydride as the terminal blocking agent are used as the substrate instead of the diamine compound and the tetracarboxylic anhydride. The obtained reaction solution of the polyimide intermediate can be continuously subjected to the imidation reaction of STEP 3, or can be diluted with an organic solvent and recovered as a powder with phase-separation washing or crystallization with a poor solvent in order to remove an unreacted raw material, catalyst, etc. present in the system as reaction intermediate.

The imidation step represented by STEP 3 can be performed by a thermal or chemical imidation. These methods can be appropriately selected depending on a thermal stability of the crosslinkable group of the target imide compound and a reactivity between an introduced substituent and a reagent used in the chemical imidation.

When the thermal imidation is performed, a solvent to form an azeotrope with water is added into the reaction liquid of the polyamic acid obtained in STEP 2 (when the intermediate is recovered as a powder, a solution previously dissolving the intermediate in a soluble solvent), and the mixture is heated to 100° C. to 250° C. to perform the imidation by a dehydrative ring-closing reaction with removing generated water.

As the solvent to form an azeotrope with water, esters such as γ-butyrolactone, polar solvents such as N-methyl-2-pyrrolidone, N,N-dimethylacetamide, dimethyl sulfoxide, and N,N-dimethylformamide, and non-porous solvents such as benzene, toluene, xylene, and mesitylene, etc. can be used. Single or mixed these solvents is preferably heated to proceed dehydration with removing the water generated by the ring-closing out of the system.

When the chemical imidation is performed, a base catalyst and an acid anhydride, etc. as a dehydrating agent are added into the reaction liquid of the polyimide precursor obtained in STEP 2 (when the intermediate is recovered as a powder, a solution previously dissolving the intermediate in a soluble solvent) and heated to perform the imidation.

Examples of the base catalyst used for the chemical imidation include pyridine, triethylamine, trimethylamine, tributylamine, and trioctylamine. Among these, pyridine is preferable because it has an appropriate basicity for proceeding the reaction. Examples of the dehydrating agent include acetic anhydride, trimellitic anhydride, pyromellitic anhydride, trifluoroacetic anhydride, polyphosphoric acid, phosphorus pentoxide, phosphorus pentachloride, and thionyl chloride. Acetic anhydride is preferable from the viewpoint of purification after the reaction. Each of the base catalyst and the dehydrating agent may be used alone, or two or more kinds thereof may be mixed to use. The imidation rate can be appropriately controlled by regulating an amount of the catalyst, an amount of the dehydrating agent, a reaction temperature, and a reaction time depending on the performance requirement of the target compound.

The solvent used therefor is not particularly limited as long as it is a solvent inert for the above reaction, and examples thereof include: ethers, such as diethylene glycol diethyl ether, diethylene glycol dimethyl ether, tetrahydrofuran, and 1,4-dioxane; chlorine-based solvents, such as methylene chloride, chloroform, dichloroethane, and trichloroethylene; hydrocarbons, such as hexane, heptane, benzene, toluene, xylene, and cumene; nitriles, such as acetonitrile; ketones, such as acetone, ethyl methyl ketone, isobutyl methyl ketone, and cyclohexanone; esters, such as methyl acetate, ethyl acetate, n-butyl acetate, propylene glycol methyl ether acetate, and γ-butyrolactone; and aprotic polar solvents, such as N-methyl-2-pyrrolidone, N,N-dimethylacetamide, dimethyl sulfoxide, N,N-dimethylformamide, and hexamethylphosphoric triamide. These solvents can be used alone, or two or more thereof can be mixed to use.

After the reaction, the reaction product can be used for the composition for forming a protective film as it is, or may be diluted with an organic solvent for removing an unreacted raw material, the catalyst, etc. present in the system and then recovered by phase separation washing.

The organic solvent used for the phase separation washing is not particularly limited as long as it can dissolve the compound and it can be separated into two phases when mixed with water. Examples of such organic solvents include: hydrocarbons, such as hexane, heptane, benzene, toluene, and xylene; esters, such as ethyl acetate, n-butyl acetate, and propylene glycol methyl ether acetate; ketones, such as methyl ethyl ketone, methyl amyl ketone, cyclohexanone, and methyl isobutyl ketone; ethers, such as diethyl ether, diisopropyl ether, methyl tert-butyl ether, and ethylcyclopentyl methyl ether; chlorine-based solvents, such as methylene chloride, chloroform, dichloroethane, and trichloroethylene; and a mixture thereof. As washing water used in this time, so-called deionized water or ultrapure water is typically used. The number of times for washing may be one or more, and preferably approximately one to five because even ten times or more of washing may not yield an expected effect.

To remove an unreacted raw material or an acidic component in the system, washing may be performed with a basic aqueous solution during the phase separation washing. Specific examples of the base include hydroxides of alkali metals, carbonate salts of alkali salts, hydroxides of alkali earth metals, carbonate salts of alkali earth metals, ammonia, and organic ammoniums.

Furthermore, to remove an unreacted raw material, a metal impurity, or a base component in the system, washing may be performed with an acidic aqueous solution during the phase separation washing. Specific examples of the acid include: inorganic acids, such as hydrochloric acid, hydrobromic acid, sulfuric acid, nitric acid, phosphoric acid, and heteropoly acids; and organic acids, such as oxalic acid, fumaric acid, maleic acid, trifluoroacetic acid, methanesulfonic acid, benzenesulfonic acid, p-toluenesulfonic acid, and trifluoromethanesulfonic acid.

The phase separation washing may be performed with either of the above basic aqueous solution and the acidic aqueous solution, or these washings may be performed in combination. The phase separation washing may be preferably performed with the basic aqueous solution and the acidic aqueous solution in this order from the viewpoint of removal of metal impurity.

After the phase separation washing with the above basic aqueous solution and the acidic aqueous solution, the separated phase may be subsequently washed with neutral water. The number of times for washing may be one or more, and preferably approximately one to five. As the neutral water, the above-described deionized water or ultrapure water may be used. The number of times for washing is one or more, but a fewer times may fail to remove the basic component and the acidic component. The number of times for washing is preferably approximately one to five because even ten times or more of washing may not yield an expected washing effect.

Although the reaction product after the phase separation operation can be recovered as a powder by evaporating the solvent to be dried under a reduced or normal pressure or by crystallization operation, the reaction product can be maintained as the solution state with an appropriate concentration to improve the operability of preparing the composition for forming a protective film. The concentration in this time is preferably 0.1 to 50 mass %, and more preferably 0.5 to 30 mass %. At such a concentration, the viscosity hardly increases to prevent impairing the operability. In addition, the solvent amount is not excessively increased, resulting in economical operation.

The solvent in this time is not particularly limited as long as it can dissolve the reaction product (the polymer of the component (A)). Specific examples thereof include: ketones, such as cyclohexanone and methyl 2-amyl ketone; alcohols, such as 3-methoxybutanol, 3-methyl-3-methoxybutanol, 1-methoxy-2-propanol, and 1-ethoxy-2-propanol; ethers, such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters, such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents can be used alone, or two or more kinds thereof can be mixed to use.

For the above polyimide synthesis, the diamine compound and the tetracarboxylic anhydride derivative that constitute the main chain of the polymer, the phthalic acid derivative and the aniline derivative that are used for the terminal blocking can be combined depending on the performance requirement. Specifically, a substituent that contributes to the solvent solubility, the adhesiveness, and the embedding/planarization ability; a substituent that contributes to the etching resistance and the film formability; a substituent that contributes to the resistance against an alkaline aqueous hydrogen peroxide; etc. can be introduced depending on the desired performance requirement. The composition for forming a protective film using these polymers can achieve all of the embedding/planarization ability, the heat resistance, and the resistance against an alkaline aqueous hydrogen peroxide at high levels.

As described above, the polymer of the component (A) provides the composition for forming a protective film having all of the heat resistance against 400° C. or higher, high embedding/planarization ability, and the resistance against an alkaline aqueous hydrogen peroxide.

In the present invention, the planarization ability is referred to an ability to planarize the substrate surface. As illustrated in, for example, FIG. 1, the inventive composition for forming a protective film can reduce a step of 100 nm to 30 nm or less on a substrate 1 by applying and heating a composition for forming a protective film 3' on the substrate 1 to form a protective film 3. The step shape illustrated in FIG. 1 describes a typical example of the step shape on the substrate for producing a semiconductor apparatus. The step shape on the substrate that can be planarized with the inventive composition for forming a protective film is of course not limited thereto.

<Composition for Forming Protective Film>

The present invention provides the composition for forming a protective film against an alkaline aqueous hydrogen peroxide, the composition comprising: (A) the above polymer or polymer mixture; and (B) the organic solvent. In the inventive composition for forming a protective film, the component (A) can be used alone or in combination of two or more kinds thereof.

Usable organic solvents for the inventive composition for forming a protective film are not particularly limited as long as they can dissolve the constitution components contained in the material, such as the above base polymer, an acid generator, a crosslinker, and other additives, described later. Specifically, solvents having a boiling point of lower than 180° C., such as solvents described in paragraphs (0091) to (0092) in JP 2007-199653 A, etc. can be used. Among these, propylene glycol monomethyl ether acetate, propylene glycol monomethyl ether, 2-heptanone, cyclopentanone, cyclohexanone, and a mixture of two or more kinds thereof are preferably used. A blending amount of the organic solvent is preferably 200 to 10,000 parts by mass, and more preferably 300 to 5,000 parts by mass, relative to 100 parts by mass of the component (A).

Such a composition for forming a protective film can be spin-applied, and has all of the heat resistance against 400° C. or higher, high embedding/planarization ability, and the resistance against an alkaline aqueous hydrogen peroxide since containing the above component (A).

Into the inventive composition for forming a protective film, a high boiling-point solvent having a boiling point of 180° C. or higher can be added in addition to the solvent having a boiling point of lower than 180° C., as the organic solvent (a mixture of the solvent having a boiling point of lower than 180° C. and the solvent having a boiling point of 180° C. or higher). The high boiling-point organic solvent is not particularly limited such as hydrocarbons, alcohols, ketones, esters, ethers, and chlorine-based solvents as long as the solvent can dissolve the component (A). Specific examples thereof include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butyl methyl ether, triethylene glycol dimethyl ether, triethylene glycol monomethyl ether, triethylene glycol n-butyl ether, triethylene glycol butyl methyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, and dibutyl adipate. These solvents may be used, or may be mixed to use.

The boiling point of the high boiling-point solvent is appropriately selected depending on a temperature at which the composition for forming a protective film is heat-treated. The boiling point of the added high boiling-point solvent is preferably 180° C. to 300° C., and further preferably 200° C. to 300° C. Such a boiling point has no risk of exceedingly fast evaporation during baking (heat treatment) due to exceedingly low boiling point, and yields the sufficient thermal flowability. In addition, such a boiling point eliminates the risk that a solvent with high boiling point remains in the film after baking without evaporation, and thereby has no risk of adverse effect on the film properties such as etching resistance.

When the high boiling-point solvent is used, a blending amount of the high boiling-point solvent is preferably 1 to 30 parts by mass relative to 100 parts by mass of the solvent having a boiling point of lower than 180° C. Such a blending amount has no risk of: failure to impart the sufficient thermal flowability during the baking due to exceedingly small blending amount; and remain of the solvent in the film leading to deterioration of the film properties such as etching resistance due to exceedingly large blending amount.

Such a composition for forming a protective film imparts the thermal flowability by adding the high boiling-point solvent into the above component (A), resulting in the composition for forming a protective film also having higher embedding/planarization properties.

<Component (A')>

Polymer (IV)

The inventive composition for forming a protective film can comprise, as a component (A'), a polymer (IV) having a repeating unit represented by the following general formula (4A) and a terminal group thereof being a group represented by the following general formula (2C), in addition to the above component (A), (4A)

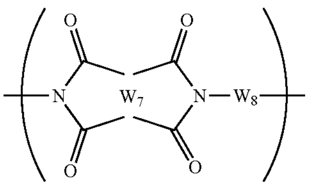

wherein $W_7$ represents a tetravalent organic group, and We represents a divalent organic group, and (2C)

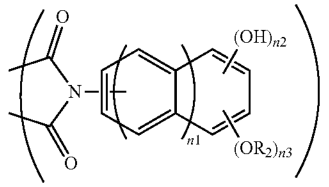

wherein $R_2$ represents a monovalent organic group having 1 to 10 carbon atoms, n1 represents an integer of 0 or 1, and n2 and n3 represent $1 \leq n2 \leq 6$ and $0 \leq n3 \leq 6$ and satisfy a relationship of $1 \leq n2+n3 \leq 6$.

A blending amount of the polymer (IV) is preferably 1 to 30 parts by mass, and more preferably 1 to 10 parts by mass, relative to 100 parts by mass of the component (A). Such a blending amount improves the adhesiveness to the substrate with the terminal hydroxy group without deteriorating the heat resistance, resulting in improvement of the resistance against an alkaline aqueous hydrogen peroxide.

The substituent represented by $OR_2$ can be appropriately selected depending on the usage. For example, $OR_2$ can be an alkyloxy group for imparting the flowability, and can be an alkenyloxy group or an alkynyloxy group for imparting curability in an inert gas. The polymer (IV) having the substituent represented by $OR_2$ can exhibit appropriate solvent solubility and, after cured, exhibit excellent solvent resistance and heat resistance.

Mw (weight-average molecular weight) of the above polymer (IV) is preferably 1000 to 10000, more preferably 1000 to 8000, and further preferably 1500 to 5000. In the present invention, the weight-average molecular weight can be a polystyrene-converted weight-average molecular weight (Mw) with gel permeation chromatography (GPC) using tetrahydrofuran as an eluent.

In the general formula (4A), specific examples of $W_7$ include the groups described as the specific examples of $W_1$.
In the general formula (4A), specific examples of We include the groups described as the specific examples of $W_2$.
The terminal group represented by the general formula (2C) include groups represented by the following structural formulae.
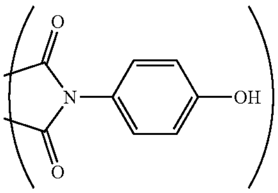
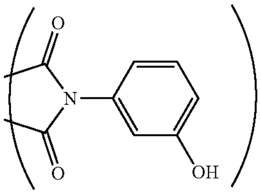
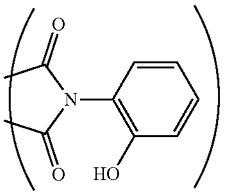
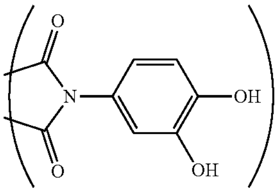
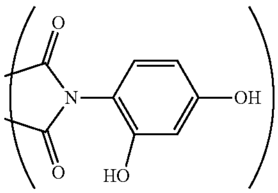
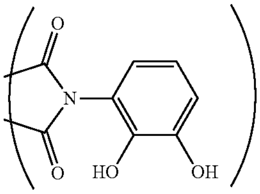
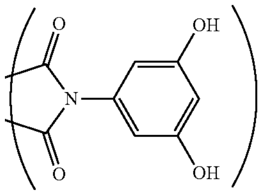
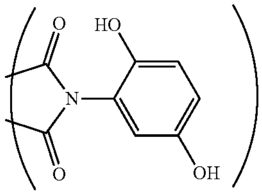
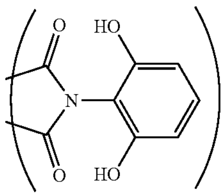
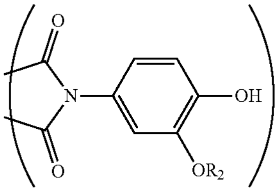
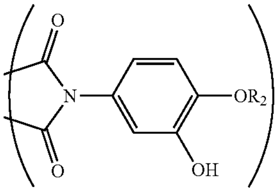
-continued
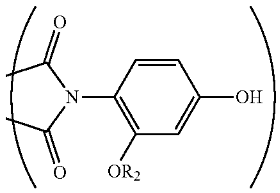
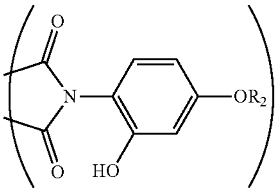
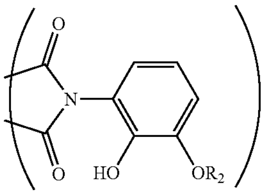
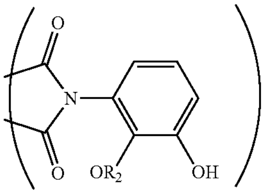
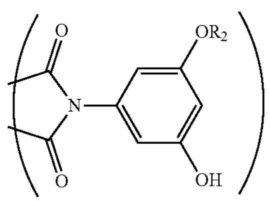
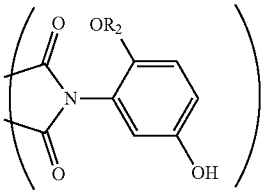
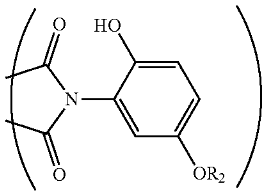
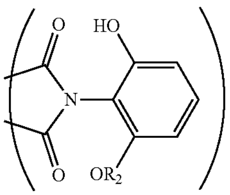
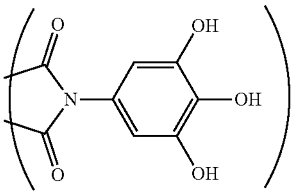
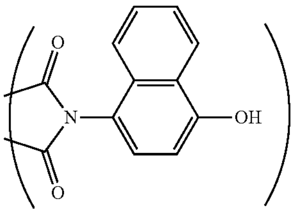
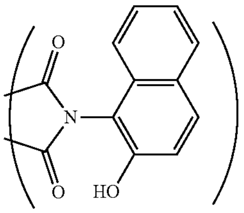
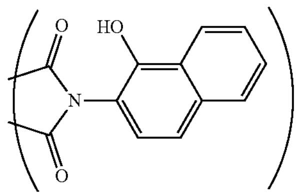
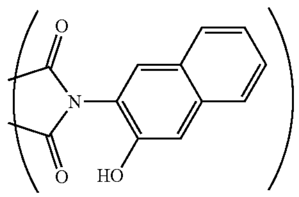

-continued

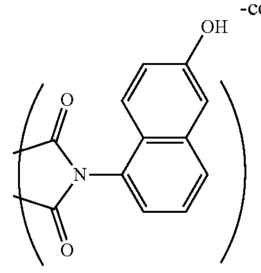

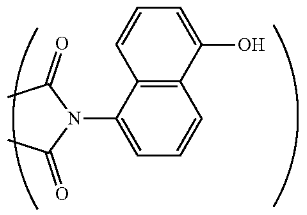

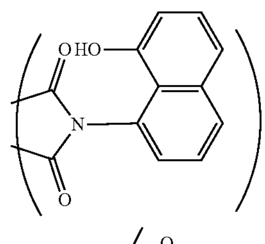

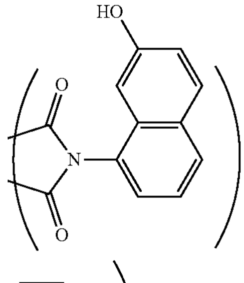

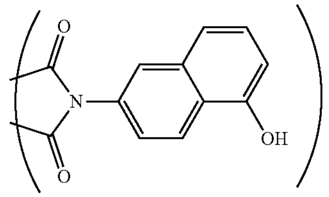

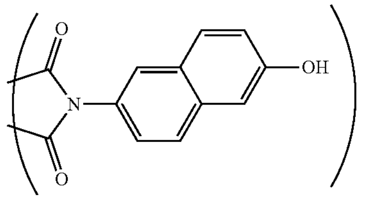

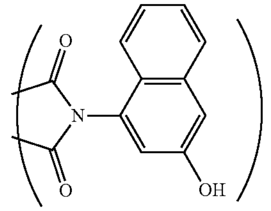

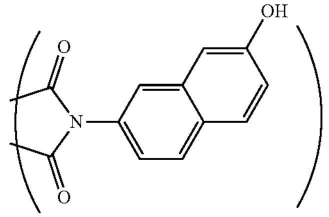

The polymer (IV) can also be produced by the same method as the method for producing the above polymer (A).

In the inventive composition for forming a protective film, (C) an acid generator can be added to further promote the curing reaction. The acid generator includes a material to generate an acid by pyrolysis and a material to generate an acid by light irradiation, and any of them can be added. Specifically, materials described in paragraphs (0061) to (0085) in JP 2007-199653 A can be added, but are not limited thereto.

The acid generator can be used alone or in combination of two or more kinds thereof. When the acid generator is added, the addition amount is preferably 0.05 to 50 parts, and more preferably 0.1 to 10 parts, relative to 100 parts of the component (A).

In the inventive composition for forming a protective film, (D) a surfactant can be added to improve applicability with spin-coating. For example, materials described in paragraphs (0142) to (0147) in JP 2009-269953 A can be used as the surfactant. When the surfactant is used, the addition amount is preferably 0.01 to 10 parts by mass, and more preferably 0.05 to 5 parts by mass, relative to 100 parts by mass of the component (A).

In the inventive composition for forming a protective film, (E) a crosslinker can be added to improve the curability and to further inhibit intermixing with the upper layer film. The crosslinker is not particularly limited, and known various types of crosslinkers can be widely used. An example of the crosslinker includes a melamine-based crosslinker, a glycoluril-based crosslinker, a benzoguanamine-based crosslinker, a urea-based crosslinker, a β-hydroxyalkylamide-based crosslinker, an isocyanurate-based crosslinker, an aziridine-based crosslinker, an oxazoline-based crosslinker, or epoxy-based crosslinker.

Specific examples of the melamine-based crosslinker include hexamethoxymethylated melamine, hexabutoxymethylated melamine, alkoxy- and/or hydroxy-substituted derivatives of the melamines, and partially self-condensed products thereof. Specific examples of the glycoluril-based crosslinker include tetramethoxymethylated glycoluril, tetrabutoxymethylated glycoluril, alkoxy- and/or hydroxy-substituted derivatives of the glycolurils, and partially self-condensed products thereof. Specific examples of the benzoguanamine-based crosslinker include tetramethoxymethylated benzoguanamine, tetrabutoxymethylated benzoguanamine, alkoxy- and/or hydroxy-substituted derivatives of the benzoguanamines, and partially self-condensed products thereof. Specific examples of the urea-based crosslinker include dimethoxymethylated dimethoxyethylene urea, alkoxy- and/or hydroxy-substituted derivatives of the ureas, and partially self-condensed products thereof. Specific examples of the β-hydroxyalkylamide-based crosslinker include N,N,N',N'-tetra(2-hydroxyethyl)adipic amide. Specific examples of the isocyanurate-based crosslinker include triglycidylisocyanurate and triallylisocyanurate. Specific examples of the aziridine-based crosslinker include 4,4'-bis(ethyleneiminocarbonylamino)diphenylmethane and 2,2-bishydroxymethylbutanol-tris[3-(1-azirlidinyl)propionate]. Specific examples of the oxazoline-based crosslinker include 2,2'-isopropylidinebis(4-benzyl-2-oxazoline), 2,2'-isopropylidenebis(4-phenyl-2-oxazoline), 2,2'-methylenebis-4,5-diphenyl-2-oxazoline, 2,2'-metylenebis-4-phenyl-2-oxazoline, 2,2'-methylenebis-4-tert-butyl-2-oxazoline, 2,2'-bis(2-oxazoline), 1,3-phenylenebis(2-oxazoline), 1,4-phenylenebis(2-oxazoline), and 2-isopropenyloxazoline copolymer. Specific examples of the epoxy-based crosslinker include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, and pentaerythritol tetraglycidyl ether. When the crosslinker is added, the addition amount is preferably 1 to 100 parts by mass, and more preferably 5 to 50 parts by mass, relative to 100 parts by mass of the component (A).

In the inventive composition for forming a protective film, (F) a plasticizer can be added to further improve the planarization/embedding ability. The plasticizer is not particularly limited, and known various types of plasticizers can be widely used. An example of the plasticizer includes: low molecular-weight compounds such as phthalate esters, adipate esters, phosphate esters, trimellitate esters, and citrate esters; and polymers such as polyether polymers, polyester polymers, and polyacetal polymers described in JP 2013-253227 A. When the plasticizer is used, the addition amount is preferably 1 to 100 parts by mass, and more preferably 5 to 50 parts by mass, relative to 100 parts by mass of the component (A).

In the inventive composition for forming a protective film, preferably used as additives for imparting the embedding/planarization ability similar to the plasticizer are: liquid additives having a polyethylene glycol structure or a polypropylene glycol structure; or a polymer with pyrolyzing property having a weight reducing rate from 30° C. to 250° C. of 40 mass % or more and having a weight-average molecular weight of 300 to 200,000, for example. This polymer with pyrolyzing property preferably has a repeating unit having an acetal structure represented by the following general formula (DP1) or (DP1a). When the liquid additive or the polymer with pyrolyzing property is used, the addition amount is preferably 1 to 100 parts by mass, and more preferably 5 to 50 parts by mass, relative to 100 parts by mass of the component (A).

(D P 1)

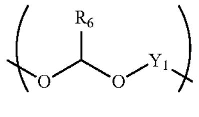

In the formula, $R_6$ represents a hydrogen atom or a saturated or unsaturated monovalent organic group having 1 to 30 carbon atoms and optionally having a substituent. $Y_1$ represents a saturated or unsaturated divalent organic group having 2 to 30 carbon atoms.

(DP1a)

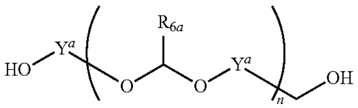

In the formula, $R_{6a}$ represents an alkyl group having 1 to 4 carbon atoms. $Y^a$ represents a saturated or unsaturated divalent hydrocarbon group having 4 to 10 carbon atoms and optionally having an ether bond. "n" represents an average number of the repeating units, and is 3 to 500.

The inventive composition for forming a protective film preferably provides a protective film exhibiting a resistance against an ammonia-containing aqueous hydrogen peroxide. Such a composition for forming a protective film can form a protective film having the good resistance against an alkaline aqueous hydrogen peroxide, and thereby the composition can be applied to a wet etching process using the alkaline aqueous hydrogen peroxide.

The alkaline aqueous hydrogen peroxide is commonly used for washing semiconductor wafers. In particular, a mixed liquid of 5 parts by mass of deionized water, 1 part by mass of a 29 mass % aqueous ammonia, and 1 part by mass of a 30 mass % aqueous hydrogen peroxide is referred to as SC1 (Standard Clean-1), and is a standard chemical reagent for washing and removing organic impurities and fine particles on a wafer surface. In addition, the alkaline aqueous hydrogen peroxide can remove or etch-process some metals, some metal compounds, and a silicon-containing resist intermediate film designed for wet removing. A composition of the alkaline aqueous hydrogen peroxide used for these processes is not particularly limited, and is typically a mixture of deionized water, hydrogen peroxide, and ammonia. In this case, a concentration of hydrogen peroxide is preferably 0.1 to 10 mass %, and more preferably 0.2 to 5 mass %. A concentration of ammonia is preferably 0.1 to 10 mass %, and more preferably 0.2 to 5 mass %. The treatment temperature is preferably 0 to 90° C., and more preferably 20 to 80° C.

Here, a resistance test of the protective film against the alkaline aqueous hydrogen peroxide will be described. First, the composition for forming a protective film is applied to form a film having a thickness of approximately 100 nm on a silicon wafer cut in 3-cm square in accordance with the film-forming condition, described later. This wafer specimen is immersed in a 1.0 mass % aqueous hydrogen peroxide containing 0.5 mass % ammonia at 70° C. for 5 minutes. Then, the wafer specimen is rinsed with deionized water, and then presence/absence of removal of the protective film from the wafer can be visually observed. When a part or all of the protective film is removed to expose the silicon wafer surface, the tested protective film is judged to have insufficient resistance against the alkaline aqueous hydrogen peroxide.

That is, with the protective film formed with the inventive composition for forming a protective film, no removal of the above protective film is preferably observed when the silicon substrate on which the protective film is formed is immersed in a 1.0 mass % aqueous hydrogen peroxide containing 0.5 mass % of ammonia at 70° C. for 5 minutes.

As described above, the inventive composition for forming a protective film is the composition for forming a protective film having all of the heat resistance against 400° C. or higher, the high embedding/planarization ability, and the resistance against an alkaline aqueous hydrogen peroxide. Therefore, the inventive composition for forming a protective film is extremely useful as a composition for forming a protective film of the multilayer resist method such as: a two-layer resist method; a three-layer resist method using a silicon-containing resist intermediate film or a silicon-containing inorganic hard mask; and a four-layer resist method using a silicon-containing resist intermediate film or using a silicon-containing inorganic hard mask and an organic anti-reflection film. In addition, the inventive composition for forming a protective film has excellent embedding/planarization ability even with film formation in an inert gas without byproduct generation, and thereby it can be suitably used for a planarization material in semiconductor apparatus manufacturing processes other than the multilayer resist method. Furthermore, the inventive composition for forming a protective film is extremely useful for a method for forming a pattern using a wet etching process.

<Substrate for Producing Semiconductor Apparatus>

The present invention provides a substrate for producing a semiconductor apparatus, comprising: a substrate; and a protective film formed on the substrate, the protective film being a cured material of the above composition for forming a protective film.

The protective film being a cured material of the inventive composition for forming a protective film also has the high embedding/planarization ability to be a protective film having no micropore due to failure of embedding nor roughness on the protective film surface due to insufficient planarization. Such a substrate for producing a semiconductor apparatus planarized with the protective film has a wide process latitude during patterning, and enables to produce semiconductor apparatuses with a high yield. Furthermore, since having the resistance against an alkaline aqueous hydrogen peroxide, the protective film also has high compatibility to a wet etching process.

<Method for Forming Protective Film>

Although a heating film-forming step for forming the protective film can apply a one-step baking or multistep baking such as two-step baking or three-step baking, the one-step baking or the two-step baking is economically preferable. The film formation with the one-step baking is performed within a range at a temperature of 100° C. or higher and 600° C. or lower for 5 to 3600 seconds, for example, and preferably performed within a range at a temperature of 150° C. or higher and 500° C. or lower for 10 to 7200 seconds. The heat treatment performed under such a condition can promote the planarization with thermal flow and the crosslinking reaction. In the multilayer resist method, a coating-type silicon intermediate film or a CVD hard mask may be formed on this obtained film. When the coating-type silicon intermediate film is applied, the film formation is preferably performed at a temperature higher than a temperature at which the silicon intermediate film is formed. The silicon intermediate film is typically formed at 100° C. or higher and 400° C. or lower, preferably 150° C. or higher and 350° C. or lower. When the protective film is formed at a temperature higher than this temperature, dissolution of the protective film with a composition for forming the silicon intermediate film can be prevented, and the protective film not mixing with the composition can be formed.

When the CVD hard mask is applied, the protective film is preferably formed at a temperature higher than a temperature at which the CVD hard mask is formed. Examples of the temperature at which the CVD hard mask is formed include a temperature of 150° C. or higher and 500° C. or lower.

Meanwhile, the first step baking of the film formation with the two-step baking is performed within a range of, for example, at 300° C. or lower, preferably 250° C. or lower as an upper limit of the treatment temperature in the air, for 10 to 600 seconds considering an effect of substrate corrosion due to oxygen in the air. The second baking is preferably performed within a range at a temperature higher than the first baking temperature and equal to or lower than 600° C., preferably equal to or lower than 500° C., for 10 to 7200 seconds. In the multilayer resist method, a coating-type silicon intermediate film or a CVD hard mask may be formed on this obtained film. When the coating-type silicon intermediate film is applied, the film formation is preferably performed at a temperature higher than a temperature at which the silicon intermediate film is formed. The silicon intermediate film is typically formed at 100° C. or higher and 400° C. or lower, preferably 150° C. or higher and 350° C. or lower. When the protective film is formed at a temperature higher than this temperature, dissolution of the protective film with a composition for forming the silicon intermediate film can be prevented, and the protective film not mixing with the composition can be formed.

When the CVD hard mask is applied in the two-step baking, the protective film is preferably formed at a temperature higher than a temperature at which the CVD hard mask is formed. Examples of the temperature at which the CVD hard mask is formed include a temperature of 150° C. or higher and 500° C. or lower.

The present invention provides a method for forming a protective film used in the semiconductor apparatus manufacturing process, wherein a substrate to be processed is heat-treated under an atmosphere at an oxygen concentration of 1% or less to form a cured film in order to prevent corrosion of the substrate to be processed.

In this method for forming a protective film, for example, the above inventive composition for forming a protective film is firstly spin-applied on the substrate to be processed. After the spin-applying, when the two-step baking is performed, the substrate is firstly baked in the air at 300° C. or lower, and then secondly baked under an atmosphere at an oxygen concentration of 1% or less. When the one-step baking is performed, the first baking in the air is skipped. Examples of the atmosphere during the baking include inert gasses, such as nitrogen, argon, and helium. The inventive composition for forming a protective film can form a sufficiently cured protective film even when calcined under such an inert gas atmosphere without sublimate generation.

For the inventive method for forming a protective film, a substrate to be processed having a structure or step with 30 nm or more in height can be used. As described above, the inventive composition for forming a protective film has excellent embedding/planarization ability, and thereby a plane cured film can be formed even in the presence of a structure or step (roughness) with 30 nm or more in height on the substrate to be processed. That is, the inventive method for forming a protective film is particularly useful when a plane protective film is formed on such a substrate to be processed.

Although being appropriately selected, a thickness of the protective film to be formed is preferably 30 to 20,000 nm, and particularly preferably 50 to 15,000 nm.

The above method for forming a protective film can be applied to both cases where a protective film for a pattern is formed by using the inventive composition for forming a protective film and where a protective film for a planarization film is formed by using the inventive composition for forming a protective film.

The present invention provides a method for forming a protective film applied in a semiconductor apparatus manufacturing process, the method comprising: spin-applying the above composition for forming a protective film on a substrate to be processed; and obtaining a cured film by heat-treating the substrate to be processed on which the composition for forming a protective film is applied under an inert gas atmosphere at a temperature of 50° C. or higher and 600° C. or lower within a range of 10 seconds to 7200 seconds.

The present invention also provides a method for forming a protective film applied in a semiconductor apparatus manufacturing process, the method comprising: spin-applying the above composition for forming a protective film on a substrate to be processed; forming an applied film by heat-treating the substrate to be processed on which the composition for forming a protective film is applied in air at a temperature of 50° C. or higher and 250° C. or lower within a range of 5 seconds to 600 seconds, preferably 10 to 600 seconds; and subsequently obtaining a cured film by heat-treating the applied film under an inert gas atmosphere at a temperature of 200° C. or higher and 600° C. or lower, preferably 250° C. or higher, within a range of 10 seconds to 7200 seconds.

The protective film formed by the inventive method and applied in the semiconductor apparatus manufacturing process has high heat resistance and high embedding/planarization ability, and thereby improves the yield of the semiconductor apparatuses when used in the semiconductor apparatus manufacturing process.

In the method for forming a protective film, the above inventive composition for forming a protective film is firstly spin-applied on the substrate to be processed (spin coating). Using a spin-coating method can yield the good embedding ability. After the spin-applying, baking (heat treatment) is performed to promote the planarization with the thermal flow and the crosslinking reaction. Since this baking can evaporate the solvent in the composition for forming a protective film, mixing can be prevented even when the resist upper layer film or the silicon-containing resist intermediate film is formed on the protective film.

<Method for Forming Pattern>

[Three-Layer Resist Method Using Silicon-Containing Resist Intermediate Film]

The present invention provides a method for forming a pattern on a substrate to be processed, the method comprising:

(I-1) a step of forming a protective film on the substrate to be processed using the above composition for forming a protective film;

(I-2) a step of forming a silicon-containing resist intermediate film on the protective film using a silicon-containing resist intermediate film material;

(I-3) a step of forming a resist upper layer film on the silicon-containing resist intermediate film using a photoresist composition;

(I-4) a step of forming a circuit pattern in the resist upper layer film;

(I-5) a step of transferring the pattern to the silicon-containing resist intermediate film by etching with the resist upper layer film in which the pattern is formed as a mask;

(I-6) a step of transferring the pattern to the protective film by etching with the silicon-containing resist intermediate film in which the pattern is transferred as a mask; and (I-7) a step of forming a pattern on the substrate to be processed with the protective film in which the pattern is transferred as a mask.

Preferably used as the substrate to be processed is a semiconductor apparatus substrate or a substrate in which any of a metal film, a metal carbide film, a metal oxide film, a metal nitride film, a metal oxycarbide film, and a metal oxynitride film is formed on the semiconductor apparatus substrate. More specifically, a substrate such as Si, α-Si, p-Si, $SiO_2$, SiN, SiON, W, TiN, and Al; or a substrate in which a film of the above metal, etc. is formed as a layer to be processed on the substrate, etc. are used, but not limited thereto.

As the layer to be processed, various Low-k films such as Si, $SiO_2$, SiON, SiN, p-Si, α-Si, W, W—Si, Al, Cu, and Al—Si; and their stopper films are used. The layer can be formed so as to have a thickness of typically 50 to 10,000 nm, particularly 100 to 5,000 nm. When the layer to be processed is formed, the used substrate and the layer to be processed have different material.

The metal constituting the substrate to be processed is preferably silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof.

As the substrate to be processed, a substrate to be processed having a structure or step with 30 nm or more in height is preferably used.

When the protective film is formed on the substrate to be processed by using the inventive composition for forming a protective film, the above inventive method for forming a protective film is applied.

Then, the resist intermediate film material containing a silicon atom is used to form the resist intermediate film (silicon-containing resist intermediate film) on the protective film. As the silicon-containing resist intermediate film material, a polysiloxane-based intermediate film material is preferable. Imparting an anti-reflective effect to the silicon-containing resist intermediate film can inhibit reflection. In particular, using a material for the composition for forming a protective film for 193-nm exposure containing a large amount of aromatic groups and having high etching selectivity to the substrate increases the k-value to increase reflection on the substrate. However, the silicon-containing resist intermediate film having the absorption so as to have an appropriate k-value can inhibit the reflection, resulting in the substrate reflection of 0.5% or less. Preferably used for the silicon-containing resist intermediate film having the anti-reflection effect is a polysiloxane having anthracene for 248-nm or 157-nm exposure, or a phenyl group or a light absorption group with a silicon-silicon bond for 193-nm exposure, in the pendant structure or polysiloxane structure, the polysiloxane being crosslinkable with acid or heat.

Then, the resist upper layer film is formed on the silicon-containing resist intermediate film by using the resist upper layer film material composed of the photoresist composition. The resist upper layer film material may be any of positive-type or negative-type, and a material same as commonly used photoresist compositions can be used. After the resist upper layer film material is spin-applied, the pre-baking is preferably performed within a range at 60 to 180° C. for 10 to 300 seconds. Thereafter, the exposure, then post exposure bake (PEB), and development are performed in accordance with the common method to obtain the resist upper layer film pattern. The thickness of the resist upper layer film is not particularly limited, and preferably 30 to 500 nm, particularly preferably 50 to 400 nm.

Then, the circuit pattern (resist upper layer film pattern) is formed in the resist upper layer film. The circuit pattern is preferably formed by lithography using light having a wavelength of 10 nm or more and 300 nm or less, direct drawing with electron beam, nanoimprinting, or a combination thereof.

Examples of the exposure light include a high-energy ray having a wavelength of 300 nm or less, specifically far ultraviolet ray, KrF excimer laser light (248 nm), ArF excimer laser light (193 nm), $F_2$ laser light (157 nm), $Kr_2$ laser light (146 nm), $Ar_2$ laser light (126 nm), soft X-ray with 3 to 20 nm (EUV), electron beam (EB), ion beam, and X-ray.

In the circuit pattern formation, the circuit pattern is preferably developed with an alkaline development or an organic solvent.

Then, the pattern is transferred to the silicon-containing resist intermediate film by etching with the resist upper layer film in which the circuit pattern is formed as a mask. The etching of the silicon-containing resist intermediate film with the resist upper layer film pattern as a mask is preferably performed by using a fluorocarbon-based gas. This etching forms the silicon-containing resist intermediate film pattern.

Then, the pattern is transferred to the protective film by etching with the silicon-containing resist intermediate film in which the pattern is transferred as a mask. Since the silicon-containing resist intermediate film has higher etching resistance against oxygen gas or hydrogen gas than organic materials, the etching of the protective film with the silicon-containing resist intermediate film pattern as a mask is preferably performed by using an etching gas mainly composed of oxygen gas or hydrogen gas. This etching can form the protective film pattern.

Then, the pattern is formed on the substrate to be processed with the protective film in which the pattern is transferred as a mask. For example, the pattern is transferred to the substrate to be processed by etching with the protective film in which the pattern is transferred as a mask. The subsequent etching of the substrate to be processed (layer to be processed) can be performed by a common method. For example, when the substrate to be processed is $SiO_2$-based, SiN-based, or silica-based low dielectric-constant insulative film, etching is performed mainly using a fluorocarbon-based gas. When the substrate to be processed is p-Si, Al, or W, etching is performed mainly using a chlorine-based or bromine-based gas. When the substrate is processed by etching using the fluorocarbon-based gas, the silicon-containing resist intermediate film pattern is simultaneously removed with the substrate processing. Meanwhile, when the substrate is processed by etching using the chlorine-based or bromine-based gas, a dry-etching removal using the fluorocarbon-based gas is required to be separately performed in order to remove the silicon-containing resist intermediate film pattern after the substrate processing.

The protective film obtained by using the inventive composition for forming a protective film has excellent etching resistance during the above etching of the substrate to be processed.

[Four-Layer Resist Method Using Silicon-Containing Resist Intermediate Film and Organic Anti-Reflection Film]

The present invention provides a method for forming a pattern on a substrate to be processed, the method comprising:

(II-1) a step of forming a protective film on the substrate to be processed using the above composition for forming a protective film;

(II-2) a step of forming a silicon-containing resist intermediate film on the protective film using a silicon-containing resist intermediate film material;

(II-3) a step of forming an organic anti-reflection film on the silicon-containing resist intermediate film;

(II-4) a step of forming a resist upper layer film on the organic anti-reflection film using a photoresist composition to form a four-layer film structure and forming a circuit pattern in a resist upper layer film;

(II-5) a step of transferring the pattern to the organic anti-reflection film and the silicon-containing resist intermediate film by etching with the resist upper layer film in which the pattern is formed as a mask;

(II-6) a step of transferring the pattern to the protective film by etching with the silicon-containing resist intermediate film in which the pattern is transferred as a mask; and (II-7) a step of forming a pattern on the substrate to be processed with the protective film in which the pattern is transferred as a mask.

This method can be performed in the same manner as the above three-layer resist method using the silicon-containing resist intermediate film except that the organic anti-reflection film (BARC) is formed between the silicon-containing resist intermediate film and the resist upper layer film.

The organic anti-reflection film can be formed with spin-coating by using a known organic anti-reflection film material.

[Three-Layer Resist Method Using Inorganic Hard Mask]

The present invention provides a method for forming a pattern on a substrate to be processed, the method comprising:

(III-1) a step of forming a protective film on the substrate to be processed using the above composition for forming a protective film;

(III-2) a step of forming an inorganic hard mask selected from a silicon oxide film, a silicon nitride film, a silicon oxynitride film, a titanium oxide film, and a titanium nitride film on the protective film;

(III-3) a step of forming a resist upper layer film on the inorganic hard mask using a photoresist composition;

(III-4) a step of forming a circuit pattern in the resist upper layer film;

(III-5) a step of transferring the pattern to the inorganic hard mask by etching with the resist upper layer film in which the pattern is formed as a mask;

(III-6) a step of transferring the pattern to the protective film by etching with the inorganic hard mask in which the pattern is transferred as a mask; and (III-7) a step of forming a pattern on the substrate to be processed with the protective film in which the pattern is transferred as a mask.

This method can be performed in the same manner as the above three-layer resist method using the silicon-containing resist intermediate film except that the inorganic hard mask is formed on the protective film instead of the silicon-containing resist intermediate film.

The inorganic hard mask selected from a silicon oxide film, a silicon nitride film, and a silicon oxynitride film (SiON film) can be formed by the CVD method, the ALD method, etc. The method for forming the silicon nitride film are described in, for example, JP 2002-334869 A, WO 2004/066377, etc. The film thickness of the inorganic hard mask is preferably 5 to 200 nm, and more preferably 10 to 100 nm. As the inorganic hard mask, the SiON film, which is highly effective as the anti-reflection film, is most preferably used. Since the substrate temperature during the SiON film formation reaches 300 to 500° C., the underlayer film is required to withstand the temperature of 300 to 500° C. The protective film formed by using the inventive composition for forming a protective film has high heat resistance and can withstand the high temperature of 300° C. to 500° C., and thereby the inorganic hard mask formed by the CVD method or the ALD method and the protective film formed by spin-coating method can be combined.

[Four-Layer Resist Method Using Inorganic Hard Mask and Organic Anti-Reflection Film]

The present invention provides a method for forming a pattern on a substrate to be processed, the method comprising:

(IV-1) a step of forming a protective film on the substrate to be processed using the above composition for forming a protective film;

(IV-2) a step of forming an inorganic hard mask selected from a silicon oxide film, a silicon nitride film, a silicon oxynitride film, a titanium oxide film, and a titanium nitride film on the protective film;

(IV-3) a step of forming an organic anti-reflection film on the inorganic hard mask;

(IV-4) a step of forming a resist upper layer film on the organic anti-reflection film using a photoresist composition to form a four-layer film structure and forming a circuit pattern in the resist upper layer film;

(IV-5) a step of transferring the pattern to the organic anti-reflection film and the inorganic hard mask by etching with the resist upper layer film in which the pattern is formed as a mask;

(IV-6) a step of transferring the pattern to the protective film by etching with the inorganic hard mask in which the pattern is transferred as a mask; and (IV-7) a step of forming a pattern on the substrate to be processed with the protective film in which the pattern is transferred as a mask.

This method can be performed in the same manner as the above three-layer resist method using the inorganic hard mask except that the organic anti-reflection film (BARC) is formed between the inorganic hard mask and the resist upper layer film.

In particular, when the SiON film is used as the inorganic hard mask, the reflection can be inhibited by the two anti-reflection films of the SiON film and the BARC even in the immersion exposure having high NA of more than 1.0. Another merit of forming the BARC is an effect of reducing bottom footing of the resist upper layer film pattern just on the SiON film.

Here, an example of the method for forming a pattern according to the inventive three-layer resist method will be described in FIGS. 2(A) to (F). In the three-layer resist method, as illustrated in FIG. 2(A), a protective film 3 is formed on a layer 2 to be processed formed on a substrate 1 by using the inventive composition for forming a protective film, then a silicon-containing resist intermediate film 4 is formed, and a resist upper layer film 5 is formed thereon. Then, as illustrated in FIG. 2(B), an exposure portion 6 in the resist upper layer film 5 is exposed, and post exposure bake (PEB) is performed. Thereafter, as illustrated in FIG. 2(C), development is performed to form a resist upper layer film pattern 5*a*. Subsequently, as illustrated in FIG. 2(D), the silicon-containing resist intermediate film 4 is dry-etch-processed with the resist upper layer film pattern 5*a* as a mask by using a fluorocarbon-based gas to form a silicon-containing resist intermediate film pattern 4*a*. Then, as illustrated in FIG. 2(E), the resist upper layer film pattern 5*a* is removed, and then the protective film 3 is etched by oxygen plasma with the silicon-containing resist intermediate film pattern 4*a* as a mask to form a protective film pattern 3*a*. Furthermore, as illustrated in FIG. 2(F), the silicon-containing resist intermediate film pattern 4*a* is removed, and then the layer 2 to be processed is etch-processed with the protective film pattern 3*a* as a mask to form a pattern 2*a*.

When the inorganic hard mask is formed, the silicon-containing resist intermediate film 4 is changed to the inorganic hard mask. When the BARC is formed, the BARC is formed between the silicon-containing resist intermediate film 4 and the resist upper layer film 5. The BARC may be subsequently etched prior to the etching of the silicon-containing resist intermediate film 4. Alternatively, only the BARC may be etched, and then the etching machine is changed, etc. to etch the silicon-containing resist intermediate film 4.

(Special Processing)

Applying the inventive method for forming a pattern enables to construct various special processes in addition to the above common processes, resulting in high industrial value.

(First Aspect)

Removing the silicon-containing resist intermediate film commonly requires dry-etching removal, as described above. Meanwhile, in the inventive method for forming a pattern, the protective film has the resistance against an alkaline aqueous hydrogen peroxide, and thereby wet-removing only the silicon-containing resist intermediate film using the alkaline aqueous hydrogen peroxide may be a choice. That is, the inventive method for forming a pattern with the three-layer resist process may further comprises, after the (I-6) step or the (II-6) step, a step of removing the silicon-containing resist intermediate film in which the pattern is transferred by wet-etching using the alkaline aqueous hydrogen peroxide.

(Second Aspect)

When the substrate to be processed is W, TiN, etc., wet-etch processing the substrate with the alkaline aqueous hydrogen peroxide may be a choice by applying the inventive method for forming a pattern. That is, in the inventive method for forming a pattern with the three-layer or four-layer resist process, the etching method of the (I-7) step, the (II-7) step, the (III-7) step, or the (IV-7) step may be a step of transferring the pattern to the substrate to be processed by wet-etching with the protective film in which the pattern is transferred as a mask using the alkaline aqueous hydrogen peroxide.

As an example of the process in this case, the protective film is firstly formed on the substrate to be processed, the silicon-containing resist intermediate film is formed thereon as necessary, and then the resist upper layer film is formed. Subsequently, the resist upper layer film is patterned by a common method, and subsequently the pattern is transferred to the protective film by etching. Finally, the substrate to be processed can be patterned by wet etching with the protective film as a mask.

(Third Aspect)

In the inventive method for forming a pattern with the three-layer or four-layer resist process, the (I-7) step, the (II-7) step, the (III-7) step, or the (IV-7) step may be a step of pattern-processing the substrate to be processed by implanting ions with the protective film in which the pattern is transferred as a mask. In this time, after the step of pattern-processing the substrate to be processed by implanting ions, a step of removing the silicon-containing resist intermediate film in which the pattern is transferred by wet etching using an alkaline aqueous hydrogen peroxide may be further added.

The inventive method for forming a pattern is also suitable for processing a stepped substrate having a structure or step with 30 nm or more in height. Hereinafter, an example of such a process will be described.

First, the protective film is formed on the stepped substrate to perform embedding and planarization, the silicon-containing resist intermediate film is formed as necessary, and then the resist upper layer film is formed. Thereafter, the resist upper layer film is patterned by a common method, and subsequently the pattern is transferred to the protective film by etching. Then, the substrate can be pattern-processed by implanting ions with the protective film as a mask. The remained silicon-containing resist intermediate film can be removed by a method selected from dry etching and wet etching, depending on necessary. Finally, the protective film can be removed by dry etching.

As described above, the inventive method for forming a pattern can form a fine pattern on the substrate to be processed with high precision with the multilayer resist method.

EXAMPLE

Hereinafter, the present invention will be described more specifically with showing Synthesis Examples, Comparative Synthesis Examples, Examples, and Comparative Examples, but the present invention is not limited by these examples. As for a molecular weight and a dispersion degree, a polystyrene-converted weight-average molecular weight (Mw) and number-average molecular weight (Mn) were determined by gel permeation chromatography (GPC) using tetrahydrofuran as an eluent to determine the dispersion degree (Mw/Mn).

Synthesis Example: Syntheses of Polymers for Composition for Forming Protective Film and Polymer Having Hydroxy Group at Terminal Group Used for syntheses of polymers for a composition for forming a protective film (or polymer mixtures) (A1) to (A9) and polymers having a hydroxy group at a terminal group (A10) to (A12) were tetracarboxylic anhydrides (B1) to (B5), diamine compounds (C1) to (C8), aniline derivatives and phthalic anhydride derivatives being the terminal blocking agents (D1) to (D10), described below.

Tetracarboxylic Anhydrides:

(B1)

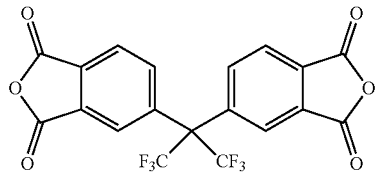

(B2)

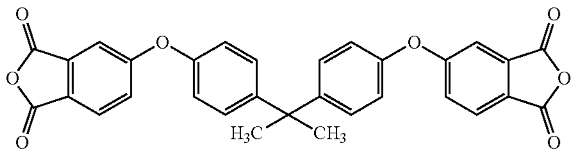

(B3)

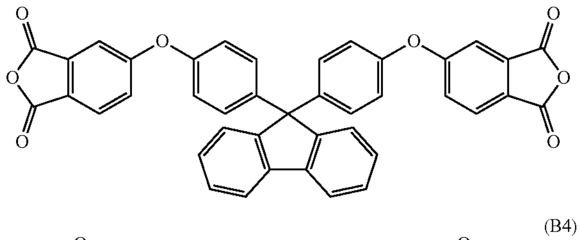

(B4)

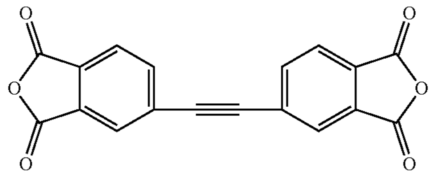

(B5)

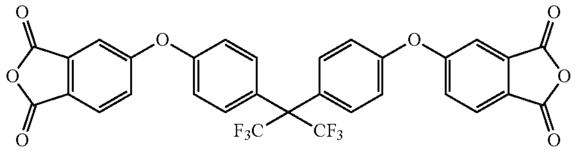

Diamine Compounds:

(C1)

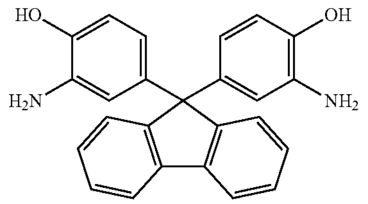

(C2)

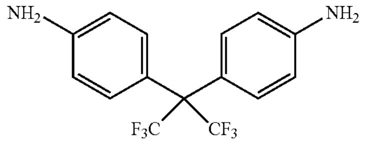

(C3)

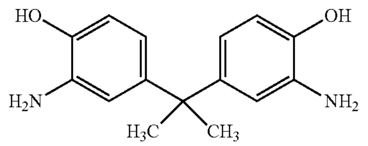

(C4)

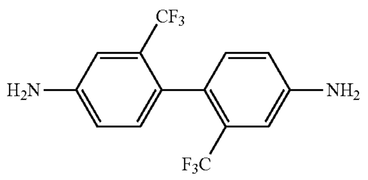

(C5)

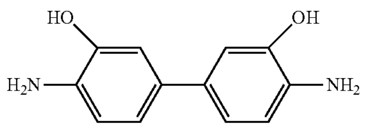

(C6)

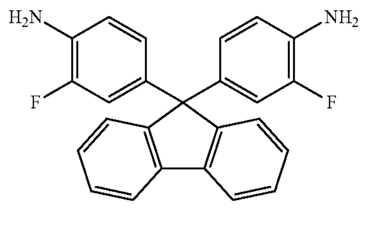

(C7)

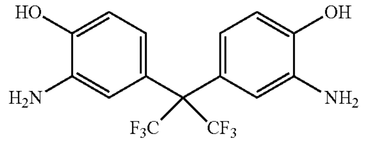

(C8)

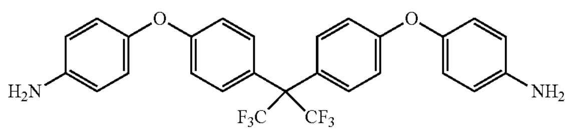

Terminal Blocking Agents:

(D1)

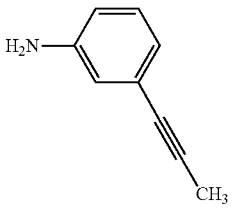

(D2)

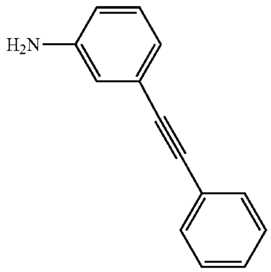

(D3)

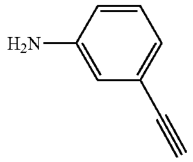

(D4)

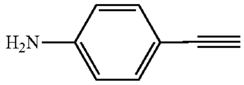

(D5)

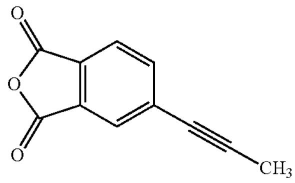

(D6)

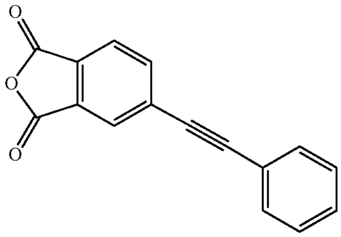

-continued (D7)

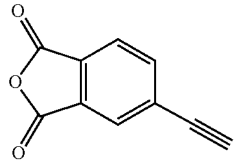

(D8)

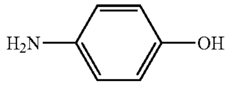

(D9)

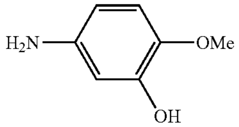

(D10)

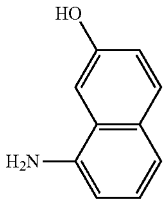

[Synthesis Example 1] Synthesis of Polymer (A1)

Into 17.77 g of the tetracarboxylic anhydride (B1) and 10.65 g of the diamine compound (C1), 120 g of N-methyl-2-pyrrolidone (NMP) was added to proceed a reaction under a nitrogen atmosphere at an internal temperature of 40° C. for 3 hours. Into the obtained polyamic acid intermediate solution, 3.15 g of the terminal blocking agent (D1) was added for proceeding a reaction at an internal temperature of 40° C. for further 3 hours to obtain a polyimide precursor solution. Into the obtained reaction liquid, 150 g of o-xylene was added, and an imidation reaction was proceeded at an internal temperature of 180° C. for 9 hours with removing generated water from the system. After the reaction was finished, the reaction liquid was cooled to a room temperature, 400 g of methyl isobutyl ketone was added, the organic layer was washed twice with 100 g of 3% aqueous nitric acid, and further washed six times with 100 g of pure water, and the organic layer was decompressed to be dried. Into the residue, 100 g of tetrahydrofuran (THF) was added to prepare a homogeneous solution, and then a product was crystallized with 400 g of diisopropyl ether. The precipitated crystal was separated by filtering, and washed twice with 300 g of diisopropyl ether to be recovered. The recovered crystal was dried in vacuo at 70° C. to obtain a polymer (A1). The weight-average molecular weight (Mw) and the dispersion degree (Mw/Mn) were determined by GPC to demonstrate the following results.

(A1)

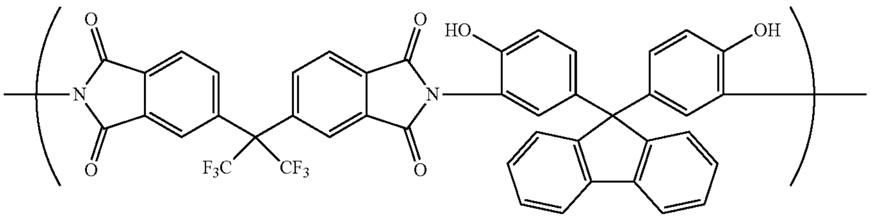

-continued

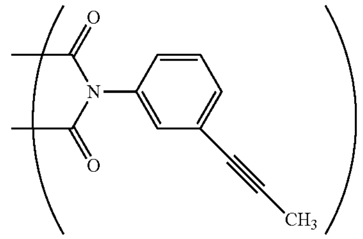

(A1): Mw=3750, Mw/Mn=1.66

[Synthesis Example 2] Synthesis of Polymer (A2)

Into 15.61 g of the tetracarboxylic anhydride (B2), 2.51 g of the diamine compound (C2), and 1.94 g of the diamine compound (C3), 90 g of N-methyl-2-pyrrolidone (NMP) was added to proceed a reaction under a nitrogen atmosphere at an internal temperature of 40° C. for 3 hours. Into the obtained polyamic acid intermediate solution, 5.80 g of the terminal blocking agent (D2) was added for proceeding a reaction at an internal temperature of 40° C. for further 3 hours to obtain a polyimide precursor solution. Into the obtained reaction liquid, 120 g of o-xylene was added, and an imidation reaction was proceeded at an internal temperature of 180° C. for 9 hours with removing generated water from the system. After the reaction was finished, the reaction liquid was cooled to a room temperature, 300 g of methyl isobutyl ketone was added, the organic layer was washed twice with 75 g of 3% aqueous nitric acid, and further washed six times with 75 g of pure water, and the organic layer was decompressed to be dried. Into the residue, 75 g of tetrahydrofuran (THF) was added to prepare a homogeneous solution, and then a product was crystallized with 300 g of diisopropyl ether. The precipitated crystal was separated by filtering, and washed twice with 200 g of diisopropyl ether to be recovered. The recovered crystal was dried in vacuo at 70° C. to obtain a polymer (A2). The weight-average molecular weight (Mw) and the dispersion degree (Mw/Mn) were determined by GPC to demonstrate the following results.

50

50

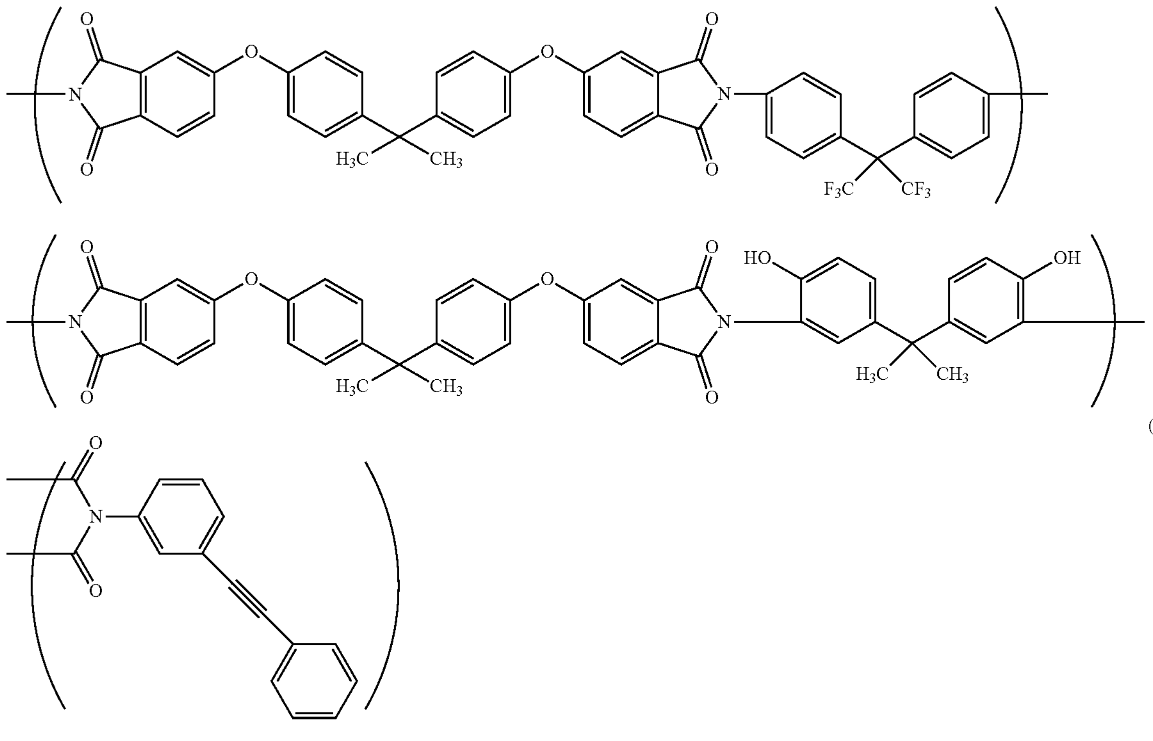

(A2)

(A2): Mw=2480, Mw/Mn=1.42

[Synthesis Example 3] Synthesis of Polymer (A3)

Into 19.28 g of the tetracarboxylic anhydride (B3), 1.92 g of the diamine compound (C4), and 1.30 g of the diamine compound (C5), 90 g of N-methyl-2-pyrrolidone (NMP) was added to proceed a reaction under a nitrogen atmosphere at an internal temperature of 40° C. for 3 hours. Into the obtained polyamic acid intermediate solution, 4.22 g of the terminal blocking agent (D3) was added for proceeding a reaction at an internal temperature of 40° C. for further 3 hours to obtain a polyimide precursor solution. Into the obtained reaction liquid, 120 g of o-xylene was added, and an imidation reaction was proceeded at an internal temperature of 180° C. for 9 hours with removing generated water from the system. After the reaction was finished, the reaction liquid was cooled to a room temperature, 300 g of methyl isobutyl ketone was added, the organic layer was washed twice with 75 g of 3% aqueous nitric acid, and further washed six times with 75 g of pure water, and the organic layer was decompressed to be dried. Into the residue, 75 g of tetrahydrofuran (THF) was added to prepare a homogeneous solution, and then a product was crystallized with 300 g of diisopropyl ether. The precipitated crystal was separated by filtering, and washed twice with 200 g of diisopropyl ether to be recovered. The recovered crystal was dried in vacuo at 70° C. to obtain a polymer (A3). The weight-average molecular weight (Mw) and the dispersion degree (Mw/Mn) were determined by GPC to demonstrate the following results.

pyrrolidone (NMP) was added to proceed a reaction under a nitrogen atmosphere at an internal temperature of 40° C. for 3 hours. Into the obtained polyamic acid intermediate solution, 2.34 g of the terminal blocking agent (D4) was added for proceeding a reaction at an internal temperature of 40° C. for further 3 hours to obtain a polyimide precursor solution. Into the obtained reaction liquid, 80 g of o-xylene was added, and an imidation reaction was proceeded at an internal temperature of 180° C. for 9 hours with removing generated water from the system. After the reaction was finished, the reaction liquid was cooled to a room temperature, 200 g of methyl isobutyl ketone was added, the organic layer was washed twice with 50 g of 3% aqueous nitric acid, and further washed six times with 50 g of pure water, and the

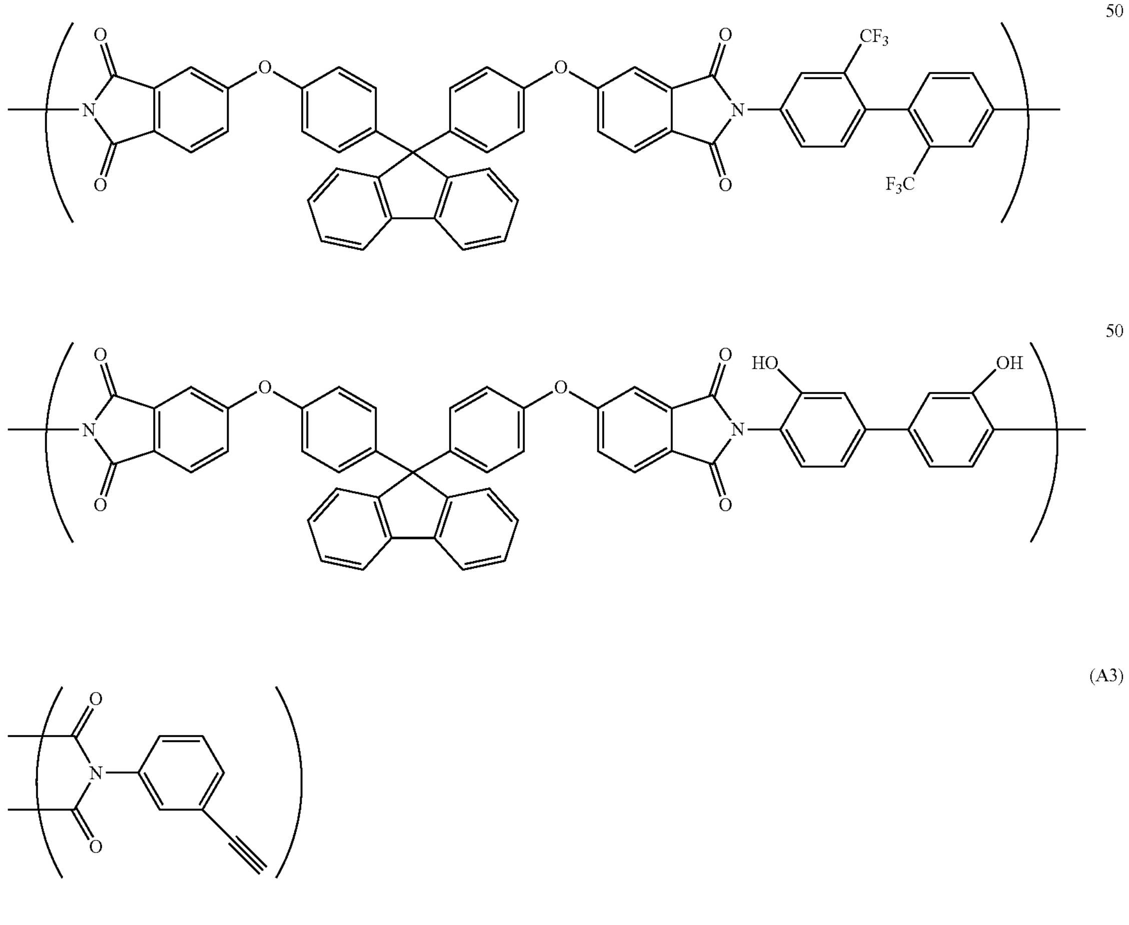

(A3)

(A3): Mw=2180, Mw/Mn=1.28

[Synthesis Example 4] Synthesis of Polymer Mixture (A4)

A polymer (A4-1) and a polymer (A4-2) used for a polymer mixture (A4) were each synthesized as follows.

[Synthesis Example 4-1] Synthesis of Polymer (A4-1)

Into 6.36 g of the tetracarboxylic anhydride (B4) and 3.84 g of the diamine compound (C6), 60 g of N-methyl-2- organic layer was decompressed to be dried. Into the residue, 50 g of tetrahydrofuran (THF) was added to prepare a homogeneous solution, and then a product was crystallized with 200 g of diisopropyl ether. The precipitated crystal was separated by filtering, and washed twice with 150 g of diisopropyl ether to be recovered. The recovered crystal was dried in vacuo at 70° C. to obtain a polymer (A4-1). The weight-average molecular weight (Mw) and the dispersion degree (Mw/Mn) were determined by GPC to demonstrate the following results.

(A4-1)

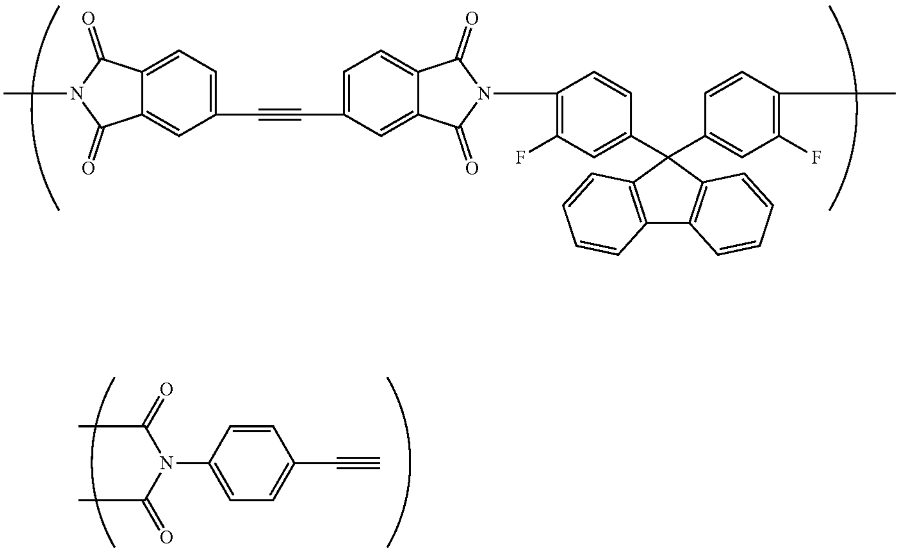

(A4-1) Mw=2310, Mw/Mn=1.45

[Synthesis Example 4-2] Synthesis of Polymer (A4-2)

Into 6.36 g of the tetracarboxylic anhydride (B4) and 2.58 g of the diamine compound (C3), 60 g of N-methyl-2-pyrrolidone (NMP) was added to proceed a reaction under a nitrogen atmosphere at an internal temperature of 40° C. for 3 hours. Into the obtained polyamic acid intermediate solution, 2.34 g of the terminal blocking agent (D4) was added for proceeding a reaction at an internal temperature of 40° C. for further 3 hours to obtain a polyimide precursor solution. Into the obtained reaction liquid, 80 g of o-xylene was added, and an imidation reaction was proceeded at an internal temperature of 180° C. for 9 hours with removing generated water from the system. After the reaction was finished, the reaction liquid was cooled to a room temperature, 200 g of methyl isobutyl ketone was added, the organic layer was washed twice with 50 g of 3% aqueous nitric acid, and further washed six times with 50 g of pure water, and the organic layer was decompressed to be dried. Into the residue, 50 g of tetrahydrofuran (THF) was added to prepare a homogeneous solution, and then a product was crystallized with 200 g of diisopropyl ether. The precipitated crystal was separated by filtering, and washed twice with 150 g of diisopropyl ether to be recovered. The recovered crystal was dried in vacuo at 70° C. to obtain a polymer (A4-2). The weight-average molecular weight (Mw) and the dispersion degree (Mw/Mn) were determined by GPC to demonstrate the following results.

(A4-2)

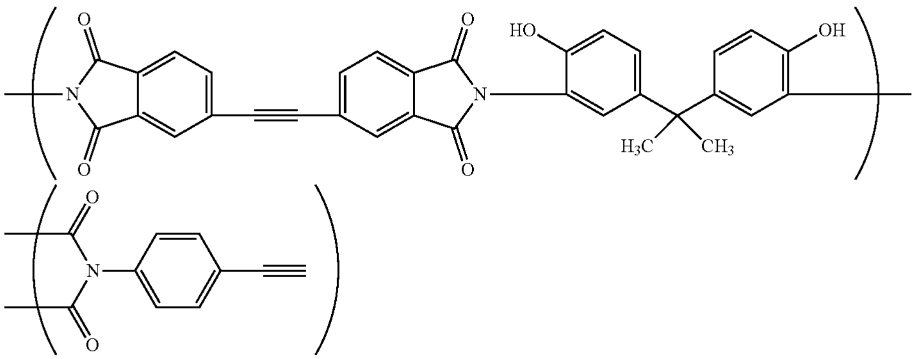

(A4-2): Mw=2190, Mw/Mn=1.43

[Synthesis Example 5] Synthesis of Polymer (A5)

Into 9.64 g of the tetracarboxylic anhydride (B3) and 2.20 g of the diamine compound (C7), 45 g of N-methyl-2-pyrrolidone (NMP) was added to proceed a reaction under a nitrogen atmosphere at an internal temperature of 40° C. for 3 hours. Into the obtained polyamic acid intermediate solution, 3.48 g of the terminal blocking agent (D2) was added for proceeding a reaction at an internal temperature of 40° C. for further 3 hours to obtain a polyimide precursor solution. Into the obtained reaction liquid, 60 g of o-xylene was added, and an imidation reaction was proceeded at an internal temperature of 180° C. for 9 hours with removing generated water from the system. After the reaction was finished, the reaction liquid was cooled to a room temperature, 150 g of methyl isobutyl ketone was added, the organic layer was washed twice with 40 g of 3% aqueous nitric acid, and further washed six times with 40 g of pure water, and the organic layer was decompressed to be dried. Into the residue, 40 g of tetrahydrofuran (THF) was added to prepare a homogeneous solution, and then a product was crystallized with 150 g of diisopropyl ether. The precipitated crystal was separated by filtering, and washed twice with 120 g of diisopropyl ether to be recovered. The recovered crystal was dried in vacuo at 70° C. to obtain a polymer (A5). The weight-average molecular weight (Mw) and the dispersion degree (Mw/Mn) were determined by GPC to demonstrate the following results.

solution, 1.95 g of the terminal blocking agent (D5) and 2.61 g of the terminal blocking agent (D6) were added for proceeding a reaction at an internal temperature of 40° C. for further 3 hours to obtain a polyimide precursor solution. Into the obtained reaction liquid, 130 g of o-xylene was added, and an imidation reaction was proceeded at an internal temperature of 180° C. for 9 hours with removing generated water from the system. After the reaction was finished, the reaction liquid was cooled to a room temperature, 350 g of methyl isobutyl ketone was added, the organic layer was washed twice with 90 g of 3% aqueous nitric acid, and further washed six times with 90 g of pure water, and the organic layer was decompressed to be dried. Into the residue, 90 g of tetrahydrofuran (THF) was added to prepare a (A5)

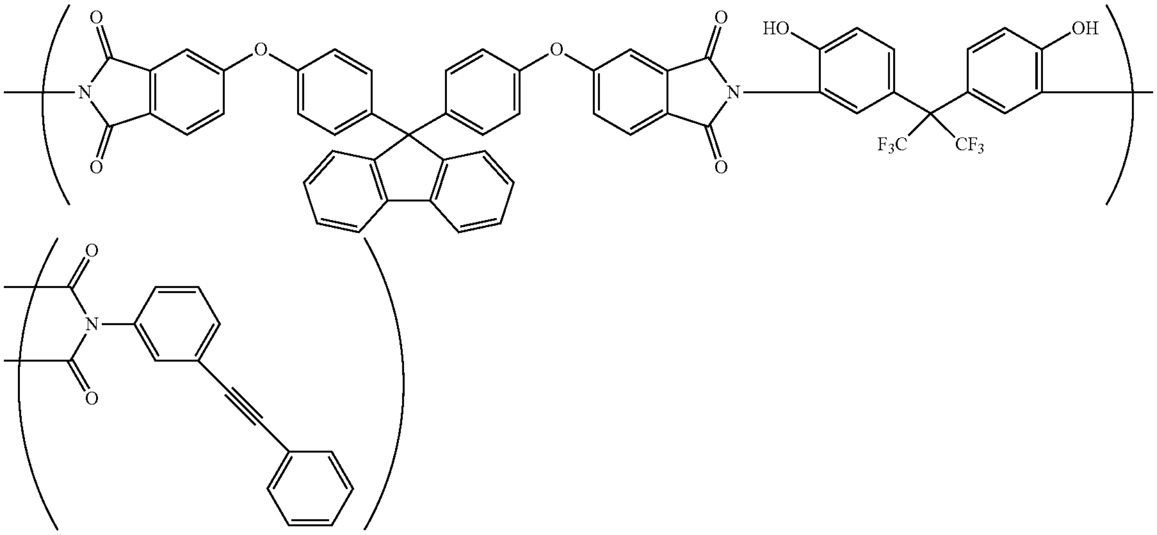

(A5): Mw=2230, Mw/Mn=1.22

[Synthesis Example 6] Synthesis of Polymer (A6)

Into 10.88 g of the tetracarboxylic anhydride (B1) and 12.82 g of the diamine compound (C7), 100 g of N-methyl-2-pyrrolidone (NMP) was added to proceed a reaction under a nitrogen atmosphere at an internal temperature of 40° C. for 3 hours. Into the obtained polyamic acid intermediate homogeneous solution, and then a product was crystallized with 350 g of diisopropyl ether. The precipitated crystal was separated by filtering, and washed twice with 250 g of diisopropyl ether to be recovered. The recovered crystal was dried in vacuo at 70° C. to obtain a polymer (A6). The weight-average molecular weight (Mw) and the dispersion degree (Mw/Mn) were determined by GPC to demonstrate the following results.

(A6)

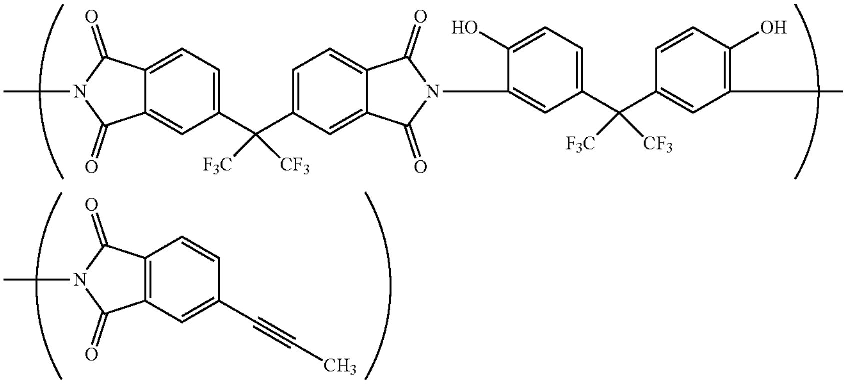

-continued

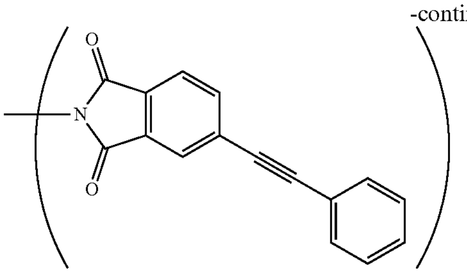

50:50

(A6): Mw=3950, Mw/Mn=1.70

[Synthesis Example 7] Synthesis of Polymer (A7)

Into 15.71 g of the tetracarboxylic anhydride (B5) and 3.66 g of the diamine compound (C7), 75 g of N-methyl-2-pyrrolidone (NMP) was added to proceed a reaction under a nitrogen atmosphere at an internal temperature of 40° C. for 3 hours. Into the obtained polyamic acid intermediate solution, 3.51 g of the terminal blocking agent (D3) was added for proceeding a reaction at an internal temperature of 40° C. for further 3 hours to obtain a polyimide precursor solution. Into the obtained reaction liquid, 90 g of o-xylene was added, and an imidation reaction was proceeded at an internal temperature of 180° C. for 9 hours with removing generated water from the system. After the reaction was finished, the reaction liquid was cooled to a room temperature, 250 g of methyl isobutyl ketone was added, the organic layer was washed twice with 60 g of 3% aqueous nitric acid, and further washed six times with 60 g of pure water, and the organic layer was decompressed to be dried. Into the residue, 60 g of tetrahydrofuran (THF) was added to prepare a homogeneous solution, and then a product was crystallized with 250 g of diisopropyl ether. The precipitated crystal was separated by filtering, and washed twice with 180 g of diisopropyl ether to be recovered. The recovered crystal was dried in vacuo at 70° C. to obtain a polymer (A7). The weight-average molecular weight (Mw) and the dispersion degree (Mw/Mn) were determined by GPC to demonstrate the following results.

[Synthesis Example 8] Synthesis of Polymer (A8)

Into 7.86 g of the tetracarboxylic anhydride (B5), 9.07 g of the diamine compound (C8), and 2.75 g of the diamine compound (C7), 75 g of N-methyl-2-pyrrolidone (NMP) was added to proceed a reaction under a nitrogen atmosphere at an internal temperature of 40° C. for 3 hours. Into the obtained polyamic acid intermediate solution, 4.30 g of the terminal blocking agent (D7) was added for proceeding a reaction at an internal temperature of 40° C. for further 3 hours to obtain a polyimide precursor solution. Into the obtained reaction liquid, 90 g of o-xylene was added, and an imidation reaction was proceeded at an internal temperature of 180° C. for 9 hours with removing generated water from the system. After the reaction was finished, the reaction liquid was cooled to a room temperature, 250 g of methyl isobutyl ketone was added, the organic layer was washed twice with 60 g of 3% aqueous nitric acid, and further washed six times with 60 g of pure water, and the organic layer was decompressed to be dried. Into the residue, 60 g of tetrahydrofuran (THF) was added to prepare a homogeneous solution, and then a product was crystallized with 250 g of diisopropyl ether. The precipitated crystal was separated by filtering, and washed twice with 180 g of diisopropyl ether to be recovered. The recovered crystal was dried in vacuo at 70° C. to obtain a polymer (A8). The weight-average molecular weight (Mw) and the dispersion degree (Mw/Mn) were determined by GPC to demonstrate the following results.

(A7)

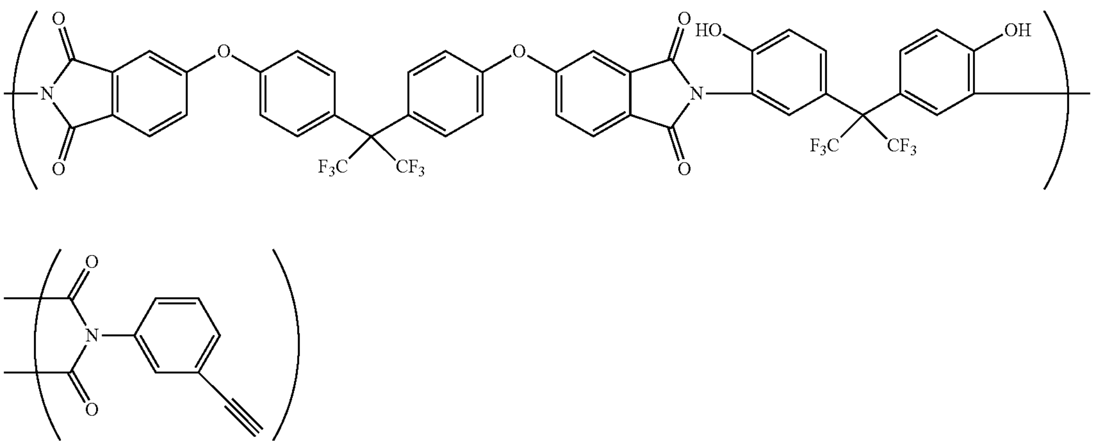

(A7): Mw=1950, Mw/Mn=1.21

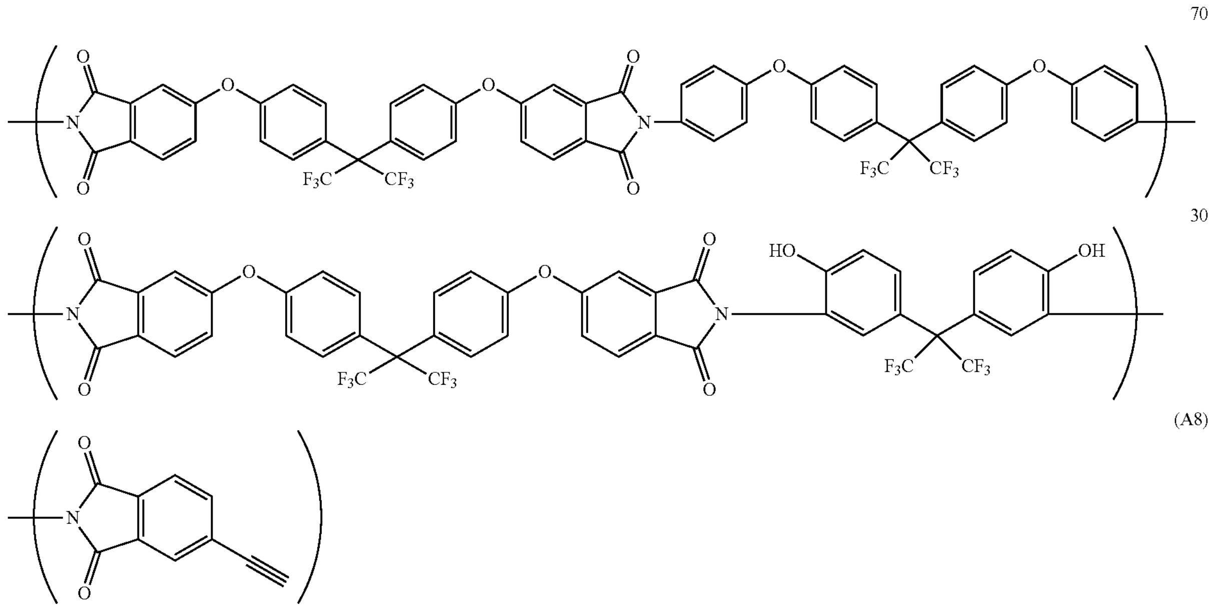

(A8)

(A8): Mw=2560, Mw/Mn=1.41

[Synthesis Example 9] Synthesis of Polymer (A9)

Into 7.54 g of the tetracarboxylic anhydride (B5), 0.80 g of the diamine compound (C2), and 0.88 g of the diamine compound (C7), 40 g of N-methyl-2-pyrrolidone (NMP) was added to proceed a reaction under a nitrogen atmosphere at an internal temperature of 40° C. for 3 hours. Into the obtained polyamic acid intermediate solution, 1.69 g of the terminal blocking agent (D4) was added for proceeding a reaction at an internal temperature of 40° C. for further 3 hours to obtain a polyimide precursor solution. Into the obtained reaction liquid, 45 g of o-xylene was added, and an imidation reaction was proceeded at an internal temperature of 180° C. for 9 hours with removing generated water from the system. After the reaction was finished, the reaction liquid was cooled to a room temperature, 120 g of methyl isobutyl ketone was added, the organic layer was washed twice with 30 g of 3% aqueous nitric acid, and further washed six times with 30 g of pure water, and the organic layer was decompressed to be dried. Into the residue, 30 g of tetrahydrofuran (THF) was added to prepare a homogeneous solution, and then a product was crystallized with 120 g of diisopropyl ether. The precipitated crystal was separated by filtering, and washed twice with 90 g of diisopropyl ether to be recovered. The recovered crystal was dried in vacuo at 70° C. to obtain a polymer (A9). The weight-average molecular weight (Mw) and the dispersion degree (Mw/Mn) were determined by GPC to demonstrate the following results.

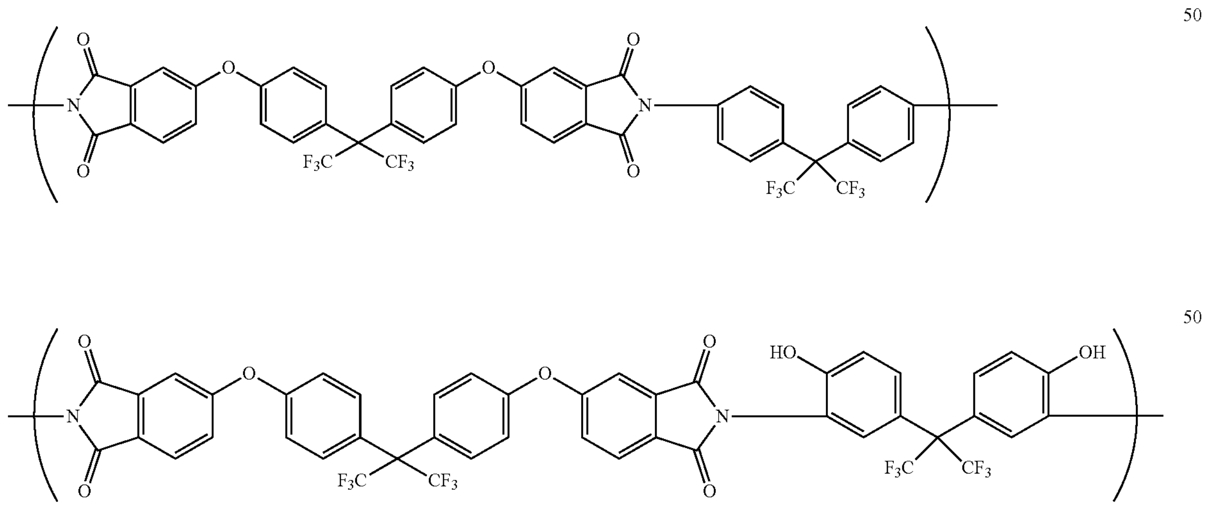

-continued (A9)

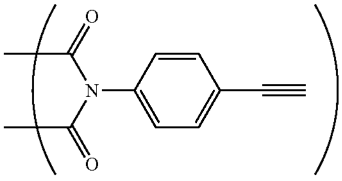

(A9): Mw=2010, Mw/Mn=1.29

[Synthesis Example 10] Synthesis of Polymer (A10)

Into 16.07 g of the tetracarboxylic anhydride (B3) and 3.34 g of the diamine compound (C2), 75 g of N-methyl-2-pyrrolidone (NMP) was added to proceed a reaction under a nitrogen atmosphere at an internal temperature of 40° C. for 3 hours. Into the obtained polyamic acid intermediate solution, 3.27 g of the terminal blocking agent (D8) was added for proceeding a reaction at an internal temperature of 40° C. for further 3 hours to obtain a polyimide precursor solution. Into the obtained reaction liquid, 90 g of o-xylene was added, and an imidation reaction was proceeded at an internal temperature of 180° C. for 9 hours with removing generated water from the system. After the reaction was finished, the reaction liquid was cooled to a room temperature, 250 g of methyl isobutyl ketone was added, the organic layer was washed twice with 60 g of 3% aqueous nitric acid, and further washed six times with 60 g of pure water, and the organic layer was decompressed to be dried. Into the residue, 60 g of tetrahydrofuran (THF) was added to prepare a homogeneous solution, and then a product was crystallized with 250 g of diisopropyl ether. The precipitated crystal was separated by filtering, and washed twice with 180 g of diisopropyl ether to be recovered. The recovered crystal was dried in vacuo at 70° C. to obtain a polymer (A10). The weight-average molecular weight (Mw) and the dispersion degree (Mw/Mn) were determined by GPC to demonstrate the following results.

[Synthesis Example 11] Synthesis of Polymer (A11)

Into 16.07 g of the tetracarboxylic anhydride (B3) and 3.66 g of the diamine compound (C7), 75 g of N-methyl-2-pyrrolidone (NMP) was added to proceed a reaction under a nitrogen atmosphere at an internal temperature of 40° C. for 3 hours. Into the obtained polyamic acid intermediate solution, 4.17 g of the terminal blocking agent (D9) was added for proceeding a reaction at an internal temperature of 40° C. for further 3 hours to obtain a polyimide precursor solution. Into the obtained reaction liquid, 90 g of o-xylene was added, and an imidation reaction was proceeded at an internal temperature of 180° C. for 9 hours with removing generated water from the system. After the reaction was finished, the reaction liquid was cooled to a room temperature, 250 g of methyl isobutyl ketone was added, the organic layer was washed twice with 60 g of 3% aqueous nitric acid, and further washed six times with 60 g of pure water, and the organic layer was decompressed to be dried. Into the residue, 60 g of tetrahydrofuran (THF) was added to prepare a homogeneous solution, and then a product was crystallized with 250 g of diisopropyl ether. The precipitated crystal was separated by filtering, and washed twice with 180 g of diisopropyl ether to be recovered. The recovered crystal was dried in vacuo at 70° C. to obtain a polymer (A11). The weight-average molecular weight (Mw) and the dispersion degree (Mw/Mn) were determined by GPC to demonstrate the following results.

(A10)

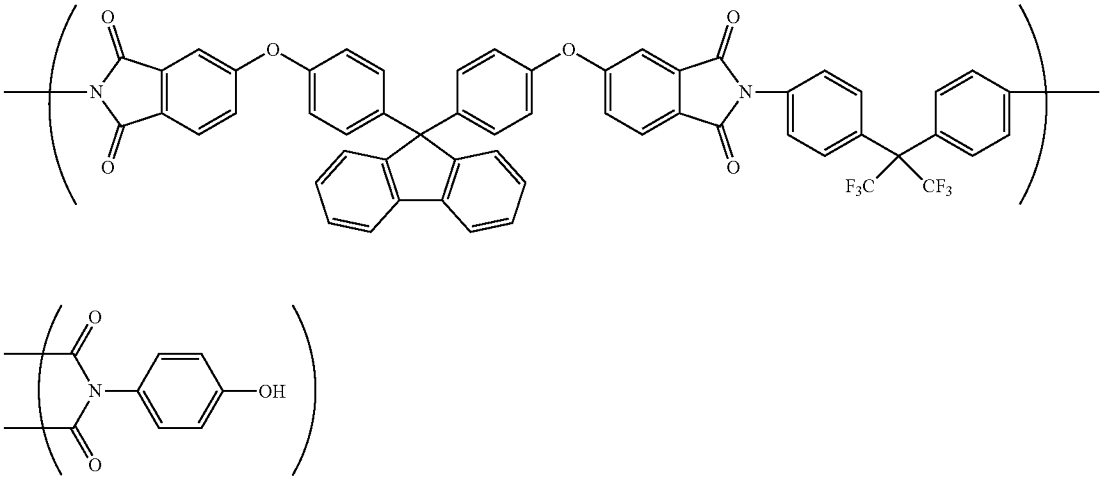

(A10): Mw=1970, Mw/Mn=1.24

(A11)

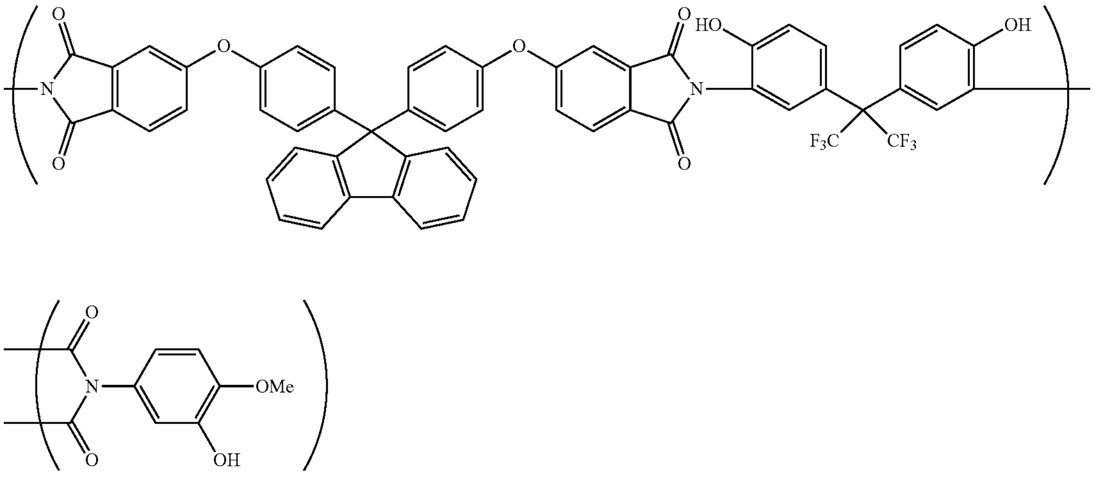

(A11): Mw=2010, Mw/Mn=1.23

[Synthesis Example 12] Synthesis of Polymer (A12)

Into 15.71 g of the tetracarboxylic anhydride (B5) and 5.18 g of the diamine compound (C8), 75 g of N-methyl-2-pyrrolidone (NMP) was added to proceed a reaction under a nitrogen atmosphere at an internal temperature of 40° C. for 3 hours. Into the obtained polyamic acid intermediate solution, 4.78 g of the terminal blocking agent (D10) was added for proceeding a reaction at an internal temperature of 40° C. for further 3 hours to obtain a polyimide precursor solution. Into the obtained reaction liquid, 90 g of o-xylene was added, and an imidation reaction was proceeded at an internal temperature of 180° C. for 9 hours with removing generated water from the system. After the reaction was finished, the reaction liquid was cooled to a room temperature, 250 g of methyl isobutyl ketone was added, the organic layer was washed twice with 60 g of 3% aqueous nitric acid, and further washed six times with 60 g of pure water, and the organic layer was decompressed to be dried. Into the residue, 60 g of tetrahydrofuran (THF) was added to prepare a homogeneous solution, and then a product was crystallized with 250 g of diisopropyl ether. The precipitated crystal was separated by filtering, and washed twice with 180 g of diisopropyl ether to be recovered. The recovered crystal was dried in vacuo at 70° C. to obtain a polymer (A12). The weight-average molecular weight (Mw) and the dispersion degree (Mw/Mn) were determined by GPC to demonstrate the following results.

Used for syntheses of polymers for Comparative Examples (R1) to (R9) were: the following compounds (E1) to (E10); the above tetracarboxylic anhydrides (B1), (B3), and (B5); the above diamine compounds (C1), (C7), and (C8); and the above terminal blocking agents (D3), (D6), and (D7). The used (E10) was isomeric mixture at 60:40.

(E1)

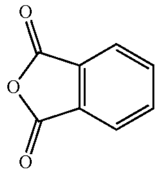

(E2)

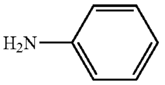

(E3)

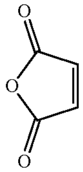

(A12)

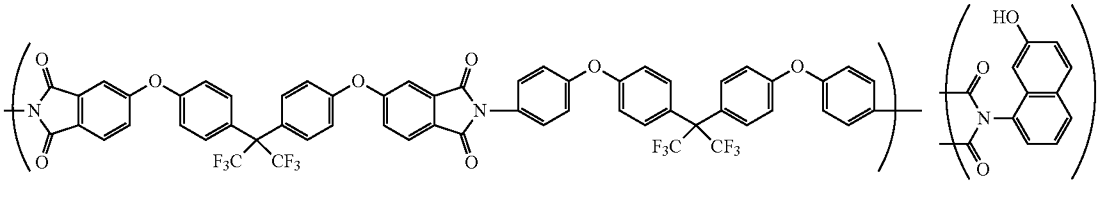

(A12) Mw=2100, Mw/Mn=1.25

-continued (E4)

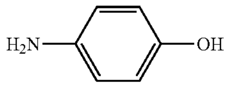

(E5)

HCHO (E6)

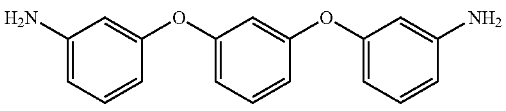

(E7)

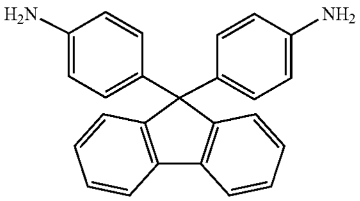

(E8)

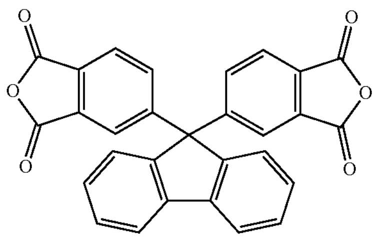

(E9)

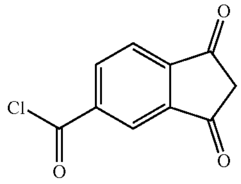

[Synthesis Example 13] Synthesis of Polymer (R1)

Into 7.11 g of the tetracarboxylic anhydride (B1) and 14.65 g of the diamine compound (C7), 120 g of N-methyl-2-pyrrolidone (NMP) was added to proceed a reaction under a nitrogen atmosphere at an internal temperature of 40° C. for 3 hours. Into the obtained polyamic acid intermediate solution, 7.11 g of the terminal blocking agent (E1) was added for proceeding a reaction at an internal temperature of 40° C. for further 3 hours to obtain a polyimide precursor solution. Into the obtained reaction liquid, 150 g of o-xylene was added, and an imidation reaction was proceeded at an internal temperature of 180° C. for 9 hours with removing generated water from the system. After the reaction was finished, the reaction liquid was cooled to a room temperature, 400 g of methyl isobutyl ketone was added, the organic layer was washed twice with 100 g of 3% aqueous nitric acid, and further washed six times with 100 g of pure water, and the organic layer was decompressed to be dried. Into the residue, 100 g of tetrahydrofuran (THF) was added to prepare a homogeneous solution, and then a product was crystallized with 400 g of diisopropyl ether. The precipitated crystal was separated by filtering, and washed twice with 300 g of diisopropyl ether to be recovered. The recovered crystal was dried in vacuo at 70° C. to obtain a polymer (R1). The weight-average molecular weight (Mw) and the dispersion degree (Mw/Mn) were determined by GPC to demonstrate the following results.

(R1)

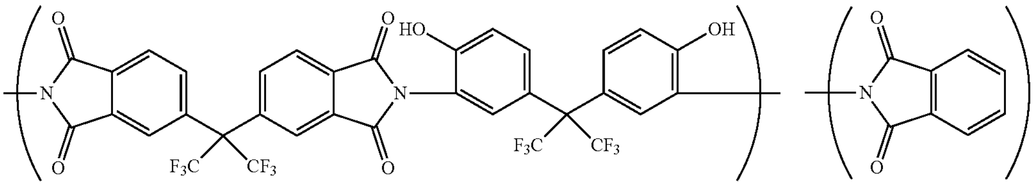

(R1): Mw=2250, Mw/Mn=1.32

-continued (E10)

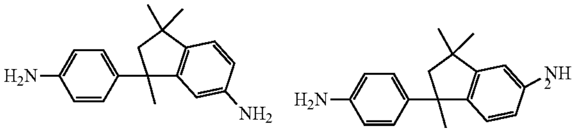

60 : 40

[Synthesis Example 14] Synthesis of Polymer (R2)

Into 13.33 g of the tetracarboxylic anhydride (B1) and 4.40 g of the diamine compound (C7), 90 g of N-methyl-2-pyrrolidone (NMP) was added to proceed a reaction under a nitrogen atmosphere at an internal temperature of 40° C. for 3 hours. Into the obtained polyamic acid intermediate solution, 3.35 g of the terminal blocking agent (E2) was added for proceeding a reaction at an internal temperature of 40° C. for further 3 hours to obtain a polyimide precursor solution. Into the obtained reaction liquid, 120 g of o-xylene was added, and an imidation reaction was proceeded at an internal temperature of 180° C. for 9 hours with removing generated water from the system. After the reaction was finished, the reaction liquid was cooled to a room temperature, 300 g of methyl isobutyl ketone was added, the organic layer was washed twice with 75 g of 3% aqueous nitric acid, and further washed six times with 75 g of pure water, and the organic layer was decompressed to be dried. Into the residue, 75 g of tetrahydrofuran (THF) was added to prepare a homogeneous solution, and then a product was crystallized with 300 g of diisopropyl ether. The precipitated crystal was separated by filtering, and washed twice with 200 g of diisopropyl ether to be recovered. The recovered crystal was dried in vacuo at 70° C. to obtain a polymer (R2). The weight-average molecular weight (Mw) and the dispersion degree (Mw/Mn) were determined by GPC to demonstrate the following results.

(R2)

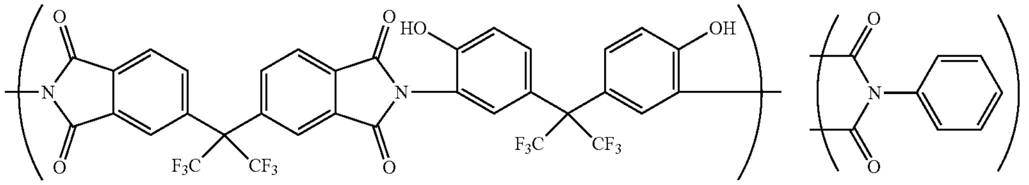

(R2): Mw=2140, Mw/Mn=1.29

[Synthesis Example 15] Synthesis of Polymer (R3)

Into 12.57 g of the tetracarboxylic anhydride (B5) and 14.65 g of the diamine compound (C7), 120 g of N-methyl-2-pyrrolidone (NMP) was added to proceed a reaction under a nitrogen atmosphere at an internal temperature of 40° C. for 3 hours. Into the obtained polyamic acid intermediate solution, 3.92 g of the terminal blocking agent (E3) was added for proceeding a reaction at an internal temperature of 40° C. for further 3 hours to obtain a polyimide precursor solution. Into the obtained reaction liquid, 150 g of o-xylene was added, and an imidation reaction was proceeded at an internal temperature of 180° C. for 9 hours with removing generated water from the system. After the reaction was finished, the reaction liquid was cooled to a room temperature, 400 g of methyl isobutyl ketone was added, the organic layer was washed twice with 100 g of 3% aqueous nitric acid, and further washed six times with 100 g of pure water, and the organic layer was decompressed to be dried. Into the residue, 100 g of tetrahydrofuran (THF) was added to prepare a homogeneous solution, and then a product was crystallized with 400 g of diisopropyl ether. The precipitated crystal was separated by filtering, and washed twice with 300 g of diisopropyl ether to be recovered. The recovered crystal was dried in vacuo at 70° C. to obtain a polymer (R3). The weight-average molecular weight (Mw) and the dispersion degree (Mw/Mn) were determined by GPC to demonstrate the following results.

(R3)

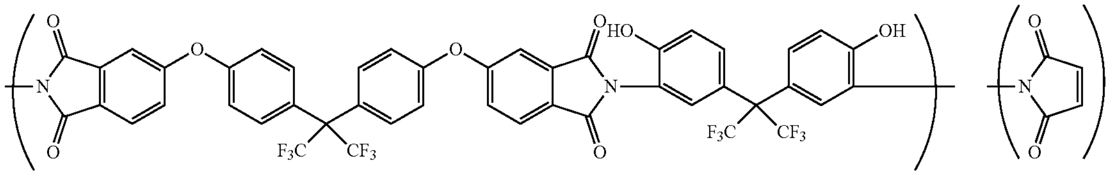

(R3): Mw=2360, Mw/Mn=1.36

[Synthesis Example 16] Synthesis of Polymer (R4)

Into 30.00 g of the tetracarboxylic anhydride (B1), 150 g of N-methyl pyrrolidone was added to prepare a homogeneous solution under a nitrogen atmosphere at an internal temperature of 40° C., and then 14.74 g of the amine compound (E4) was added for proceeding a reaction at an internal temperature of 40° C. for 3 hours to obtain an amic acid solution. Into the obtained amic acid solution, 200 g of o-xylene was added, and a dehydrative imidation reaction was proceeded for 9 hours with removing a generated low boiling-point compound and generated water from the system at an internal temperature of 150° C. After the reaction was finished, the reaction liquid was cooled to a room temperature, and a product was crystallized in 1000 g of diisopropyl ether. The precipitated crystal was separated by filtering, and washed twice with 500 g of diisopropyl ether to be recovered. The recovered crystal was dried in vacuo at 70° C. to obtain an imide compound (R4').

(R4')

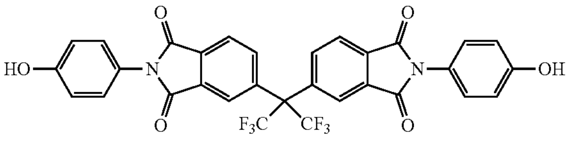

Subsequently, 15.00 g of the obtained imide compound (R4'), 1.36 g of the aldehyde compound (E5), and 60 g of 2-methoxy-1-propanol were mixed to prepare a homogeneous solution under a nitrogen atmosphere at an internal temperature of 80° C. Into the solution, 1.5 g of a 20% p-toluenesulfonic acid solution in 2-methoxy-1-propanol was slowly added, and the mixture was stirred at an internal temperature of 110° C. for 8 hours. After the reaction liquid was cooled to a room temperature, 200 g of methyl isobutyl ketone was added, the organic layer was washed five times with 50 g of pure water, and the organic layer was decompressed to be dried. Into the residue, 50 g of THF was added, and a polymer was reprecipitated with 200 g of hexane. The precipitated polymer was separated by filtering, and dried under a reduced pressure to obtain a polymer (R4). The weight-average molecular weight (Mw) and the dispersion degree (Mw/Mn) were determined by GPC to demonstrate the following results.

(R4)

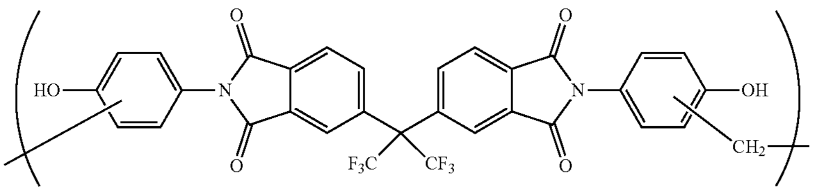

(R4): Mw=2820, Mw/Mn=1.72

[Synthesis Example 17] Synthesis of Polymer (R5)

Into 15.55 g of the tetracarboxylic anhydride (B1) and 14.62 g of the diamine compound (E6), 120 g of N-methyl-2-pyrrolidone (NMP) was added to proceed a reaction under a nitrogen atmosphere at an internal temperature of 40° C. for 3 hours. Into the obtained polyamic acid intermediate solution, 5.16 g of the terminal blocking agent (D7) was added for proceeding a reaction at an internal temperature of 40° C. for further 3 hours to obtain a polyimide precursor solution. Into the obtained reaction liquid, 4.00 g of pyridine was added, 12.25 g of acetic anhydride was further added dropwise slowly, and an imidation reaction was proceeded at an internal temperature of 60° C. for 4 hours. After the reaction was finished, the reaction liquid was cooled to a room temperature, 400 g of methyl isobutyl ketone was added, the organic layer was washed twice with 100 g of 3% aqueous nitric acid, and further washed six times with 100 g of pure water, and the organic layer was decompressed to be dried. Into the residue, 100 g of tetrahydrofuran (THF) was added to prepare a homogeneous solution, and then a product was crystallized with 400 g of methanol. The precipitated crystal was separated by filtering, and washed twice with 300 g of methanol to be recovered. The recovered crystal was dried in vacuo at 70° C. to obtain a polymer (R5). The weight-average molecular weight (Mw) and the dispersion degree (Mw/Mn) were determined by GPC to demonstrate the following results.

[Synthesis Example 18] Synthesis of Polymer (R6)

Into 13.33 g of the tetracarboxylic anhydride (B1) and 7.32 g of the diamine compound (E7), 70 g of N-methyl-2-pyrrolidone (NMP) was added to proceed a reaction under a nitrogen atmosphere at an internal temperature of 40° C. for 3 hours. Into the obtained polyamic acid intermediate solution, 2.11 g of the terminal blocking agent (D3) was added for proceeding a reaction at an internal temperature of 40° C. for further 3 hours to obtain a polyimide precursor solution. Into the obtained reaction liquid, 2.37 g of pyridine was added, 7.35 g of acetic anhydride was further added dropwise slowly, and an imidation reaction was proceeded at an internal temperature of 60° C. for 4 hours. After the reaction was finished, the reaction liquid was cooled to a room temperature, 240 g of methyl isobutyl ketone was added, the organic layer was washed twice with 60 g of 3% aqueous nitric acid, and further washed six times with 60 g of pure water, and the organic layer was decompressed to be dried. Into the residue, 60 g of tetrahydrofuran (THF) was added to prepare a homogeneous solution, and then a product was crystallized with 240 g of methanol. The precipitated crystal was separated by filtering, and washed twice with 240 g of methanol to be recovered. The recovered crystal was dried in vacuo at 70° C. to obtain a polymer (R6). The weight-average molecular weight (Mw) and the dispersion degree (Mw/Mn) were determined by GPC to demonstrate the following results.

(R5)

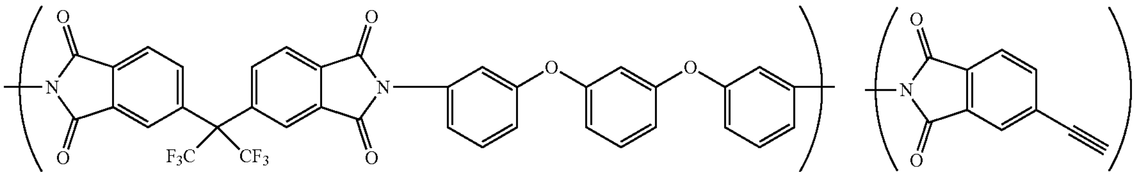

(R5): Mw=4320, Mw/Mn=1.72

(R6)

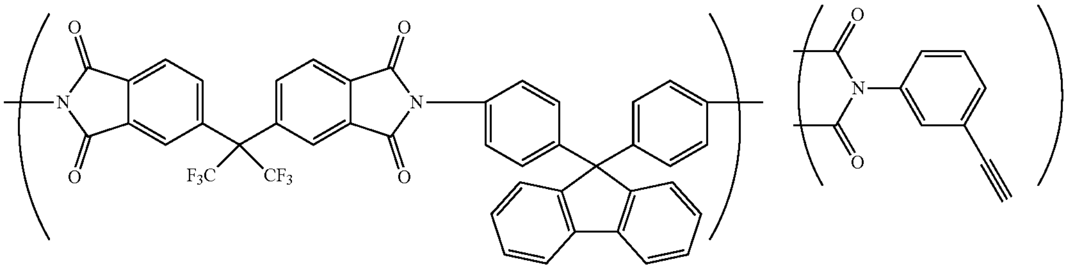

(R6): Mw=3780, Mw/Mn=1.67

[Synthesis Example 19] Synthesis of Polymer (R7)

Into 7.71 g of the tetracarboxylic anhydride (B3) and 15.55 g of the diamine compound (C8), 70 g of N-methyl-2-pyrrolidone (NMP) was added to proceed a reaction under a nitrogen atmosphere at an internal temperature of 40° C. for 3 hours. Into the obtained polyamic acid intermediate solution, 6.20 g of the terminal blocking agent (D7) was added for proceeding a reaction at an internal temperature of 40° C. for further 3 hours to obtain a polyimide precursor solution. Into the obtained reaction liquid, 2.37 g of pyridine was added, 7.35 g of acetic anhydride was further added dropwise slowly, and an imidation reaction was proceeded at an internal temperature of 60° C. for 4 hours. After the reaction was finished, the reaction liquid was cooled to a room temperature, 240 g of methyl isobutyl ketone was added, the organic layer was washed twice with 60 g of 3% aqueous nitric acid, and further washed six times with 60 g of pure water, and the organic layer was decompressed to be dried. Into the residue, 60 g of tetrahydrofuran (THF) was added to prepare a homogeneous solution, and then a product was crystallized with 240 g of methanol. The precipitated crystal was separated by filtering, and washed twice with 240 g of methanol to be recovered. The recovered crystal was dried in vacuo at 70° C. to obtain a polymer (R7). The weight-average molecular weight (Mw) and the dispersion degree (Mw/Mn) were determined by GPC to demonstrate the following results.

[Synthesis Example 20] Synthesis of Polymer (R8)

Into 18.34 g of the tetracarboxylic anhydride (E8) and 8.30 g of the diamine compound (C8), 100 g of N-methyl-2-pyrrolidone (NMP) was added to proceed a reaction under a nitrogen atmosphere at an internal temperature of 40° C. for 3 hours. Into the obtained polyamic acid intermediate solution, 5.62 g of the terminal blocking agent (D3) was added for proceeding a reaction at an internal temperature of 40° C. for further 3 hours to obtain a polyimide precursor solution. Into the obtained reaction liquid, 3.16 g of pyridine was added, 9.80 g of acetic anhydride was further added dropwise slowly, and an imidation reaction was proceeded at an internal temperature of 60° C. for 4 hours. After the reaction was finished, the reaction liquid was cooled to a room temperature, 320 g of methyl isobutyl ketone was added, the organic layer was washed twice with 80 g of 3% aqueous nitric acid, and further washed six times with 80 g of pure water, and the organic layer was decompressed to be dried. Into the residue, 80 g of tetrahydrofuran (THF) was added to prepare a homogeneous solution, and then a product was crystallized with 320 g of methanol. The precipitated crystal was separated by filtering, and washed twice with 240 g of methanol to be recovered. The recovered crystal was dried in vacuo at 70° C. to obtain a polymer (R8). The weight-average molecular weight (Mw) and the dispersion degree (Mw/Mn) were determined by GPC to demonstrate the following results.

(R7)

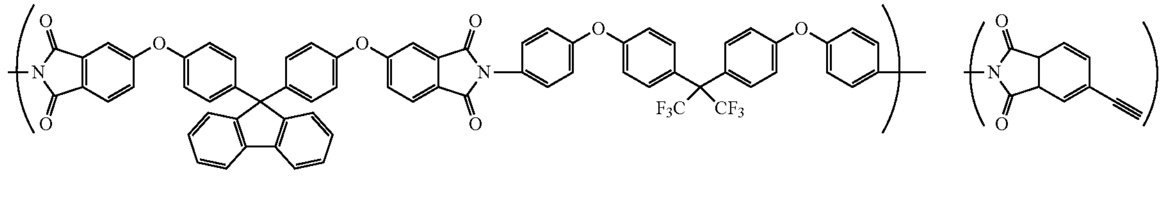

(R7): Mw=2420, Mw/Mn=1.26

(R8)

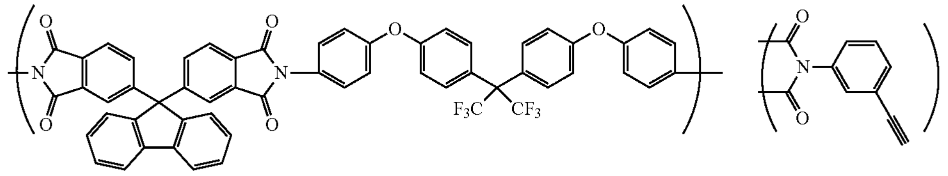

(R8): Mw=2240, Mw/Mn=1.27

[Synthesis Example 21] Synthesis of Polymer (R9)

Into 6.32 g of the compound (E9), 50 g of THF was added to prepare a homogeneous solution under a nitrogen atmosphere in an ice bath. Into this solution, 4.00 g of the diamine compound (E10) and 3.34 g of triethylamine, which were previously dissolved in 20 g of NMP, were further added dropwise slowly to proceed a reaction at a room temperature for 1 hour. Into the reaction liquid, 14.28 g of the compound (C1) and 100 g of NMP were further added to proceed a reaction at an internal temperature of 40° C. for 3 hours, and then 11.18 g of the terminal blocking agent (D6) was added to obtain a polyimide precursor. Into the obtained reaction liquid, 150 g of o-xylene was added, and an imidation reaction was proceeded for 9 hours with removing a generated low boiling-point compound and generated water from the system at an internal temperature of 180° C. After the reaction was finished, the reaction liquid was cooled to a room temperature, and a product was crystallized in 600 g of diisopropyl ether. The precipitated crystal was separated by filtering, and washed twice with 200 g of diisopropyl ether to be recovered. The recovered crystal was dried in vacuo at 70° C. to obtain (R9). The weight-average molecular weight (Mw) and the dispersion degree (Mw/Mn) were determined by GPC to demonstrate the following results.

(R9)

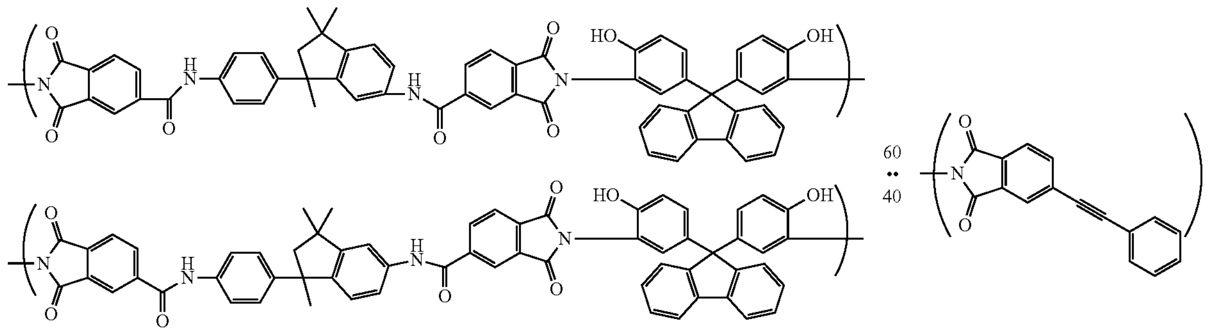

(R9): Mw=2930, Mw/Mn=1.42

Preparation of Composition for Forming Protective Film (UDL-1 to 22 and Comparative UDL-1 to 9)

Used were the above polymers (A1) to (A12) and (R1) to (R9) and high boiling-point solvents of (S1) 1,6-diacetoxyhexane: boiling point 260° C., (S2) γ-butyrolactone: boiling point 204° C., and (S3) tripropylene glycol monomethyl ether: boiling point 242° C. A propylene glycol monomethyl ether acetate (PGMEA) and cyclohexanone (CyHO) containing 0.1 mass % of FC-4430 (manufactured by Sumitomo 3M Limited.) was used to be dissolved at a ratio shown in Table 1, and then the mixture was filtered with a filter made of a fluororesin with 0.1 μm to prepare each composition for forming a protective film (UDL-1 to 22, and Comparative UDL-1 to 9)

TABLE 1

| Composition for forming protective film | Polymer (1) (parts by mass) | Polymer (2) (parts by mass) | Polymer (3) (parts by mass) | High boiling-point solvent (parts by mass) | CYHO (parts by mass) | PGMEA (parts by mass) |
|---|---|---|---|---|---|---|
| UDL-1 | A1 (10) | — | — | — | — | 90 |
| UDL-2 | A2 (10) | — | — | — | 90 | — |
| UDL-3 | A3 (10) | — | — | — | — | 90 |
| UDL-4 | A4-1 (5) | A4-2 (5) | — | — | 90 | — |
| UDL-5 | A5 (10) | — | — | — | — | 90 |
| UDL-6 | A6 (10) | — | — | — | — | 90 |
| UDL-7 | A7 (10) | — | — | — | — | 90 |
| UDL-8 | A8 ( 10) | — | — | — | — | 90 |
| UDL-9 | A9 (10) | — | — | — | — | 90 |
| UDL-10 | A5 (5) | A7 (5) | — | — | — | 90 |
| UDL-11 | A3 (10) | — | — | S1 (10) | — | 80 |
| UDL-12 | A5 (10) | — | — | S2 (10) | — | 80 |
| UDL-13 | A7 (10) | — | — | S3 (10) | — | 80 |
| UDL-14 | A2 (7) | A10 (3) | — | — | 90 | — |
| UDL-15 | A4-1 (4.5) | A4-2 (4.5) | A10 (1) | — | 90 | — |
| UDL-16 | A5 (8.5) | A10 (1.5) | — | — | — | 90 |
| UDL-17 | A7 (9.5) | A10 (0.5) | — | — | — | 90 |
| UDL-18 | A7 (9.5) | A11 ( 0.5) | — | — | — | 90 |
| UDL-19 | A7 (9.5) | A12 (0.5) | — | — | — | 90 |
| UDL-20 | A7 (9.5) | A10 (0.5) | — | S1 (10) | — | 80 |
| UDL-21 | A7 (9.5) | A10 (0.5) | — | S2 (10) | — | 80 |
| UDL-22 | A7 (9.5) | A10 (0.5) | — | S3 (10) | — | 80 |
| comparative UDL-1 | R1 (10) | — | — | — | — | 90 |
| comparative UDL-2 | R2 (10) | — | — | — | — | 90 |
| comparative UDL-3 | R3 (10) | — | — | — | — | 90 |
| comparative UDL-4 | R4 (10) | — | — | — | 90 | — |
| comparative UDL-5 | R5 (10) | — | — | — | — | 90 |
| comparative UDL-6 | R6 (10) | — | — | — | — | 90 |
| comparative UDL-7 | R7 (10) | — | — | — | — | 90 |
| comparative UDL-8 | R8 (10) | — | — | — | 90 | — |
| comparative UDL-9 | R9 (10) | — | — | — | — | 90 |

Example 1 Measurement of Solvent Resistance (Examples 1-1 to 1-22 and Comparative Examples 1-1 to 1-9)

Each of the compositions for forming a protective film (UDL-1 to 22 and Comparative UDL-1 to 9) prepared above was applied on a silicon substrate, calcined under a nitrogen flow managed with an oxygen concentration of 0.2% or less at 450° C. for 60 seconds, and then the film thickness was measured. A PGMEA solvent was dispensed thereon, left to stand for 30 seconds to be spin-dried, and baked at 100° C. for 60 seconds for evaporating PGMEA to measure the thickness. The difference between the thicknesses before and after the PGMEA treatment was determined. Table 2 shows the results.

TABLE 2

| | Composition for forming protective film | Thickness after film formation: a (Å) | Thickness after PGMEA treatment: b (Å) | b/a × 100 (%) |
|---|---|---|---|---|
| Example 1-1 | UDL-1 | 2006 | 2006 | 100.0 |
| Example 1-2 | UDL-2 | 1991 | 1990 | 99.9 |
| Example 1-3 | UDL-3 | 2006 | 1995 | 99.5 |
| Example 1-4 | UDL-4 | 1999 | 1997 | 99.9 |
| Example 1-5 | UDL-5 | 2007 | 1997 | 99.5 |
| Example 1-6 | UDL-6 | 1998 | 1994 | 99.8 |
| Example 1-7 | UDL-7 | 2000 | 1992 | 99.6 |
| Example 1-8 | UDL-8 | 1992 | 1992 | 100.0 |
| Example 1-9 | UDL-9 | 2000 | 2000 | 100.0 |
| Example 1-10 | UDL-10 | 2005 | 2001 | 99.8 |
| Example 1-11 | UDL-11 | 1999 | 1995 | 99.8 |
| Example 1-12 | UDL-12 | 2006 | 2006 | 100.0 |
| Example 1-13 | UDL-13 | 1991 | 1990 | 99.9 |
| Example 1-14 | UDL-14 | 2005 | 1995 | 99.5 |
| Example 1-15 | UDL-15 | 2001 | 1993 | 99.6 |
| Example 1-16 | UDL-16 | 1997 | 1990 | 99.6 |
| Example 1-17 | UDL-17 | 2002 | 1996 | 99.7 |
| Example 1-18 | UDL-18 | 1994 | 1990 | 99.8 |
| Example 1-19 | UDL-19 | 1997 | 1993 | 99.8 |
| Example 1-20 | UDL-20 | 2006 | 1997 | 99.6 |
| Example 1-21 | UDL-21 | 2004 | 1995 | 99.6 |
| Example 1-22 | UDL-22 | 1999 | 1994 | 99.7 |
| Comparative Example 1-1 | Comparative UDL-1 | 2007 | 1412 | 70.4 |

TABLE 2-continued

| | Composition for forming protective film | Thickness after film formation: a (Å) | Thickness after PGMEA treatment: b (Å) | b/a × 100 (%) |
|---|---|---|---|---|
| Comparative Example 1-2 | Comparative UDL-2 | 2012 | 1398 | 69.5 |
| Comparative Example 1-3 | Comparative UDL-3 | 2001 | 1987 | 99.3 |
| Comparative Example 1-4 | Comparative UDL-4 | 2005 | 1452 | 72.4 |
| Comparative Example 1-5 | Comparative UDL-5 | 2008 | 2001 | 99.7 |
| Comparative Example 1-6 | Comparative UDL-6 | 2006 | 2002 | 99.8 |
| Comparative Example 1-7 | Comparative UDL-7 | 2015 | 2013 | 99.9 |
| Comparative Example 1-8 | Comparative UDL-8 | 2002 | 1994 | 99.6 |
| Comparative Example 1-9 | Comparative UDL-9 | 2013 | 2007 | 99.7 |

As shown in Table 2, it is found that the inventive compositions for forming a protective film (Examples 1-1 to 1-22) have a residual film rate after the PGMEA treatment of 99% or more, and the crosslinking reaction proceeds even under the nitrogen atmosphere to exhibit sufficient solvent resistance. Meanwhile, Comparative Examples 1-1, 1-2, and 1-4, which use the polyimide having no crosslinkable group, have a residual film rate after the PGMEA treatment of approximately 70%, and the solvent resistance is not sufficiently exhibited. From these results, it is found that R1, introduced as the substituent, effectively functions as a thermal crosslinkable group.

Example 2 Evaluation of Heat Resistance Property (Examples 2-1 to 2-22 and Comparative Examples 2-1 to 2-9)

Each of the above compositions for forming a protective film (UDL-1 to 22 and Comparative UDL-1 to 9) was applied on a silicon substrate, calcined in the air at 180° C. for 60 seconds to form an applied film with 200 nm, and the thickness A was measured. This substrate was further calcined under a nitrogen flow managed with an oxygen concentration of 0.2% or less at 450° C. for 10 minutes, and the thickness B was measured. Table 3 shows these results.

TABLE 3

| | Composition for forming protective film | Thickness at 180° C.: A (Å) | Thickness at 450° C.: B (Å) | Residual film rate % (B/A) |
|---|---|---|---|---|
| Example 2-1 | UDL-1 | 1995 | 1982 | 99.3 |
| Example 2-2 | UDL-2 | 2001 | 1990 | 99.5 |
| Example 2-3 | UDL-3 | 1994 | 1993 | 99.9 |
| Example 2-4 | UDL-4 | 1997 | 1977 | 99.0 |
| Example 2-5 | UDL-5 | 2005 | 1986 | 99.1 |
| Example 2-6 | UDL-6 | 1992 | 1980 | 99.4 |
| Example 2-7 | UDL-7 | 1997 | 1997 | 100.0 |
| Example 2-8 | UDL-8 | 1995 | 1980 | 99.2 |
| Example 2-9 | UDL-9 | 2003 | 1994 | 99.6 |
| Example 2-10 | UDL-10 | 2002 | 1991 | 99.5 |
| Example 2-11 | UDL-11 | 1994 | 1978 | 99.2 |
| Example 2-12 | UDL-12 | 1999 | 1982 | 99.1 |
| Example 2-13 | UDL-13 | 2000 | 2000 | 100.0 |
| Example 2-14 | UDL-14 | 1999 | 1979 | 99.0 |
| Example 2-15 | UDL-15 | 1994 | 1977 | 99.1 |
| Example 2-16 | UDL-16 | 1995 | 1976 | 99.0 |
| Example 2-17 | UDL-17 | 2004 | 1985 | 99.1 |
| Example 2-18 | UDL-18 | 2000 | 1983 | 99.2 |

TABLE 3-continued

| | Composition for forming protective film | Thickness at 180° C.: A (Å) | Thickness at 450° C.: B (Å) | Residual film rate % (B/A) |
|---|---|---|---|---|
| Example 2-19 | UDL-19 | 2002 | 1984 | 99.1 |
| Example 2-20 | UDL-20 | 1996 | 1980 | 99.2 |
| Example 2-21 | UDL-21 | 1999 | 1981 | 99.1 |
| Example 2-22 | UDL-22 | 1997 | 1979 | 99.1 |
| Comparative Example 2-1 | Comparative UDL-1 | 1995 | 1393 | 69.8 |
| Comparative Example 2-2 | Comparative UDL-2 | 1993 | 1378 | 69.1 |
| Comparative Example 2-3 | Comparative UDL-3 | 2004 | 1489 | 74.3 |
| Comparative Example 2-4 | Comparative UDL-4 | 2000 | 1401 | 70.1 |
| Comparative Example 2-5 | Comparative UDL-5 | 1999 | 1991 | 99.6 |
| Comparative Example 2-6 | Comparative UDL-6 | 2003 | 1995 | 99.6 |
| Comparative Example 2-7 | Comparative UDL-7 | 1987 | 1976 | 99.4 |
| Comparative Example 2-8 | Comparative UDL-8 | 1988 | 1978 | 99.5 |
| Comparative Example 2-9 | Comparative UDL-9 | 1997 | 1985 | 99.4 |

As shown in Table 3, the inventive compositions for forming a protective film (Examples 2-1 to 2-22) have a film thickness reduction of less than 1% even after calcining at 450° C. It is found that the inventive composition for forming a protective film maintains the thickness before the high-temperature baking even after the calcining at 450° C. and has high heat resistance. Meanwhile, compared with Comparative Examples 2-1, 2-2, and 2-4, which use the polyimide having no crosslinkable group, it is found that the inventive composition for forming a protective film forms a dense film with thermally crosslinking the terminal crosslinkable group R1 to form a film having excellent heat resistance. In Comparative Example 2-3, which has the bismaleimide structure as the crosslinkable group, it is found that the solvent resistance is exhibited with the thermal crosslinking under the condition in Example 1, but sufficient heat resistance is not exhibited with the thermally crosslinking the bismaleimide structure under the condition of high-temperature treatment over a long time as in Example 2.

Example 3 Evaluation of Embedding Ability (Examples 3-1 to 3-22 and Comparative Examples 3-1 to 3-9)

As in FIG. 3, each of the above compositions for forming a protective film (UDL-1 to 22 and Comparative UDL-1 to 9) was applied on $SiO_2$ wafer substrate having a dense hole pattern (hole diameter: 0.16 μm, hole depth: 0.50 μm, distance between centers of adjacent two holes: 0.32 μm). The composition was calcined under a nitrogen flow managed with an oxygen concentration of 0.2% or less at 450° C. for 60 seconds by using a hot plate to form a protective film 8. The used substrate was a base substrate 7 ($SiO_2$ wafer substrate) having the dense hole pattern illustrated in FIG. 3(G) (overhead view) and (H) (sectional view). The sectional shape of each of the obtained wafer substrate was observed by using a scanning electron microscope (SEM) to check whether there is no void inside the hole and the hole is filled with the protective film. Table 4 shows the results. When a composition for forming a protective film having poor embedding ability is used, voids are generated inside the hole in this evaluation. When a composition for forming a protective film having good embedding ability is used, no void is generated inside the hole and the hole is filled with the protective film in this evaluation, as illustrated in FIG. 3(I).

TABLE 4

| | Composition for forming protective film | Presence/ absence of void |
|---|---|---|
| Example 3-1 | UDL-1 | Absence |
| Example 3-2 | UDL-2 | Absence |
| Example 3-3 | UDL-3 | Absence |
| Example 3-4 | UDL-4 | Absence |
| Example 3-5 | UDL-5 | Absence |
| Example 3-6 | UDL-6 | Absence |
| Example 3-7 | UDL-7 | Absence |
| Example 3-8 | UDL-8 | Absence |
| Example 3-9 | UDL-9 | Absence |
| Example 3-10 | UDL-10 | Absence |
| Example 3-11 | UDL-11 | Absence |
| Example 3-12 | UDL-12 | Absence |
| Example 3-13 | UDL-13 | Absence |
| Example 3-14 | UDL-14 | Absence |
| Example 3-15 | UDL-15 | Absence |
| Example 3-16 | UDL-16 | Absence |
| Example 3-17 | UDL-17 | Absence |
| Example 3-18 | UDL-18 | Absence |
| Example 3-19 | UDL-19 | Absence |
| Example 3-20 | UDL-20 | Absence |
| Example 3-21 | UDL-21 | Absence |
| Example 3-22 | UDL-22 | Absence |
| Comparative Example 3-1 | Comparative UDL-1 | Presence |
| Comparative Example 3-2 | Comparative UDL-2 | Presence |
| Comparative Example 3-3 | Comparative UDL-3 | Presence |
| Comparative Example 3-4 | Comparative UDL-4 | Presence |
| Comparative Example 3-5 | Comparative UDL-5 | Absence |
| Comparative Example 3-6 | Comparative UDL-6 | Absence |
| Comparative Example 3-7 | Comparative UDL-7 | Absence |
| Comparative Example 3-8 | Comparative UDL-8 | Absence |
| Comparative Example 3-9 | Comparative UDL-9 | Absence |

As shown in Table 4, it has been confirmed that the inventive compositions for forming a protective film (Examples 3-1 to 3-22) can fill the hole pattern without void generation, and have good embedding ability. Meanwhile, it has been confirmed that Comparative Examples 3-1 to 3-4 generate voids and have poor embedding ability. From the results, it is found that the inventive composition for forming a protective film achieves the heat resistance with the thermally curing reaction and improves the embedding ability. Meanwhile, Comparative Examples 3-1 to 3-4 generate voids due to insufficient heat resistance even with Comparative UDL-3, which exhibits the solvent resistance, and good embedding ability is not obtained.

Example 4 Evaluation of Planarization Ability (Examples 4-1 to 4-22 and Comparative Examples 4-1 to 4-9)

Each of the compositions for forming a protective film (UDL-1 to 22 and Comparative UDL-1 to 9) was applied on a base substrate 9 ($SiO_2$ wafer substrate) having a giant isolated trench pattern (FIG. 4(J), trench width: 10 μm, trench depth: 0.10 μm). The composition was calcined under a nitrogen flow managed with an oxygen concentration of 0.2% or less at 450° C. for 60 seconds, and then a step on the protective film 10 between the trenched portion and the non-trenched portion (delta 10 in FIG. 4(K)) was observed by using an atomic force microscope (AFM) NX10 manufactured by Park Systems Corporation. Table 5 shows the results. In this evaluation, the smaller the step, the better the planarization ability. In this evaluation, the trench pattern with 0.10 μm in depth is planarized using the composition for forming a protective film having a typical film thickness of approximately 0.2 m, which is a strict evaluation condition to evaluate the excellence or poorness of planarization ability.

TABLE 5

| | Composition for forming protective film | Step (nm) |
|---|---|---|
| Example 4-1 | UDL-1 | 20 |
| Example 4-2 | UDL-2 | 25 |
| Example 4-3 | UDL-3 | 30 |
| Example 4-4 | UDL-4 | 30 |
| Example 4-5 | UDL-5 | 10 |
| Example 4-6 | UDL-6 | 20 |
| Example 4-7 | UDL-7 | 10 |
| Example 4-8 | UDL-8 | 20 |
| Example 4-9 | UDL-9 | 20 |
| Example 4-10 | UDL-10 | 10 |
| Example 4-11 | UDL-11 | 20 |
| Example 4-12 | UDL-12 | 5 |
| Example 4-13 | UDL-13 | 5 |
| Example 4-14 | UDL-14 | 30 |
| Example 4-15 | UDL-15 | 30 |
| Example 4-16 | UDL-16 | 25 |
| Example 4-17 | UDL-17 | 20 |
| Example 4-18 | UDL-18 | 20 |
| Example 4-19 | UDL-19 | 20 |
| Example 4-20 | UDL-20 | 15 |
| Example 4-21 | UDL-21 | 15 |
| Example 4-22 | UDL-22 | 10 |
| Comparative Example 4-1 | Comparative UDL-1 | 90 |
| Comparative Example 4-2 | Comparative UDL-2 | 90 |
| Comparative Example 4-3 | Comparative UDL-3 | 85 |
| Comparative Example 4-4 | Comparative UDL-4 | 70 |
| Comparative Example 4-5 | Comparative UDL-5 | 30 |
| Comparative Example 4-6 | Comparative UDL-6 | 45 |
| Comparative Example 4-7 | Comparative UDL-7 | 50 |
| Comparative Example 4-8 | Comparative UDL-8 | 45 |
| Comparative Example 4-9 | Comparative UDL-9 | 40 |

As shown in Table 5, it has confirmed that the inventive compositions for forming a protective film (Examples 4-1 to 4-22) have a smaller step of the protective film between the trenched portion and the non-trenched portion than Comparative Examples 4-1 to 4-4, and have excellent planarization ability. Comparative Example 4-3, which has poor heat resistance as the result of the heat resistance evaluation in Example 2, has a large film reduction generated by the high-temperature baking, and thereby the film thickness difference between top of the step and bottom of the step is accentuated to deteriorate the planarization, leading to the above results. Comparative Examples 4-1, 4-2, and 4-4, which use the non-crosslinkable polyimide, also have a large effect due to the film reduction caused by the high-temperature treatment, resulting in poor planarization. Comparing between each of Examples 4-11 to 4-13 and 4-20 to 4-22, which add the high boiling-point solvent, and Examples 4-3, 4-5, 4-7, and 4-17 to 4-19, which added no high boiling-point solvent, it is found that adding the high boiling-point solvent improves the planarization ability.

Example 5 Evaluation of Resistance Against Alkaline Aqueous Hydrogen Peroxide (Examples 5-1 to 5-22 and Comparative Examples 5-1 to 5-9)

Each of the compositions for forming a protective film (UDL-1 to 22 and Comparative UDL-1 to 9) was applied on a silicon wafer substrate on which a $SiO_2$ film with 300 nm was formed, and calcined under a nitrogen flow managed with an oxygen concentration of 0.2% or less at 450° C. for 60 seconds to form a protective film (resist underlayer film) having a film thickness of 200 nm. Subsequently, the wafer was cut to 2 cm in width. This wafer specimen was immersed in a 1.0 mass % aqueous hydrogen peroxide containing 0.5 mass % of ammonia at 70° C. for 5 minutes, rinsed with deionized water, and dried. Thereafter, presence/absence of removal of the protective film from the wafer was visually observed. When a part or all of the protective film is removed to expose the silicon wafer surface, the tested protective film is judged to have insufficient resistance against the alkaline aqueous hydrogen peroxide. Table 6 shows these evaluation results.

TABLE 6

| | Composition for forming protective film | Observation result at 70° C. for 5 minutes |
|---|---|---|
| Example 5-1 | UDL-1 | No removal |
| Example 5-2 | UDL-2 | No removal |
| Example 5-3 | UDL-3 | No removal |
| Example 5-4 | UDL-4 | No removal |
| Example 5-5 | UDL-5 | No removal |
| Example 5-6 | UDL-6 | No removal |
| Example 5-7 | UDL-7 | No removal |
| Example 5-8 | UDL-8 | No removal |
| Example 5-9 | UDL-9 | No removal |
| Example 5-10 | UDL-10 | No removal |
| Example 5-11 | UDL-11 | No removal |
| Example 5-12 | UDL-12 | No removal |
| Example 5-13 | UDL-13 | No removal |
| Example 5-14 | UDL-14 | No removal |
| Example 5-15 | UDL-15 | No removal |
| Example 5-16 | UDL-16 | No removal |
| Example 5-17 | UDL-17 | No removal |
| Example 5-18 | UDL-18 | No removal |
| Example 5-19 | UDL-19 | No removal |
| Example 5-20 | UDL-20 | No removal |
| Example 5-21 | UDL-21 | No removal |
| Example 5-22 | UDL-22 | No removal |
| Comparative Example 5-1 | Comparative UDL-1 | Entire removal |
| Comparative Example 5-2 | Comparative UDL-2 | Entire removal |
| Comparative Example 5-3 | Comparative UDL-3 | Entire removal |
| Comparative Example 5-4 | Comparative UDL-4 | Entire removal |
| Comparative Example 5-5 | Comparative UDL-5 | Entire removal |
| Comparative Example 5-6 | Comparative UDL-6 | Entire removal |
| Comparative Example 5-7 | Comparative UDL-7 | Entire removal |
| Comparative Example 5-8 | Comparative UDL-8 | Entire removal |
| Comparative Example 5-9 | Comparative UDL-9 | Partial removal |

As shown in Table 6, no removal of the protective film is observed in any of the inventive compositions for forming a protective film (Examples 5-1 to 5-22). Meanwhile, in Comparative Examples 5-1 to 5-9, removal of the protective film is observed even with achieving the heat resistance and the solvent resistance. Accordingly, it has been found that the inventive polyimide compound, which has both the fluorine atom and the hydroxy group, has excellent resistance against an alkaline aqueous hydrogen peroxide. In addition, it has been found that adding the polyimide having the hydroxy group at the terminal group also has excellent resistance against an alkaline aqueous hydrogen peroxide.

Example 6 Pattern Forming Test (Examples 6-1 to 6-22 and Comparative Examples 6-1 to 6-9)

Each of the above compositions for forming a protective film (UDL-1 to 22 and Comparative UDL-1 to 9) was applied on a silicon wafer substrate on which $SiO_2$ film with 300 nm was formed. The composition was calcined under a nitrogen flow managed with an oxygen concentration of 0.2% or less at 450° C. for 60 seconds to form a protective film (resist underlayer film) with 200 nm in film thickness. A CVD-SiON hard mask was formed thereon, an organic anti-reflection film material (ARC-29A: manufactured by Nissan Chemical Corporation) was further applied, and baked at 210° C. for 60 seconds to form an organic anti-reflection film with 80 nm in film thickness. A single layer resist for ArF being a resist upper layer film material was applied thereon, and baked at 105° C. for 60 seconds to form a photoresist film with 100 nm in film thickness. A protective film material for immersion (TC-1) was applied on the photoresist film, and baked at 90° C. for 60 seconds to form a protective film with 50 nm in film thickness.

As the resist upper layer film material (single layer resist for ArF), a polymer (RP 1), an acid generator (PAG 1), and a base compound (Amine 1) were dissolved in a solvent containing 0.1 mass % of FC-430 (manufactured by Sumitomo 3M Limited.) at a ratio in Table 7, and the mixture was filtered with a filter made of a fluororesin with 0.1 μm to prepare the resist upper layer film material.

TABLE 7

| | Polymer (parts by mass) | Acid generator (parts by mass) | Base compound (parts by mass) | Solvent (parts by mass) |
|---|---|---|---|---|
| Single layer resist for ArF | RP 1 (100) | PAG 1 (6.6) | Amine 1 (0.8) | PGMEA (2500) |

The polymer (RP 1), the acid generator (PAG 1), and the base compound (Amine 1), which were used for the resist upper layer film material (single layer resist for ArF), will be described below.

RP1

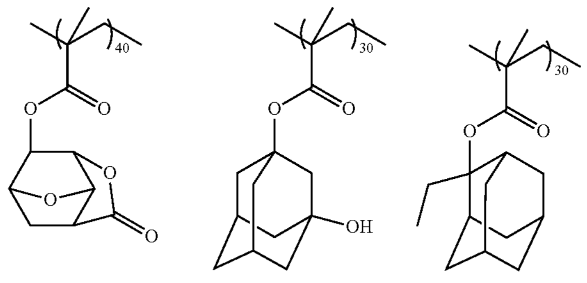

Mw7,800

PAG1

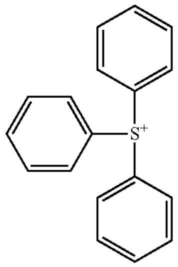

$CF_3CF_2CF_2CF_2SO_3^-$

Amine1

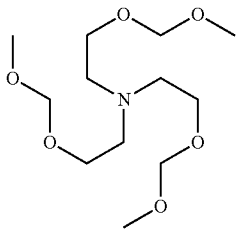

As the protective film material for immersion (TC-1), a protective film polymer (PP 1) was dissolved in organic solvents at a ratio in Table 8, and the mixture was filtered with a filter made of a fluororesin with 0.1 μm to prepare the protective film material for immersion.

TABLE 8

| | Polymer (parts by mass) | Organic solvent (parts by mass) |
|---|---|---|
| TC-1 | PP 1<br>(100) | Diisoamyl ether (2700)<br>2-Methyl-1-butanol (270) |

The polymer (PP 1) used for the protective film material for immersion (TC-1) will be described below.

PP1

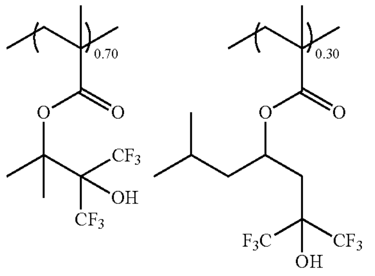

Mw8, 800 Mw/Mn1.69

Then, the film was exposed by using an ArF immersion exposure device (manufactured by NIKON CORPORATION; NSR-S610C, NA 1.30, σ 0.98/0.65, 35°-dipole s-polarized illumination, 6% halftone phase-shifting mask), baked at 100° C. for 60 seconds (PEB), and developed with 2.38 mass % aqueous solution of tetramethylammonium hydroxide (TMAH) for 30 seconds to obtain a positive line-and-space pattern of 1:1 with 55 nm.

Then, the organic anti-reflection film and the CVD-SiON hard mask were etch-processed by dry etching using an etching machine "Telius", manufactured by Tokyo Electron Ltd., with the resist pattern as a mask to form a hard mask pattern. The protective film was etched with the obtained hard mask pattern as a mask to form a protective film pattern. The etching condition was as follows.

The transferring condition of the resist pattern to the SiON hard mask:

Chamber pressure: 10.0 Pa

RF power: 1,500 W $CF_4$ gas flow rate: 75 sccm $O_2$ gas flow rate: 15 sccm

Time: 15 sec

The transferring condition of the hard mask pattern to the protective film:

Chamber pressure: 2.0 Pa

RF power: 500 W

Ar gas flow rate: 75 sccm $O_2$ gas flow rate: 45 sccm

Time: 120 sec

Availability of the protective film pattern formation was determined by top-down SEM view of the wafer after the protective film etching. Subsequently, the wafer was cut in 2 cm width, and this wafer specimen was immersed in a 1.0 mass % aqueous hydrogen peroxide containing 0.5 mass % of ammonia at 70° C. for 5 minutes, rinsed with deionized water, and dried. Thereafter, the wafer was observed by using an optical microscope to evaluate presence/absence of removal of the protective film pattern. Table 9 shows these evaluation results.

TABLE 9

| | Composition for forming protective film | Protective film pattern | Presence/ Absence of removal |
|---|---|---|---|
| Example 6-1 | UDL-1 | Formable | Not removed |
| Example 6-2 | UDL-2 | Formable | Not removed |
| Example 6-3 | UDL-3 | Formable | Not removed |
| Example 6-4 | UDL-4 | Formable | Not removed |
| Example 6-5 | UDL-5 | Formable | Not removed |
| Example 6-6 | UDL-6 | Formable | Not removed |
| Example 6-7 | UDL-7 | Formable | Not removed |
| Example 6-8 | UDL-8 | Formable | Not removed |
| Example 6-9 | UDL-9 | Formable | Not removed |
| Example 6-10 | UDL-10 | Formable | Not removed |
| Example 6-11 | UDL-11 | Formable | Not removed |
| Example 6-12 | UDL-12 | Formable | Not removed |
| Example 6-13 | UDL-13 | Formable | Not removed |
| Example 6-14 | UDL-14 | Formable | Not removed |
| Example 6-15 | UDL-15 | Formable | Not removed |
| Example 6-16 | UDL-16 | Formable | Not removed |
| Example 6-17 | UDL-17 | Formable | Not removed |
| Example 6-18 | UDL-18 | Formable | Not removed |
| Example 6-19 | UDL-19 | Formable | Not removed |

TABLE 9-continued

| | Composition for forming protective film | Protective film pattern | Presence/ Absence of removal |
|---|---|---|---|
| Example 6-20 | UDL-20 | Formable | Not removed |
| Example 6-21 | UDL-21 | Formable | Not removed |
| Example 6-22 | UDL-22 | Formable | Not removed |
| Comparative Example 6-1 | Comparative UDL-1 | Formable | Removed |
| Comparative Example 6-2 | Comparative UDL-2 | Formable | Removed |
| Comparative Example 6-3 | Comparative UDL-3 | Formable | Removed |
| Comparative Example 6-4 | Comparative UDL-4 | Formable | Removed |
| Comparative Example 6-5 | Comparative UDL-5 | Formable | Removed |
| Comparative Example 6-6 | Comparative UDL-6 | Formable | Removed |
| Comparative Example 6-7 | Comparative UDL-7 | Formable | Removed |
| Comparative Example 6-8 | Comparative UDL-8 | Formable | Removed |
| Comparative Example 6-9 | Comparative UDL-9 | Formable | Removed |

As shown in Table 9, the results of the inventive compositions for forming a protective film (Examples 6-1 to 6-22) demonstrate that the resist upper layer film pattern in any cases is favorably transferred to the protective film, and it has been confirmed that the inventive composition for forming a protective film is suitably used for the fine processing with the multilayer resist method. Furthermore, it has been confirmed that the formed protective film pattern has good resistance against the alkaline aqueous hydrogen peroxide. In Comparative Example 6-3, although the heat resistance was insufficient, the pattern was capable of forming. In Comparative Examples 6-1, 6-2, and 6-4, although both the heat resistance and solvent resistance are insufficient, the pattern was capable of forming. Meanwhile, in Comparative Examples 6-1 to 6-9, the removal of the formed protective film pattern was observed even with achieved heat resistance and the solvent resistance. Therefore, the inventive composition for forming a protective film and the inventive method for forming a pattern are particularly useful for enabling to produce semiconductor apparatuses with fine processing in which a chemical liquid etching using an alkaline aqueous hydrogen peroxide, etc. and the multilayer resist method are combined.

Example 7 Pattern Forming Test (Examples 7-1 to 7-22 and Comparative Examples 7-1 to 7-9)

Each of the above compositions for forming a protective film (UDL-1 to 22 and Comparative UDL-1 to 9) was applied on a $SiO_2$ wafer substrate having a trench pattern (trench width: 10 μm, trench depth: 0.10 μm). The composition was calcined under a nitrogen flow managed with an oxygen concentration of 0.2% or less at 450° C. for 60 seconds. An applied film was formed, patterned, and dry-etched to form a protective film pattern in the same manner as in Example 6. Furthermore, the $SiO_2$ film was etch-processed with the obtained protective film pattern as a mask. The etching condition was as follows.

The transferring condition of the protective film pattern to the $SiO_2$ film:

Chamber pressure: 2.0 Pa
RF power: 2,200 W
$C_5F_{12}$ gas flow rate: 20 sccm $C_2F_6$ gas flow rate: 10 sccm
Ar gas flow rate: 300 sccm
$O_2$ gas flow rate: 60 sccm
Time: 90 sec Table 10 shows results of a cross section of the pattern observed with an electron microscope (S-4700), manufactured by Hitachi, Ltd.

TABLE 10

| | Composition for forming protective film | Pattern shape after substrate transferring etching |
|---|---|---|
| Example 7-1 | UDL-1 | Vertical shape |
| Example 7-2 | UDL-2 | Vertical shape |
| Example 7-3 | UDL-3 | Vertical shape |
| Example 7-4 | UDL-4 | Vertical shape |
| Example 7-5 | UDL-5 | Vertical shape |
| Example 7-6 | UDL-6 | Vertical shape |
| Example 7-7 | UDL-7 | Vertical shape |
| Example 7-8 | UDL-8 | Vertical shape |
| Example 7-9 | UDL-9 | Vertical shape |
| Example 7-10 | UDL-10 | Vertical shape |
| Example 7-11 | UDL-11 | Vertical shape |
| Example 7-12 | UDL-12 | Vertical shape |
| Example 7-13 | UDL-13 | Vertical shape |
| Example 7-14 | UDL-14 | Vertical shape |
| Example 7-15 | UDL-15 | Vertical shape |
| Example 7-16 | UDL-16 | Vertical shape |
| Example 7-17 | UDL-17 | Vertical shape |
| Example 7-18 | UDL-18 | Vertical shape |
| Example 7-19 | UDL-19 | Vertical shape |
| Example 7-20 | UDL-20 | Vertical shape |
| Example 7-21 | UDL-21 | Vertical shape |
| Example 7-22 | UDL-22 | Vertical shape |
| Comparative Example 7-1 | Comparative UDL-1 | Pattern collapsed |
| Comparative Example 7-2 | Comparative UDL-2 | Pattern collapsed |
| Comparative Example 7-3 | Comparative UDL-3 | Pattern collapsed |
| Comparative Example 7-4 | Comparative UDL-4 | Pattern collapsed |
| Comparative Example 7-5 | Comparative UDL-5 | Vertical shape |
| Comparative Example 7-6 | Comparative UDL-6 | Vertical shape |
| Comparative Example 7-7 | Comparative UDL-7 | Vertical shape |
| Comparative Example 7-8 | Comparative UDL-8 | Vertical shape |
| Comparative Example 7-9 | Comparative UDL-9 | Vertical shape |

As shown in Table 10, the results of the inventive compositions for forming a protective film (Examples 7-1 to 7-22) demonstrate that the resist upper layer film pattern in any cases is favorably transferred to the substrate finally, and it has been confirmed that the inventive composition for forming a protective film is suitably used for fine processing with the multilayer resist method. Meanwhile, in the Comparative Examples 7-1 to 7-4, the pattern embedding is insufficient to collapse the pattern during the pattern processing even with achieved heat resistance and solvent resistance, resulting in failure to finally obtain a good pattern.

As described above, the inventive composition for forming a protective film has both of the heat resistance against 400° C. or higher even in an inert gas containing no oxygen and high embedding/planarization ability, thus is extremely useful as the composition for forming a protective film used for the multilayer resist method. In addition, the inventive method for forming a pattern using the above composition can form a fine pattern with high precision even on a substrate to be processed having a step. Thus, the method can be suitably used for the multilayer resist process for fine patterning in the semiconductor apparatus manufacturing, and in particularly, can also be applied to the multilayer resist process including the wet etching processing. Therefore, the inventive method is extremely useful in the industry.

The present description includes the following inventions.

[1]: A composition for forming a protective film against an alkaline aqueous hydrogen peroxide, the composition comprising: (A) a polymer represented by the following any one of (I) and (II) and having a fluorine atom and a hydroxy group, or a mixture of a polymer having a fluorine atom and a polymer having a hydroxy group represented by the following (III); (I) a polymer having a repeating unit represented by the following general formula (1A) and having at least one or more fluorine atoms and at least one or more hydroxy groups, a terminal group thereof being a group represented by any one of the following general formulae (1B) and (1C), (II) a polymer having a repeating unit represented by the following general formula (2A) and having at least one or more fluorine atoms and a repeating unit represented by the following general formula (3A) and having at least one or more hydroxy groups, a terminal group thereof being a group represented by any one of the following general formulae (1B) and (1C), and (III) a mixture of: a polymer having a repeating unit represented by the following general formula (2A) and having at least one or more fluorine atoms, a terminal group thereof being a group represented by any one of the following general formulae (1B) and (1C); and a polymer having a repeating unit represented by the following general formula (3A) and having at least one or more hydroxy groups, a terminal group thereof being a group represented by any one of the following general formulae (1B) and (1C); and (B) an organic solvent, (1A)

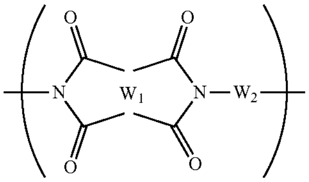

wherein $W_1$ represents one or more kinds of tetravalent organic groups optionally having a fluorine atom or a hydroxy group, $W_2$ represents one or more kinds of divalent organic groups optionally having a fluorine atom or a hydroxy group, at least one of $W_1$ and $W_2$ has one or more fluorine atoms, and at least one of $W_1$ and $W_2$ has one or more hydroxy groups, (2A)

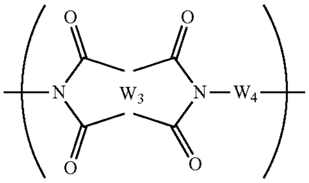

wherein $W_3$ represents one or more kinds of tetravalent organic groups optionally having a fluorine atom, $W_4$ represents one or more kinds of divalent organic groups optionally having a fluorine atom, and at least one of $W_3$ and $W_4$ has one or more fluorine atoms, (3A)

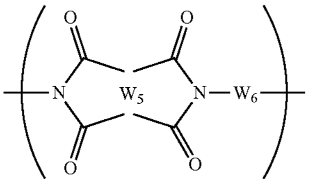

wherein $W_5$ represents one or more kinds of tetravalent organic groups optionally having a hydroxy group, $W_6$ represents one or more kinds of divalent organic groups optionally having a hydroxy group, and at least one of $W_5$ and $W_6$ has one or more hydroxy groups, and (1B)

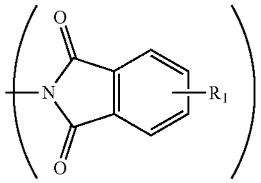

(1C)

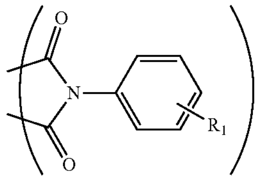

wherein $R_1$ represents any one group represented by the following formula (1D), and two or more kinds of $R_1$ are optionally used in combination.

(1 D)

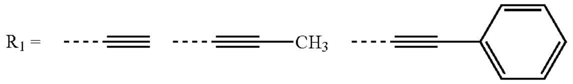

[2]: The composition for forming a protective film against an alkaline aqueous hydrogen peroxide according to [1], wherein $W_2$ in the general formula (1A) has at least one or more fluorine atoms and at least one or more hydroxy groups.

[3]: The composition for forming a protective film against an alkaline aqueous hydrogen peroxide according to [1] or [2], wherein $W_2$ in the general formula (1A) is a group represented by the following general formula (1E).

(1E)

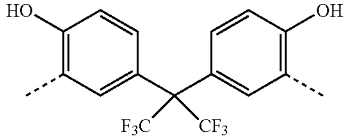

[4]: The composition for forming a protective film against an alkaline aqueous hydrogen peroxide according to [1], [2], or [3], wherein $W_1$ in the general formula (1A) is any group represented by the following general formula (1F).

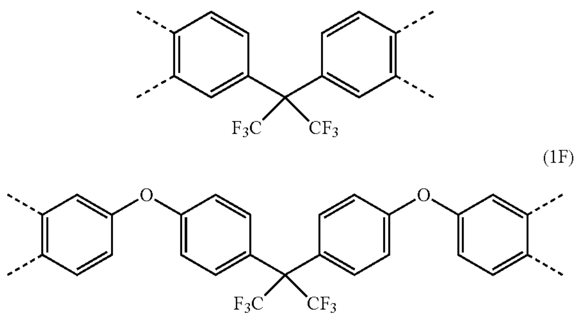

(1F)

[5]: The composition for forming a protective film against an alkaline aqueous hydrogen peroxide according to [1], [2], [3], or [4], further comprising a polymer (IV), as a component (A'), having a repeating unit represented by the following general formula (4A) and a terminal group thereof being a group represented by the following general formula (2C), (4A)

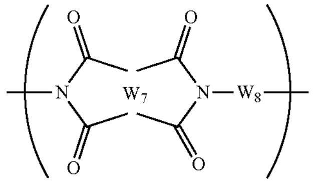

wherein $W_7$ represents a tetravalent organic group, and $W_8$ represents a divalent organic group, and (2C)

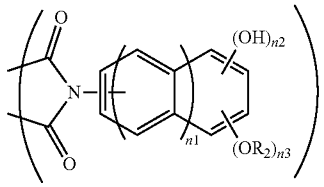

wherein $R_2$ represents a monovalent organic group having 1 to 10 carbon atoms, n1 represents an integer of 0 or 1, and n2 and n3 represent $1 \le n2 \le 6$ and $0 \le n3 \le 6$ and satisfy a relationship of $1 \le n2+n3 \le 6$.

[6]: The composition for forming a protective film against an alkaline aqueous hydrogen peroxide according to [1], [2], [3], [4], or [5], wherein the component (A) has a weight-average molecular weight of 1000 to 10000.

[7]: The composition for forming a protective film against an alkaline aqueous hydrogen peroxide according to [1], [2], [3], [4], [5], or [6], wherein the component (B) is a mixture of one or more kinds of organic solvents having a boiling point of lower than 180° C. and one or more kinds of organic solvents having a boiling point of 180° C. or higher.

[8]: The composition for forming a protective film against an alkaline aqueous hydrogen peroxide according to [1], [2], [3], [4], [5], [6], or [7], further comprising one or more of (C) an acid generator, (D) a surfactant, (E) a crosslinker, and (F) a plasticizer.

[9]: The composition for forming a protective film against an alkaline aqueous hydrogen peroxide according to [1], [2], [3], [4], [5], [6], [7], or [8], wherein the composition for forming a protective film provides a protective film exhibiting a resistance against an ammonia-containing aqueous hydrogen peroxide.

[10]: The composition for forming a protective film against an alkaline aqueous hydrogen peroxide according to [9], wherein when a silicon substrate on which the protective film is formed is immersed in a 1.0 mass % aqueous hydrogen peroxide containing 0.5 mass % of ammonia at 70° C. for 5 minutes, no removal of the protective film is observed.

[11]: A substrate for producing a semiconductor apparatus, comprising: a substrate; and a protective film formed on the substrate, the protective film being a cured material of the composition for forming a protective film according to [1], [2], [3], [4], [5], [6], [7], [8], [9], or [10].

[12]: A method for forming a protective film applied in a semiconductor apparatus manufacturing process, the method comprising: spin-applying the composition for forming a protective film according to [1], [2], [3], [4], [5], [6], [7], [8], [9], or [10] on a substrate to be processed; and obtaining a cured film by heat-treating the substrate to be processed on which the composition for forming a protective film is applied under an inert gas atmosphere at a temperature of 50° C. or higher and 600° C. or lower within a range of 10 seconds to 7200 seconds.

[13]: A method for forming a protective film applied in a semiconductor apparatus manufacturing process, the method comprising: spin-applying the composition for forming a protective film according to [1], [2], [3], [4], [5], [6], [7], [8], [9], or [10] on a substrate to be processed; forming an applied film by heat-treating the substrate to be processed on which the composition for forming a protective film is applied in air at a temperature of 50° C. or higher and 250° C. or lower within a range of 5 seconds to 600 seconds; and subsequently obtaining a cured film by heat-treating the applied film under an inert gas atmosphere at a temperature of 200° C. or higher and 600° C. or lower within a range of 10 seconds to 7200 seconds.

[14]: The method for forming a protective film according to [12] or [13], wherein an oxygen concentration of the inert gas is 1% or less.

[15]: The method for forming a protective film according to [12], [13] or [14], wherein a substrate to be processed having a structure or step with 30 nm or more in height is used as the substrate to be processed.

[16]: A method for forming a pattern on a substrate to be processed, the method comprising: (I-1) a step of forming a protective film on the substrate to be processed using the composition for forming a protective film according to [1], [2], [3], [4], [5], [6], [7], [8], [9], or [10]; (I-2) a step of forming a silicon-containing resist intermediate film on the protective film using a silicon-containing resist intermediate film material; (I-3) a step of forming a resist upper layer film on the silicon-containing resist intermediate film using a photoresist composition; (I-4) a step of forming a circuit pattern in the resist upper layer film; (I-5) a step of transferring the pattern to the silicon-containing resist intermediate film by etching with the resist upper layer film in which the pattern is formed as a mask; (I-6) a step of transferring the pattern to the protective film by etching with the silicon-containing resist intermediate film in which the pattern is transferred as a mask; and (I-7) a step of forming a pattern on the substrate to be processed with the protective film in which the pattern is transferred as a mask.

[17]: A method for forming a pattern on a substrate to be processed, the method comprising: (II-1) a step of forming a protective film on the substrate to be processed using the composition for forming a protective film according to [1], [2], [3], [4], [5], [6], [7], [8], [9], or [10]; (II-2) a step of forming a silicon-containing resist intermediate film on the protective film using a silicon-containing resist intermediate film material; (II-3) a step of forming an organic anti-reflection film on the silicon-containing resist intermediate film; (II-4) a step of forming a resist upper layer film on the organic anti-reflection film using a photoresist composition to form a four-layer film structure and forming a circuit pattern in a resist upper layer film; (II-5) a step of transferring the pattern to the organic anti-reflection film and the silicon-containing resist intermediate film by etching with the resist upper layer film in which the pattern is formed as a mask; (II-6) a step of transferring the pattern to the protective film by etching with the silicon-containing resist intermediate film in which the pattern is transferred as a mask; and (II-7) a step of forming a pattern on the substrate to be processed with the protective film in which the pattern is transferred as a mask.

[18]: A method for forming a pattern on a substrate to be processed, the method comprising: (III-1) a step of forming a protective film on the substrate to be processed using the composition for forming a protective film according to [1], [2], [3], [4], [5], [6], [7], [8], [9], or [10]; (III-2) a step of forming an inorganic hard mask selected from a silicon oxide film, a silicon nitride film, a silicon oxynitride film, a titanium oxide film, and a titanium nitride film on the protective film; (III-3) a step of forming a resist upper layer film on the inorganic hard mask using a photoresist composition; (III-4) a step of forming a circuit pattern in the resist upper layer film; (III-5) a step of transferring the pattern to the inorganic hard mask by etching with the resist upper layer film in which the pattern is formed as a mask; (III-6) a step of transferring the pattern to the protective film by etching with the inorganic hard mask in which the pattern is transferred as a mask; and (III-7) a step of forming a pattern on the substrate to be processed with the protective film in which the pattern is transferred as a mask.

[19]: A method for forming a pattern on a substrate to be processed, the method comprising: (IV-1) a step of forming a protective film on the substrate to be processed using the composition for forming a protective film according to [1], [2], [3], [4], [5], [6], [7], [8], [9], or [10]; (IV-2) a step of forming an inorganic hard mask selected from a silicon oxide film, a silicon nitride film, a silicon oxynitride film, a titanium oxide film, and a titanium nitride film on the protective film; (IV-3) a step of forming an organic anti-reflection film on the inorganic hard mask; (IV-4) a step of forming a resist upper layer film on the organic anti-reflection film using a photoresist composition to form a four-layer film structure and forming a circuit pattern in the resist upper layer film; (IV-5) a step of transferring the pattern to the organic anti-reflection film and the inorganic hard mask by etching with the resist upper layer film in which the pattern is formed as a mask; (IV-6) a step of transferring the pattern to the protective film by etching with the inorganic hard mask in which the pattern is transferred as a mask; and (IV-7) a step of forming a pattern on the substrate to be processed with the protective film in which the pattern is transferred as a mask.

[20]: The method for forming a pattern according to [18] or [19], wherein the inorganic hard mask is formed by a CVD method or an ALD method.

[21]: The method for forming a pattern according to [16] or [17], further comprising, after the (I-6) step or the (II-6) step, a step of removing the silicon-containing resist intermediate film in which the pattern is transferred by wet etching using an alkaline aqueous hydrogen peroxide.

[22]: The method for forming a pattern according to [16], [17], [18], [19], or [20], wherein the (I-7) step, the (II-7) step, the (III-7) step, or the (IV-7) step comprises a step of transferring the pattern to the substrate to be processed by wet etching using an alkaline aqueous hydrogen peroxide and with the protective film in which the pattern is transferred as a mask.

[23]: The method for forming a pattern according to [16], [17], [18], [19], or [20], wherein the (I-7) step, the (II-7) step, the (III-7) step, or the (IV-7) step comprises a step of pattern-processing the substrate to be processed by implanting ions with the protective film in which the pattern is transferred as a mask.

[24]: The method for forming a pattern according to [23], further comprising, after the step of pattern-processing the substrate to be processed by implanting ions, a step of removing the silicon-containing resist intermediate film in which the pattern is transferred by wet etching using an alkaline aqueous hydrogen peroxide.

[25]: The method for forming a pattern according to [16], [17], [18], [19], [20], [21], [22], [23], or [24], wherein in forming the circuit pattern, the circuit pattern is formed by lithography using light having a wavelength of 10 nm or more and 300 nm or less, direct drawing with electron beam, nanoimprinting, or a combination thereof.

[26]: The method for forming a pattern according to [16], [17], [18], [19], [20], [21], [22], [23], [24], or [25], wherein in forming the circuit pattern, the circuit pattern is developed with an alkaline development or an organic solvent.

[27]: The method for forming a pattern according to [16], [17], [18], [19], [20], [21], [22], [23], [24], [25], or [26], wherein a semiconductor apparatus substrate or a substrate in which any of a metal film, a metal carbide film, a metal oxide film, a metal nitride film, a metal oxycarbide film, and a metal oxynitride film is formed on the semiconductor apparatus substrate is used as the substrate to be processed.

[28]: The method for forming a pattern according to [27], wherein a substrate containing silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is used as the substrate to be processed.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming a protective film against an alkaline aqueous hydrogen peroxide, the composition comprising:

(A) a polymer represented by the following any one of (I) and (II) and having a fluorine atom and a hydroxy group, or a mixture of a polymer having a fluorine atom and a polymer having a hydroxy group represented by the following (III);

(I) a polymer having a repeating unit represented by the following general formula (1A) and having at least one or more fluorine atoms and at least one or more hydroxy groups, a terminal group thereof being a group represented by any one of the following general formulae (1B) and (1C), (II) a polymer having a repeating unit represented by the following general formula (2A) and having at least one or more fluorine atoms and a repeating unit represented by the following general formula (3A) and having at least one or more hydroxy groups, a terminal group thereof being a group represented by any one of the following general formulae (1B) and (1C), and (III) a mixture of: a polymer having a repeating unit represented by the following general formula (2A) and having at least one or more fluorine atoms, a terminal group thereof being a group represented by any one of the following general formulae (1B) and (1C); and a polymer having a repeating unit represented by the following general formula (3A) and having at least one or more hydroxy groups, a terminal group thereof being a group represented by any one of the following general formulae (1B) and (1C); and (B) an organic solvent, and further comprising a polymer (IV), as a component (A'), having a repeating unit represented by the following general formula (4A) and a terminal group thereof being a group represented by the following general formula (2C), (1A)

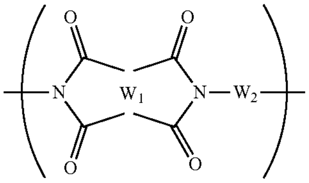

wherein $W_1$ represents one or more kinds of tetravalent organic groups optionally having a fluorine atom or a hydroxy group, $W_2$ represents one or more kinds of divalent organic groups optionally having a fluorine atom or a hydroxy group, at least one of $W_1$ and $W_2$ has one or more fluorine atoms, and at least one of $W_1$ and $W_2$ has one or more hydroxy groups, (2A)

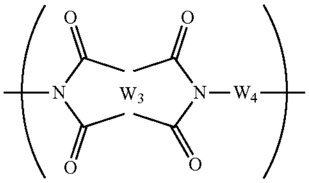

wherein $W_3$ represents one or more kinds of tetravalent organic groups optionally having a fluorine atom, $W_4$ represents one or more kinds of divalent organic groups optionally having a fluorine atom, and at least one of $W_3$ and $W_4$ has one or more fluorine atoms, (3A)

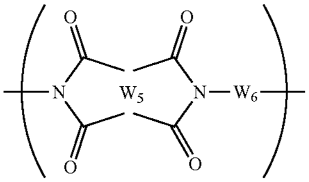

wherein $W_5$ represents one or more kinds of tetravalent organic groups optionally having a hydroxy group, $W_6$ represents one or more kinds of divalent organic groups optionally having a hydroxy group, and at least one of $W_5$ and $W_6$ has one or more hydroxy groups, and (1B)

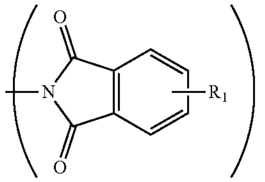

(1C)

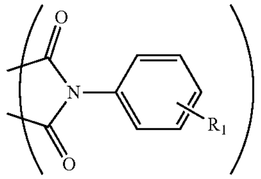

wherein $R_1$ represents any one group represented by the following formula (1D), and two or more kinds of $R_1$ are optionally used in combination, (1D)

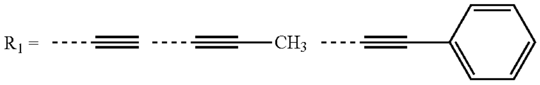

(4A)

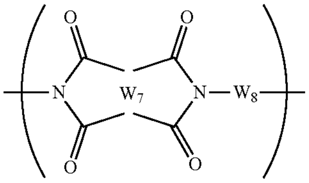

wherein $W_7$ represents a tetravalent organic group, and $W_8$ represents a divalent organic group, and (2C)

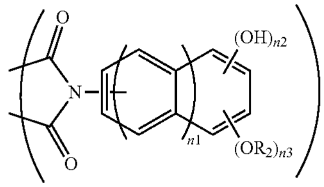

wherein $R_2$ represents a monovalent organic group having 1 to 10 carbon atoms, n1 represents an integer of 0 or 1, and n2 and n3 represent $1 \le n2 \le 6$ and $0 \le n3 \le 6$ and satisfy a relationship of $1 \le n2+n3 \le 6$.

2. The composition for forming a protective film against an alkaline aqueous hydrogen peroxide according to claim 1, wherein $W_2$ in the general formula (1A) has at least one or more fluorine atoms and at least one or more hydroxy groups.

3. The composition for forming a protective film against an alkaline aqueous hydrogen peroxide according to claim 2, wherein $W_2$ in the general formula (1A) is a group represented by the following general formula (1E)

(1E)

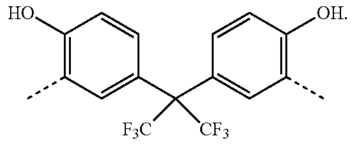

4. The composition for forming a protective film against an alkaline aqueous hydrogen peroxide according to claim 1, wherein $W_1$ in the general formula (1A) is any group represented by the following general formula (1F)

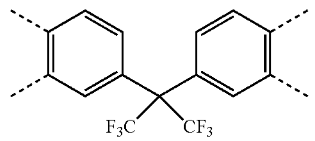

(1F)

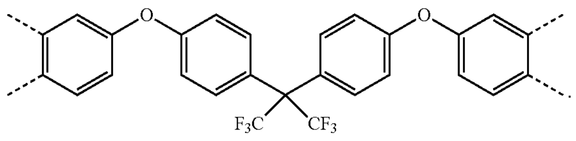

5. The composition for forming a protective film against an alkaline aqueous hydrogen peroxide according to claim 1, wherein the component (A) has a weight-average molecular weight of 1000 to 10000.

6. The composition for forming a protective film against an alkaline aqueous hydrogen peroxide according to claim 1, wherein the component (B) is a mixture of one or more kinds of organic solvents having a boiling point of lower than 180° C. and one or more kinds of organic solvents having a boiling point of 180° C. or higher.

7. The composition for forming a protective film against an alkaline aqueous hydrogen peroxide according to claim 1, further comprising one or more of (C) an acid generator, (D) a surfactant, (E) a crosslinker, and (F) a plasticizer.

8. The composition for forming a protective film against an alkaline aqueous hydrogen peroxide according to claim 1, wherein the composition for forming a protective film provides a protective film exhibiting a resistance against an ammonia-containing aqueous hydrogen peroxide.

9. The composition for forming a protective film against an alkaline aqueous hydrogen peroxide according to claim 8, wherein when a silicon substrate on which the protective film is formed is immersed in a 1.0 mass % aqueous hydrogen peroxide containing 0.5 mass % of ammonia at 70° C. for 5 minutes, no removal of the protective film is observed.

10. A substrate for producing a semiconductor apparatus, comprising:

a substrate; and a protective film formed on the substrate, the protective film being a cured material of the composition for forming a protective film according to claim 1.

11. A method for forming a protective film applied in a semiconductor apparatus manufacturing process, the method comprising:

spin-applying the composition for forming a protective film according to claim 1 on a substrate to be processed; and obtaining a cured film by heat-treating the substrate to be processed on which the composition for forming a protective film is applied under an inert gas atmosphere at a temperature of 50° C. or higher and 600° C. or lower within a range of 10 seconds to 7200 seconds.

12. A method for forming a protective film applied in a semiconductor apparatus manufacturing process, the method comprising:

spin-applying the composition for forming a protective film according to claim 1 on a substrate to be processed;

forming an applied film by heat-treating the substrate to be processed on which the composition for forming a protective film is applied in air at a temperature of 50° C. or higher and 250° C. or lower within a range of 5 seconds to 600 seconds; and subsequently obtaining a cured film by heat-treating the applied film under an inert gas atmosphere at a temperature of 200° C. or higher and 600° C. or lower within a range of 10 seconds to 7200 seconds.

13. The method for forming a protective film according to claim 11, wherein an oxygen concentration of the inert gas is 1% or less.

14. The method for forming a protective film according to claim 11, wherein a substrate to be processed having a structure or step with 30 nm or more in height is used as the substrate to be processed.

15. A method for forming a pattern on a substrate to be processed, the method comprising:

(I-1) a step of forming a protective film on the substrate to be processed using the composition for forming a protective film according to claim 1;

(I-2) a step of forming a silicon-containing resist intermediate film on the protective film using a silicon-containing resist intermediate film material;

(I-3) a step of forming a resist upper layer film on the silicon-containing resist intermediate film using a photoresist composition;

(I-4) a step of forming a circuit pattern in the resist upper layer film;

(I-5) a step of transferring the pattern to the silicon-containing resist intermediate film by etching with the resist upper layer film in which the pattern is formed as a mask;

(I-6) a step of transferring the pattern to the protective film by etching with the silicon-containing resist intermediate film in which the pattern is transferred as a mask; and (I-7) a step of forming a pattern on the substrate to be processed with the protective film in which the pattern is transferred as a mask.

16. A method for forming a pattern on a substrate to be processed, the method comprising:

(II-1) a step of forming a protective film on the substrate to be processed using the composition for forming a protective film according to claim 1;

(II-2) a step of forming a silicon-containing resist intermediate film on the protective film using a silicon-containing resist intermediate film material;

(II-3) a step of forming an organic anti-reflection film on the silicon-containing resist intermediate film;

(II-4) a step of forming a resist upper layer film on the organic anti-reflection film using a photoresist composition to form a four-layer film structure and forming a circuit pattern in the resist upper layer film;

(II-5) a step of transferring the pattern to the organic anti-reflection film and the silicon-containing resist intermediate film by etching with the resist upper layer film in which the pattern is formed as a mask;

(II-6) a step of transferring the pattern to the protective film by etching with the silicon-containing resist intermediate film in which the pattern is transferred as a mask; and (II-7) a step of forming a pattern on the substrate to be processed with the protective film in which the pattern is transferred as a mask.

17. A method for forming a pattern on a substrate to be processed, the method comprising:

(III-1) a step of forming a protective film on the substrate to be processed using the composition for forming a protective film according to claim 1;

(III-2) a step of forming an inorganic hard mask selected from a silicon oxide film, a silicon nitride film, a silicon oxynitride film, a titanium oxide film, and a titanium nitride film on the protective film;

(III-3) a step of forming a resist upper layer film on the inorganic hard mask using a photoresist composition;

(III-4) a step of forming a circuit pattern in the resist upper layer film;

(III-5) a step of transferring the pattern to the inorganic hard mask by etching with the resist upper layer film in which the pattern is formed as a mask;

(III-6) a step of transferring the pattern to the protective film by etching with the inorganic hard mask in which the pattern is transferred as a mask; and (III-7) a step of forming a pattern on the substrate to be processed with the protective film in which the pattern is transferred as a mask.

18. A method for forming a pattern on a substrate to be processed, the method comprising:

(IV-1) a step of forming a protective film on the substrate to be processed using the composition for forming a protective film according to claim 1;

(IV-2) a step of forming an inorganic hard mask selected from a silicon oxide film, a silicon nitride film, a silicon oxynitride film, a titanium oxide film, and a titanium nitride film on the protective film;

(IV-3) a step of forming an organic anti-reflection film on the inorganic hard mask;

(IV-4) a step of forming a resist upper layer film on the organic anti-reflection film using a photoresist composition to form a four-layer film structure and forming a circuit pattern in the resist upper layer film;

(IV-5) a step of transferring the pattern to the organic anti-reflection film and the inorganic hard mask by etching with the resist upper layer film in which the pattern is formed as a mask;

(IV-6) a step of transferring the pattern to the protective film by etching with the inorganic hard mask in which the pattern is transferred as a mask; and (IV-7) a step of forming a pattern on the substrate to be processed with the protective film in which the pattern is transferred as a mask.

19. The method for forming a pattern according to claim 18, wherein the inorganic hard mask is formed by a CVD method or an ALD method.

20. The method for forming a pattern according to claim 15, further comprising, after the (I-6) step or the (II-6) step, a step of removing the silicon-containing resist intermediate film in which the pattern is transferred by wet etching using an alkaline aqueous hydrogen peroxide.

21. The method for forming a pattern according to claim 18, wherein the (I-7) step, the (II-7) step, the (III-7) step, or the (IV-7) step comprises a step of transferring the pattern to the substrate to be processed by wet etching using an alkaline aqueous hydrogen peroxide and with the protective film in which the pattern is transferred as a mask.

22. The method for forming a pattern according to claim 18, wherein the (I-7) step, the (II-7) step, the (III-7) step, or the (IV-7) step comprises a step of pattern-processing the substrate to be processed by implanting ions with the protective film in which the pattern is transferred as a mask.

23. The method for forming a pattern according to claim 22, further comprising, after the step of pattern-processing the substrate to be processed by implanting ions, a step of removing the silicon-containing resist intermediate film in which the pattern is transferred by wet etching using an alkaline aqueous hydrogen peroxide.

24. The method for forming a pattern according to claim 18, wherein in forming the circuit pattern, the circuit pattern is formed by lithography using light having a wavelength of 10 nm or more and 300 nm or less, direct drawing with electron beam, nanoimprinting, or a combination thereof.

25. The method for forming a pattern according to claim 18, wherein in forming the circuit pattern, the circuit pattern is developed with an alkaline development or an organic solvent.

26. The method for forming a pattern according to claim 18, wherein a semiconductor apparatus substrate or a substrate in which any of a metal film, a metal carbide film, a metal oxide film, a metal nitride film, a metal oxycarbide film, and a metal oxynitride film is formed on the semiconductor apparatus substrate is used as the substrate to be processed.

27. The method for forming a pattern according to claim 26, wherein a substrate containing silicon, titanium, tungsten, hafnium, zirconium, chromium, germanium, copper, silver, gold, aluminum, indium, gallium, arsenic, palladium, iron, tantalum, iridium, cobalt, manganese, molybdenum, or an alloy thereof is used as the substrate to be processed.

* * * * *